United States Patent
Kawahara et al.

(10) Patent No.: US 12,185,622 B2
(45) Date of Patent: Dec. 31, 2024

(54) COLOR CONVERSION COMPOSITION, COLOR CONVERSION SHEET, AND LIGHT SOURCE UNIT, DISPLAY AND LIGHTING DEVICE EACH COMPRISING SAME

(71) Applicant: Toray Industries, Inc., Tokyo (JP)

(72) Inventors: Kana Kawahara, Otsu (JP); Tatsuya Kanzaki, Otsu (JP)

(73) Assignee: Toray Industries, Inc., Tokyo (JP)

( * ) Notice: Subject to any disclaimer, the term of this patent is extended or adjusted under 35 U.S.C. 154(b) by 988 days.

(21) Appl. No.: 16/976,941

(22) PCT Filed: Mar. 4, 2019

(86) PCT No.: PCT/JP2019/008408
§ 371 (c)(1),
(2) Date: Aug. 31, 2020

(87) PCT Pub. No.: WO2019/188019
PCT Pub. Date: Oct. 3, 2019

(65) Prior Publication Data
US 2021/0005818 A1    Jan. 7, 2021

(30) Foreign Application Priority Data
Mar. 26, 2018 (JP) .................... 2018-057744

(51) Int. Cl.
*H01L 51/00* (2006.01)
*F21V 9/38* (2018.01)
(Continued)

(52) U.S. Cl.
CPC .............. *H10K 85/115* (2023.02); *F21V 9/38* (2018.02); *H10K 85/151* (2023.02); *H10K 85/322* (2023.02); *H10K 50/125* (2023.02)

(58) Field of Classification Search
CPC .. H10K 85/115; H10K 85/151; H10K 85/322; H10K 50/125; H10K 59/38;
(Continued)

(56) References Cited

U.S. PATENT DOCUMENTS

| | | | |
|---|---|---|---|
| 2009/0142876 A1* | 6/2009 | Tuan ................. | C09K 11/06 252/586 |
| 2014/0287219 A1 | 9/2014 | Hayashida et al. | |
| 2018/0134952 A1 | 5/2018 | Ichihashi et al. | |

FOREIGN PATENT DOCUMENTS

| | | |
|---|---|---|
| JP | 08509471 A | 10/1996 |
| JP | 2000208262 A | 7/2000 |

(Continued)

OTHER PUBLICATIONS

Burghart et al., "3,5-Diaryl-4,4-difluoro-4-bora-3a,4a-diaza-s-indacene (BODIPY) Dyes: Synthesis, Spectroscopic, Electrochemical, and Structural Properties", J. Org. Chem., 1999, vol. 64, pp. 7813-7819.

(Continued)

*Primary Examiner* — Ermias T Woldegeorgis
(74) *Attorney, Agent, or Firm* — Buchanan Ingersoll & Rooney PC

(57) ABSTRACT

A color conversion composition that converts incident light into light having a longer wavelength than the incident light is described, the color conversion composition including the following components (A) and (B): component (A): an organic light-emitting material; and component (B): a resin whose molecular structure has a fluorene skeleton.

16 Claims, 3 Drawing Sheets

(51) Int. Cl.
  *H10K 85/10* (2023.01)
  *H10K 85/30* (2023.01)
  *H10K 50/125* (2023.01)

(58) Field of Classification Search
  CPC .......... F21V 9/38; C09K 11/02; C09K 11/06; C09K 2211/1018; C08K 5/0041; C08K 5/0083; C08K 5/55; G02B 5/20; G02B 5/22; H01L 33/50; C08L 33/06; C08L 63/00; C08L 67/00; C08L 69/00; F21S 2/00
  See application file for complete search history.

(56) References Cited

FOREIGN PATENT DOCUMENTS

| | | |
|---|---|---|
| JP | 2000273316 A | 10/2000 |
| JP | 2007023162 A | 2/2007 |
| JP | 2007277466 A | 10/2007 |
| JP | 2011149028 A | 8/2011 |
| JP | 2011241160 A | 12/2011 |
| JP | 2012022028 A | 2/2012 |
| JP | 2013064118 A | 4/2013 |
| WO | 2013047524 A1 | 4/2013 |
| WO | 2014129067 A1 | 8/2014 |
| WO | 2016190283 A1 | 12/2016 |
| WO | WO-2017002707 A1 * | 1/2017 .............. C07F 5/022 |

OTHER PUBLICATIONS

International Search Report and Written Opinion for International Application PCT/JP2019/008408, dated May 28, 2019, 7 pages.

Kollmannsberger et al., "Electrogenerated Chemiluminescence and Proton-Dependent Switching of Fluorescence: Functionalized Difluoroboradiaza-s-indacenes", Angew Chem. Int. Ed. Engl., 1997, vol. 36, No. 12, pp. 1333-1335.

Hammett's Rule from Kagaku Binran Kiso-Hen Revised 5th Edition (II, p. 380), 1970.

\* cited by examiner

COLOR CONVERSION COMPOSITION, COLOR CONVERSION SHEET, AND LIGHT SOURCE UNIT, DISPLAY AND LIGHTING DEVICE EACH COMPRISING SAME

CROSS REFERENCE TO RELATED APPLICATION

This is the U.S. National Phase application of PCT/JP2019/008408, filed Mar. 4, 2019, which claims priority to Japanese Patent Application No. 2018-057744, filed Mar. 26, 2018, the disclosures of these applications being incorporated herein by reference in their entireties for all purposes.

FIELD OF THE INVENTION

The present invention relates to a color conversion composition, a color conversion sheet, a light source unit including the same, a display, and a lighting apparatus.

BACKGROUND OF THE INVENTION

Application of a multicoloring technique by a color conversion method to liquid crystal displays, organic EL displays, lighting apparatuses, and the like is being vigorously studied. Color conversion means converting light emitted from a light-emitting body into light having a longer wavelength and means converting blue light emission into green or red light emission, for example.

A composition having this color conversion function is formed into a sheet and combined with, for example, a blue light source, whereby the three primary colors of blue, green, and red can be obtained, that is, white light can be extracted from the blue light source. A white light source obtained by combining the blue light source and the sheet having the color conversion function forms a backlight unit, and this backlight unit, a liquid crystal drive part, and color filters are combined, whereby a full-color display can be produced. Without the liquid crystal drive part, the unit can be used as a white light source as it is, which can be used as the white light source such as LED lighting.

Improvement in color reproducibility is a problem in liquid crystal displays using the color conversion method. To solve this problem, developed is a technique that uses quantum dots formed of inorganic semiconductor fine particles as a component of the color conversion composition (refer to Patent Literature 1, for example).

Also developed is a technique that uses a light-emitting material formed of an organic substance as a component of the color conversion composition in place of the quantum dots. Disclosed as an example of the technique that uses an organic light-emitting material as a component of the color conversion composition is one that uses a pyrromethene derivative (refer to Patent Literature 2, for example).

Also disclosed is a technique in which a light stabilizer is added to prevent deterioration of an organic light-emitting material and improve the durability (see, for example, Patent Literature 3).

PATENT LITERATURE

Patent Literature 1: JP2012-22028A
Patent Literature 2: JP2011-241160A
Patent Literature 3: JP2011-149028A

SUMMARY OF THE INVENTION

Although the technique using the quantum dots described in Patent Literature 1 improves the color reproducibility, the quantum dots are vulnerable to heat, and moisture and oxygen in the air and are thus deficient in durability on the other hand. In addition, there is a problem in that cadmium is contained, for example. The color conversion composition described in Patent Literature 2 improves the color reproducibility but is deficient in durability. The stabilizers described in Patent Literature 3 have an effect of improving the durability, but the effect is not sufficient. Further, these stabilizers have a relatively high absorption in the visible range, and thus have a problem in that the stabilizers absorb light emission caused by a light-emitting material and have lower efficiency.

As above-mentioned, there is no sufficient technique that uses, as a component of a color conversion composition, an organic light-emitting material capable of achieving both high color purity and high durability.

A problem to be solved by the present invention is to provide a color conversion composition for use in liquid crystal displays and LED lighting, wherein the color conversion composition achieves both color reproducibility improvement and durability.

That is, the present invention is a color conversion composition that converts incident light into light having a longer wavelength than the incident light has, wherein the color conversion composition is characterized by including the following components (A) and (B):

the component (A): an organic light-emitting material, and the component (B): a resin whose molecular structure has a fluorene skeleton.

A color conversion composition according to the present invention and a color conversion sheet produced therefrom achieve both high color purity and durability, and thus can achieve both color reproducibility and durability.

DETAILED DESCRIPTION OF EMBODIMENTS OF THE INVENTION

Figure 1:
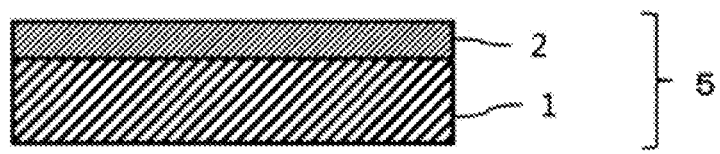
FIG. 1 is a schematic sectional view depicting an example of a color conversion sheet according to the present invention.

Below, embodiments of the present invention will be specifically described, but it should be noted that the present invention is not limited to the following embodiments and can be embodied in a variously modified manner in accordance with objects and uses.

<(A) Organic Light-Emitting Material>

A color conversion composition according to the present invention contains at least one organic light-emitting material. Here, the light-emitting material in the present invention refers to an organic material that, when being irradiated with some light, emits light having a wavelength different from that of the former light.

Suitable examples of organic light-emitting materials include, but are not limited particularly to: compounds having a condensed aryl ring, such as naphthalene, anthracene, phenanthrene, pyrene, chrysene, naphthacene, triphenylene, fluoranthene, fluorene, and indene, and derivatives thereof; perylene derivatives such as N,N'-bis(2,6-diisopropylphenyl)-1,6,7,12-tetraphenoxyperylene-3,4:9,10-bisdicarboimide and dibenzodiindenoperylene; compounds having a heteroaryl ring, such as furan, pyrrole, thiophene, silol, 9-silafluorene, 9,9'-spirobisilafluorene, benzothiophene, benzofuran, indole, dibenzothiophene, dibenzofuran, phenanthroline, pyrazine, naphthyridine, quinoxaline, and pyrrolopyridine, and derivatives thereof; borane derivatives; pyridine and pyridine derivatives such as imidazopyridine and 1-ethyl-2-(4-(p-dimethylaminophenyl)-1,3-butadienyl)-pyridinium-perchlorate; stilbene derivatives such as 1,4-distyrylbenzene, 4,4'-bis(2-(4-diphenylaminophenyl)ethenyl)biphenyl, and 4,4'-bis(N-(stilbene-4-yl)-N-phenylamino)stilbene; aromatic acetylene derivatives, tetraphenylbutadiene derivatives, aldazine derivatives, pyrromethene derivatives, and diketopyrrolo[3,4-c]pyrrole derivatives; coumarin derivatives such as coumarin 6, coumarin 7, and coumarin 153; azole derivatives such as imidazole, thiazole, thiadiazole, carbazole, oxazole, oxadiazole, and triazole, and metal complexes thereof; compounds having a condensed aryl ring, such as benzoimidazole derivatives, benzooxazole derivatives, benzothiazole derivatives, and azole derivatives, and derivatives thereof; cyanine compounds such as indocyanine green and 4-dicyanomethylene-2-methyl-6-(p-dimethylaminostyryl)-4H-pyran; xanthene compounds such as eosin, and thioxanthene compounds; fluoresceine derivatives such as fluoresceine, fluoresceine isothiocyanate, and carboxyfluoresceine diacetate; rhodamine derivatives such as rhodamine B, rhodamine 6G, rhodamine 101, and sulforhodamine 101; polyphenylene compounds, naphthalimide derivatives, phthalocyanine derivatives, and metal complexes thereof, and porphyrin derivatives and metal complexes thereof; oxazine compounds such as Nile red and Nile blue; helicene compounds; aromatic amine derivatives such as N,N'-diphenyl-N,N'-di(3-methylphenyl)-4,4'-diphenyl-1,1'-diamine; and organic metal complex compounds such as iridium (Ir), ruthenium (Ru), rhodium (Rh), palladium (Pd), platinum (Pt), osmium (Os), and rhenium (Re).

The organic light-emitting material may be a fluorescent light-emitting material or a phosphorescent light-emitting material; to achieve high color purity, a fluorescent light-emitting material is preferred.

Among these materials, those which can preferably be used are compounds having a condensed aryl ring or derivatives thereof because of high thermal stability and photostability.

In view of solubility and the versatility of molecular structure, compounds having a coordinated bond are preferred. In view of being small in full width at half maximum and the capability of giving highly efficient light emission, also preferred are compounds containing boron such as boron fluoride complexes.

Among these, pyrromethene derivatives can be suitably used in view of affording high fluorescence quantum yield and good durability. A compound represented by General Formula (5) is more preferred.

[Chem. 1]

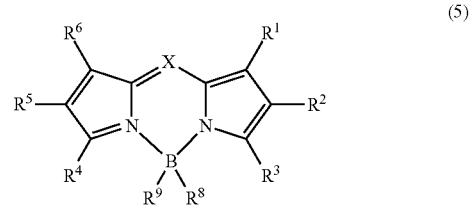

(5)

X is C—R$^7$ or N. R$^1$ to R$^9$ are independently selected from hydrogen, an alkyl group, a cycloalkyl group, a heterocyclic group, an alkenyl group, a cycloalkenyl group, an alkynyl group, a hydroxy group, a thiol group, an alkoxy group, an alkylthio group, an aryl ether group, an aryl thioether group, an aryl group, a heteroaryl group, halogen, a cyano group, an aldehyde group, a carbonyl group, a carboxyl group, an oxycarbonyl group, a carbamoyl group, an amino group, a nitro group, a silyl group, a siloxanyl group, a boryl group, a phosphine oxide group, and a condensed ring and an aliphatic ring formed between adjacent substituents.

In all the above groups, the hydrogen may be deuterium. This holds true for the compounds or partial structures thereof described below.

In the following description, a substituted or unsubstituted C6-40 aryl group, for example, has 6 to 40 carbon atoms including the carbon atoms included in a substituent substituted in the aryl group, and the same concept as this applies to the other substituents the carbon number of which is specified.

In all the above groups, a substituent when they are substituted is preferably an alkyl group, a cycloalkyl group, a heterocyclic group, an alkenyl group, a cycloalkenyl group, an alkynyl group, a hydroxy group, a thiol group, an alkoxy group, an alkylthio group, an aryl ether group, an aryl thioether group, an aryl group, a heteroaryl group, halogen, a cyano group, an aldehyde group, a carbonyl group, a carboxyl group, an oxycarbonyl group, a carbamoyl group, an amino group, a nitro group, a silyl group, a siloxanyl group, a boryl group, a phosphine oxide group, or further, a specific substituent described as preferred in the descriptions of the respective substituents. These substituents may be further substituted by the substituents described above.

"Unsubstituted" in "substituted or unsubstituted" means that a hydrogen atom or deuterium atom has substituted.

The above holds true for cases described as "substituted or unsubstituted" in the compounds or partial structures thereof described below.

The alkyl group refers to a saturated aliphatic hydrocarbon group such as a methyl group, an ethyl group, a n-propyl group, an isopropyl group, a n-butyl group, a sec-butyl group, or a tert-butyl group, which optionally has a substituent. An additional substituent when it is substituted is not limited to a particular substituent, and examples thereof include an alkyl group, halogen, an aryl group, and a heteroaryl group, which is common to the following description. The carbon number of the alkyl group, which is not limited to a particular number, is in the range of preferably 1 or more and 20 or less and more preferably 1 or more and 8 or less in view of availability and cost.

The cycloalkyl group refers to a saturated alicyclic hydrocarbon group such as a cyclopropyl group, a cyclohexyl group, a norbornyl group, or an adamantyl group, which optionally has a substituent. The carbon number of the alkyl group part, which is not limited to a particular number, is preferably in the range of 3 or more and 20 or less.

The heterocyclic group refers to an aliphatic ring having an atom other than carbon within its ring such as a pyran ring, a piperidine ring, or a cyclic amide, which optionally has a substituent. The carbon number of the heterocyclic group, which is not limited to a particular number, is preferably in the range of 2 or more and 20 or less.

The alkenyl group refers to an unsaturated aliphatic hydrocarbon group containing a double bond such as a vinyl group, an allyl group, or a butadienyl group, which optionally has a substituent. The carbon number of the alkenyl group, which is not limited to a particular number, is preferably in the range of 2 or more and 20 or less.

The cycloalkenyl group refers to an unsaturated alicyclic hydrocarbon group containing a double bond such as a cyclopentenyl group, a cyclopentadienyl group, or a cyclohexenyl group, which optionally has a substituent.

The alkynyl group refers to an unsaturated aliphatic hydrocarbon group containing a triple bond such as an ethynyl group, which optionally has a substituent. The carbon number of the alkynyl group, which is not limited to a particular number, is preferably in the range of 2 or more and 20 or less.

The alkoxy group refers to a functional group to which an aliphatic hydrocarbon group bonds through an ether bond such as a methoxy group, an ethoxy group, or a propoxy group, and this aliphatic hydrocarbon group optionally has a substituent. The carbon number of the alkoxy group, which is not limited to a particular number, is preferably in the range of 1 or more and 20 or less.

The alkylthio group is a group in which the oxygen atom of the ether bond of the alkoxy group is substituted by a sulfur atom. The hydrocarbon group of the alkylthio group optionally has a substituent. The carbon number of the alkylthio group, which is not limited to a particular number, is preferably in the range of 1 or more and 20 or less.

The aryl ether group refers to a function group to which an aromatic hydrocarbon group bonds through an ether bond such as a phenoxy group, and the aromatic hydrocarbon group optionally has a substituent. The carbon number of the aryl ether group, which is not limited to a particular number, is preferably in the range of 6 or more and 40 or less.

The aryl thioether group is a group in which the oxygen atom of the ether bond of the aryl ether group is substituted by a sulfur atom. The aromatic hydrocarbon group of the aryl ether group optionally has a substituent. The carbon number of the aryl ether group, which is not limited to a particular number, is preferably in the range of 6 or more and 40 or less.

The aryl group refers to an aromatic hydrocarbon group such as a phenyl group, a biphenyl group, a terphenyl group, a naphthyl group, a fluorenyl group, a benzofluorenyl group, a dibenzofluorenyl group, a phenanthryl group, an anthracenyl group, a benzophenanthryl group, a benzoanthracenyl group, a crycenyl group, a pyrenyl group, a fluoranthenyl group, a triphenylenyl group, a benzofluoranthenyl group, a dibenzoanthracenyl group, a perylenyl group, or a helicenyl group.

Among them, preferred are a phenyl group, a biphenyl group, a terphenyl group, a naphthyl group, a fluorenyl group, a phenanthryl group, an anthracenyl group, a pyrenyl group, a fluoranthenyl group, and a triphenylenyl group. The aryl group optionally has a substituent. The carbon number of the aryl group, which is not limited to a particular number, is in the range of preferably 6 or more and 40 or less and more preferably 6 or more and 30 or less.

When $R^1$ to $R^9$ are each a substituted or unsubstituted aryl group, the aryl group is preferably a phenyl group, a biphenyl group, a terphenyl group, a naphthyl group, a fluorenyl group, a phenanthryl group, or an anthracenyl group, more preferably a phenyl group, a biphenyl group, a terphenyl group, or a naphthyl group, further preferably a phenyl group, a biphenyl group, or a terphenyl group, and particularly preferably a phenyl group.

When each of the substituents is further substituted by an aryl group, the aryl group is preferably a phenyl group, a biphenyl group, a terphenyl group, a naphthyl group, a fluorenyl group, a phenanthryl group, or an anthracenyl group, more preferably a phenyl group, a biphenyl group, a terphenyl group, or a naphthyl group. A phenyl group is particularly preferable.

The heteroaryl group refers to a cyclic aromatic group having one or more atoms other than carbon within its ring such as a pyridyl group, a furanyl group, a thiophenyl group, a quinolinyl group, an isoquinolinyl group, a pyrazinyl group, a pyrimidyl group, a pyridazinyl group, a triazinyl group, a naphthyridinyl group, a cinnolinyl group, a phthalazinyl group, a quinoxalinyl group, a quinazolinyl group, a benzofuranyl group, a benzothiophenyl group, an indolyl group, a dibenzofuranyl group, a dibenzothiophenyl group, a carbazolyl group, a benzocarbazolyl group, a carbolinyl group, an indolocarbazolyl group, a benzofurocarbazolyl group, a benzothienocarbazolyl group, a dihydroindenocarbazolyl group, a benzoquinolinyl group, an acridinyl group, a dibenzoacridinyl group, a benzimidazolyl group, an imidazopyridyl group, a benzoxazolyl group, a benzothiazolyl group, or a phenanthrolinyl group. The naphthyridinyl group refers to any of a 1,5-naphthyridinyl group, a 1,6-naphthyridinyl group, a 1,7-naphthyridinyl group, a 1,8-naphthyridinyl group, a 2,6-naphthyridinyl group, or a 2,7-naphthyridinyl group. The heteroaryl group optionally has a substituent. The carbon number of the heteroaryl group, which is not limited to a particular number, is in the range of preferably 2 or more and 40 or less and more preferably 2 or more and 30 or less.

When $R^1$ to $R^9$ are each a substituted or unsubstituted heteroaryl group, the heteroaryl group is preferably a pyridyl group, a furanyl group, a thiophenyl group, a quinolinyl group, a pyrimidyl group, a triazinyl group, a benzofuranyl group, a benzothiophenyl group, an indolyl group, a dibenzofuranyl group, a dibenzothiophenyl group, a carbazolyl group, a benzimidazolyl group, an imidazopyridyl group, a benzoxazolyl group, a benzothiazolyl group, or a phenanthrolinyl group, more preferably a pyridyl group, a furanyl group, a thiophenyl group, or a quinolinyl group, and particularly preferably a pyridyl group.

When each of the substituents is further substituted by a heteroaryl group, the heteroaryl group is preferably a pyridyl group, a furanyl group, a thiophenyl group, a quinolinyl group, a pyrimidyl group, a triazinyl group, a benzofuranyl group, a benzothiophenyl group, an indolyl group, a dibenzofuranyl group, a dibenzothiophenyl group, a carbazolyl group, a benzimidazolyl group, an imidazopyridyl group, a benzoxazolyl group, a benzothiazolyl group, or a phenanthrolinyl group, more preferably a pyridyl group, a furanyl group, a thiophenyl group, or a quinolinyl group, and particularly preferably a pyridyl group.

The halogen refers to an atom selected from fluorine, chlorine, bromine, and iodine.

The carbonyl group, the carboxyl group, the oxycarbonyl group, and the carbamoyl group each optionally have a substituent. Examples of the substituent include an alkyl group, a cycloalkyl group, an aryl group, and a heteroaryl group, and these substituents may be further substituted.

The amino group is a substituted or unsubstituted amino group. Examples of the substituent when it is substituted include an aryl group, a heteroaryl group, a linear alkyl group, and a branched alkyl group. The aryl group and the heteroaryl group are preferably a phenyl group, a naphthyl group, a pyridyl group, or a quinolinyl group. These substituents may be further substituted. The carbon number, which is not limited to a particular number, is in the range of preferably 2 or more and 50 or less, more preferably 6 or more and 40 or less, and particularly preferably 6 or more and 30 or less.

The silyl group refers to an alkyl silyl group such as a trimethylsilyl group, a triethylsilyl group, a tert-butyl dimethyl silyl group, a propyl dimethyl silyl group, or a vinyl dimethyl silyl group and an aryl silyl group such as a phenyl dimethyl silyl group, a tert-butyl diphenyl silyl group, a triphenyl silyl group, or a trinaphthyl silyl group. The substituent on the silicon may be further substituted. The carbon number of the silyl group, which is not limited to a particular number, is preferably in the range of 1 or more and 30 or less.

The siloxanyl group refers to a silicide group through an ether bond such as trimethylsiloxanyl group. The substituent on the silicon may be further substituted.

The boryl group is a substituted or unsubstituted boryl group. Examples of a substituent when it is substituted include an aryl group, a heteroaryl group, a linear alkyl group, a branched alkyl group, an aryl ether group, an alkoxy group, and a hydroxy group, and among these, an aryl group and an aryl ether group are preferable.

The phosphine oxide group is a group represented by —P(=O)$R^{10}R^{11}$. $R^{10}$ and $R^{11}$ are each selected from a group similar to that for $R^1$ to $R^9$.

Any two adjacent substituents ($R^1$ and $R^2$ in General Formula (5), for example) may be bound to each other to form a conjugated or non-conjugated condensed ring or aliphatic ring. As the element of the condensed ring, an element selected from nitrogen, oxygen, sulfur, phosphorous, and silicon, besides carbon, may be contained. The condensed ring may further condense with another ring.

The compound represented by General Formula (5) exhibits high fluorescence quantum yield and is small in the peak full width at half maximum of an emission spectrum, thus enabling efficient color conversion and high color purity to be achieved.

In addition, the compound represented by General Formula (5), by introducing an appropriate substituent to an appropriate position, enables various characteristics and properties such as emission efficiency, color purity, thermal stability, photostability, and dispersibility to be adjusted. A case in which at least one of $R^1$, $R^3$, $R^4$, and $R^6$ is a substituted or unsubstituted alkyl group, a substituted or unsubstituted aryl group, or a substituted or unsubstituted heteroaryl group exhibits better thermal stability and photostability compared with a case in which all $R^1$, $R^3$, $R^4$, and $R^6$ are hydrogens, for example.

When at least one of $R^1$, $R^3$, $R^4$, and $R^6$ is a substituted or unsubstituted alkyl group, the alkyl group is preferably a C1-6 alkyl group such as a methyl group, an ethyl group, a n-propyl group, an isopropyl group, a n-butyl group, a sec-butyl group, a tert-butyl group, a pentyl group, or a hexyl group, and in view of being excellent in thermal stability, a methyl group, an ethyl group, a n-propyl group, an isopropyl group, a n-butyl group, a sec-butyl group, or a tert-butyl group is preferable. In view of preventing concentration quenching to improve emission quantum yield, a tert-butyl group, which is sterically bulky, is more preferable. In view of the easiness of synthesis and raw material availability, a methyl group is also preferably used.

When at least one of $R^1$, $R^3$, $R^4$, and $R^6$ is a substituted or unsubstituted aryl group, the aryl group is preferably a phenyl group, a biphenyl group, a terphenyl group, or a naphthyl group, further preferably a phenyl group or a biphenyl group, particularly preferably a phenyl group.

Allowing at least one of $R^1$, $R^3$, $R^4$, and $R^6$ to be a substituted or unsubstituted aryl group improves the compatibility with the component (B), improves the dispersion stability of the light-emitting material, and accordingly can inhibit deterioration of the light-emitting material, thus making it possible to obtain favorable durability.

When at least one of $R^1$, $R^3$, $R^4$, and $R^6$ is a substituted or unsubstituted heteroaryl group, the heteroaryl group is preferably a pyridyl group, a quinolinyl group, or a thiophenyl group, more preferably a pyridyl group or a quinolinyl group. A pyridyl group is particularly preferable.

When all $R^1$, $R^3$, $R^4$, and $R^6$ are independently substituted or unsubstituted alkyl groups, solubility to a binder resin or a solvent is good, which is preferred. The alkyl group is preferably a methyl group in view of the easiness of synthesis and raw material availability.

When all $R^1$, $R^3$, $R^4$, and $R^6$ are independently substituted or unsubstituted aryl groups or substituted or unsubstituted heteroaryl groups, better thermal stability and photostability are exhibited, which is preferred, and more preferably, all $R^1$, $R^3$, $R^4$, and $R^6$ are independently substituted or unsubstituted aryl groups.

Although some substituents improve a plurality of properties, substituents that exhibit sufficient performance in all are limited. In particular, it is difficult to achieve both high emission efficiency and high color purity. Given these circumstances, a plurality of kinds of substituents are introduced, whereby a compound having a balance among emission characteristics, high color purity, and the like can be obtained.

In particular, when all $R^1$, $R^3$, $R^4$, and $R^6$ are independently substituted or unsubstituted aryl groups, a plurality of kinds of substituents are preferably introduced, such as $R^1 \neq R^4$, $R^3 \neq R^6$, $R^1 \neq R^3$, or $R^4 \neq R^6$. In this example, "$\neq$" means that they are groups having different structures. An aryl group that has an influence on color purity and an aryl group that has an influence on efficiency can be simultaneously introduced, and fine adjustment can be made.

Among them, $R^1 \neq R^3$ or $R^4 \neq R^6$ is preferred in view of improving emission efficiency and color purity with a good balance. One or more aryl groups having an influence on color purity can be introduced to both pyrrole rings each, whereas an aryl group having an influence on efficiency can be introduced to any other position, and both of the properties can be improved to the maximum. When $R^1 \neq R^3$ or $R^4 \neq R^6$, in view of heat resistance and color purity, more preferred are $R^1 = R^4$ and $R^3 = R^6$.

The aryl group that has an influence mainly on color purity is preferably an aryl group substituted by an electron donating group. The electron donating group is an atomic group that donates an electron to a substituted atomic group by the inductive effect and/or the resonance effect in the organic electron theory. Examples of the electron donating group include ones having a negative value as a substituent constant (σp (para)) of Hammett's Rule. The substituent constant (σp (para)) of Hammett's Rule can be cited from Kagaku Binran Kiso-Hen Revised 5th Edition (II, p. 380).

Specific examples of the electron donating group include an alkyl group (σp of a methyl group: −0.17), an alkoxy group (σp of a methoxy group=−0.27), and an amino group (σp of —NH$_2$=−0.66). In particular, a C1-8 alkyl group or a C1-8 alkoxy group is preferred, and more preferred are a methyl group, an ethyl group, a tert-butyl group, and a methoxy group. In view of dispersibility, a tert-butyl group or a methoxy group, which prevents quenching caused by the aggregation of molecules, is particularly preferred. Although the substitution position of the substituent is not limited to a particular position, the substituent is preferably bonded to the meta position or the para position relative to the position bonding to the pyrromethene skeleton, because the twist of bonding is required to be inhibited in order to increase the photostability.

The aryl group that has an influence mainly on efficiency is preferably an aryl group having a bulky substituent such as a tert-butyl group, an adamantyl group, or a methoxy group.

When all $R^1$, $R^3$, $R^4$, and $R^6$ are independently substituted or unsubstituted aryl groups, they are each preferably selected from the following Ar-1 to Ar-6. In this case, examples of a preferred combination of $R^1$, $R^3$, $R^4$, and $R^6$ include, but are not limited to, combinations listed in Table 1-1 to Table 1-11.

[Chem. 2]

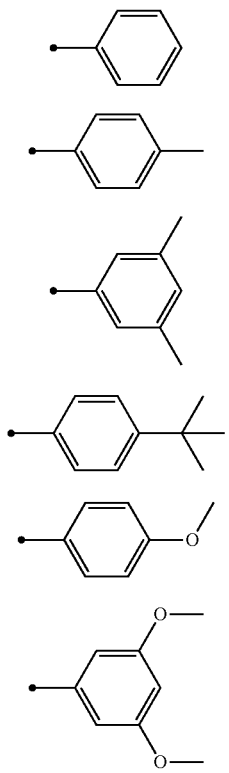

Ar-1

Ar-2

Ar-3

Ar-4

Ar-5

Ar-6

TABLE 1-1

| R1 | R3 | R4 | R6 |
|---|---|---|---|
| Ar-1 | Ar-1 | Ar-1 | Ar-1 |
| Ar-1 | Ar-1 | Ar-1 | Ar-2 |
| Ar-1 | Ar-1 | Ar-1 | Ar-3 |
| Ar-1 | Ar-1 | Ar-1 | Ar-4 |
| Ar-1 | Ar-1 | Ar-1 | Ar-5 |
| Ar-1 | Ar-1 | Ar-1 | Ar-6 |
| Ar-1 | Ar-1 | Ar-2 | Ar-1 |
| Ar-1 | Ar-1 | Ar-2 | Ar-2 |
| Ar-1 | Ar-1 | Ar-2 | Ar-3 |
| Ar-1 | Ar-1 | Ar-2 | Ar-4 |
| Ar-1 | Ar-1 | Ar-2 | Ar-5 |
| Ar-1 | Ar-1 | Ar-2 | Ar-6 |
| Ar-1 | Ar-1 | Ar-3 | Ar-1 |
| Ar-1 | Ar-1 | Ar-3 | Ar-2 |
| Ar-1 | Ar-1 | Ar-3 | Ar-3 |
| Ar-1 | Ar-1 | Ar-3 | Ar-4 |
| Ar-1 | Ar-1 | Ar-3 | Ar-5 |
| Ar-1 | Ar-1 | Ar-3 | Ar-6 |
| Ar-1 | Ar-1 | Ar-4 | Ar-1 |
| Ar-1 | Ar-1 | Ar-4 | Ar-2 |
| Ar-1 | Ar-1 | Ar-4 | Ar-3 |
| Ar-1 | Ar-1 | Ar-4 | Ar-4 |
| Ar-1 | Ar-1 | Ar-4 | Ar-5 |
| Ar-1 | Ar-1 | Ar-4 | Ar-6 |
| Ar-1 | Ar-1 | Ar-5 | Ar-1 |
| Ar-1 | Ar-1 | Ar-5 | Ar-2 |
| Ar-1 | Ar-1 | Ar-5 | Ar-3 |
| Ar-1 | Ar-1 | Ar-5 | Ar-4 |
| Ar-1 | Ar-1 | Ar-5 | Ar-5 |
| Ar-1 | Ar-1 | Ar-5 | Ar-6 |
| Ar-1 | Ar-1 | Ar-6 | Ar-1 |
| Ar-1 | Ar-1 | Ar-6 | Ar-2 |
| Ar-1 | Ar-1 | Ar-6 | Ar-3 |
| Ar-1 | Ar-1 | Ar-6 | Ar-4 |
| Ar-1 | Ar-1 | Ar-6 | Ar-5 |
| Ar-1 | Ar-1 | Ar-6 | Ar-6 |
| Ar-1 | Ar-2 | Ar-1 | Ar-2 |
| Ar-1 | Ar-2 | Ar-1 | Ar-3 |
| Ar-1 | Ar-2 | Ar-1 | Ar-4 |
| Ar-1 | Ar-2 | Ar-1 | Ar-5 |
| Ar-1 | Ar-2 | Ar-1 | Ar-6 |
| Ar-1 | Ar-2 | Ar-2 | Ar-1 |
| Ar-1 | Ar-2 | Ar-2 | Ar-2 |
| Ar-1 | Ar-2 | Ar-2 | Ar-3 |
| Ar-1 | Ar-2 | Ar-2 | Ar-4 |
| Ar-1 | Ar-2 | Ar-2 | Ar-5 |
| Ar-1 | Ar-2 | Ar-2 | Ar-6 |
| Ar-1 | Ar-2 | Ar-3 | Ar-1 |
| Ar-1 | Ar-2 | Ar-3 | Ar-2 |
| Ar-1 | Ar-2 | Ar-3 | Ar-3 |
| Ar-1 | Ar-2 | Ar-3 | Ar-4 |
| Ar-1 | Ar-2 | Ar-3 | Ar-5 |
| Ar-1 | Ar-2 | Ar-3 | Ar-6 |
| Ar-1 | Ar-2 | Ar-4 | Ar-1 |
| Ar-1 | Ar-2 | Ar-4 | Ar-2 |
| Ar-1 | Ar-2 | Ar-4 | Ar-3 |
| Ar-1 | Ar-2 | Ar-4 | Ar-4 |
| Ar-1 | Ar-2 | Ar-4 | Ar-5 |
| Ar-1 | Ar-2 | Ar-4 | Ar-6 |

TABLE 1-2

| R1 | R3 | R4 | R6 |
|---|---|---|---|
| Ar-1 | Ar-2 | Ar-5 | Ar-1 |
| Ar-1 | Ar-2 | Ar-5 | Ar-2 |
| Ar-1 | Ar-2 | Ar-5 | Ar-3 |
| Ar-1 | Ar-2 | Ar-5 | Ar-4 |
| Ar-1 | Ar-2 | Ar-5 | Ar-5 |
| Ar-1 | Ar-2 | Ar-5 | Ar-6 |
| Ar-1 | Ar-2 | Ar-6 | Ar-1 |
| Ar-1 | Ar-2 | Ar-6 | Ar-2 |
| Ar-1 | Ar-2 | Ar-6 | Ar-3 |
| Ar-1 | Ar-2 | Ar-6 | Ar-4 |
| Ar-1 | Ar-2 | Ar-6 | Ar-5 |

TABLE 1-2-continued

| R1 | R3 | R4 | R6 |
|---|---|---|---|
| Ar-1 | Ar-2 | Ar-6 | Ar-6 |
| Ar-1 | Ar-3 | Ar-1 | Ar-2 |
| Ar-1 | Ar-3 | Ar-1 | Ar-3 |
| Ar-1 | Ar-3 | Ar-1 | Ar-4 |
| Ar-1 | Ar-3 | Ar-1 | Ar-5 |
| Ar-1 | Ar-3 | Ar-1 | Ar-6 |
| Ar-1 | Ar-3 | Ar-2 | Ar-2 |
| Ar-1 | Ar-3 | Ar-2 | Ar-3 |
| Ar-1 | Ar-3 | Ar-2 | Ar-4 |
| Ar-1 | Ar-3 | Ar-2 | Ar-5 |
| Ar-1 | Ar-3 | Ar-2 | Ar-6 |
| Ar-1 | Ar-3 | Ar-3 | Ar-1 |
| Ar-1 | Ar-3 | Ar-3 | Ar-2 |
| Ar-1 | Ar-3 | Ar-3 | Ar-3 |
| Ar-1 | Ar-3 | Ar-3 | Ar-4 |
| Ar-1 | Ar-3 | Ar-3 | Ar-5 |
| Ar-1 | Ar-3 | Ar-3 | Ar-6 |
| Ar-1 | Ar-3 | Ar-4 | Ar-1 |
| Ar-1 | Ar-3 | Ar-4 | Ar-2 |
| Ar-1 | Ar-3 | Ar-4 | Ar-3 |
| Ar-1 | Ar-3 | Ar-4 | Ar-4 |
| Ar-1 | Ar-3 | Ar-4 | Ar-5 |
| Ar-1 | Ar-3 | Ar-4 | Ar-6 |
| Ar-1 | Ar-3 | Ar-5 | Ar-1 |
| Ar-1 | Ar-3 | Ar-5 | Ar-2 |
| Ar-1 | Ar-3 | Ar-5 | Ar-3 |
| Ar-1 | Ar-3 | Ar-5 | Ar-4 |
| Ar-1 | Ar-3 | Ar-5 | Ar-5 |
| Ar-1 | Ar-3 | Ar-5 | Ar-6 |
| Ar-1 | Ar-3 | Ar-6 | Ar-1 |
| Ar-1 | Ar-3 | Ar-6 | Ar-2 |
| Ar-1 | Ar-3 | Ar-6 | Ar-3 |
| Ar-1 | Ar-3 | Ar-6 | Ar-4 |
| Ar-1 | Ar-3 | Ar-6 | Ar-5 |
| Ar-1 | Ar-3 | Ar-6 | Ar-6 |
| Ar-1 | Ar-4 | Ar-1 | Ar-2 |
| Ar-1 | Ar-4 | Ar-1 | Ar-3 |
| Ar-1 | Ar-4 | Ar-1 | Ar-4 |
| Ar-1 | Ar-4 | Ar-1 | Ar-5 |
| Ar-1 | Ar-4 | Ar-1 | Ar-6 |
| Ar-1 | Ar-4 | Ar-2 | Ar-2 |
| Ar-1 | Ar-4 | Ar-2 | Ar-3 |
| Ar-1 | Ar-4 | Ar-2 | Ar-4 |
| Ar-1 | Ar-4 | Ar-2 | Ar-5 |
| Ar-1 | Ar-4 | Ar-2 | Ar-6 |
| Ar-1 | Ar-4 | Ar-3 | Ar-2 |
| Ar-1 | Ar-4 | Ar-3 | Ar-3 |
| Ar-1 | Ar-4 | Ar-3 | Ar-4 |
| Ar-1 | Ar-4 | Ar-3 | Ar-5 |
| Ar-1 | Ar-4 | Ar-3 | Ar-6 |

TABLE 1-3

| R1 | R3 | R4 | R6 |
|---|---|---|---|
| Ar-1 | Ar-4 | Ar-4 | Ar-1 |
| Ar-1 | Ar-4 | Ar-4 | Ar-2 |
| Ar-1 | Ar-4 | Ar-4 | Ar-3 |
| Ar-1 | Ar-4 | Ar-4 | Ar-4 |
| Ar-1 | Ar-4 | Ar-4 | Ar-5 |
| Ar-1 | Ar-4 | Ar-4 | Ar-6 |
| Ar-1 | Ar-4 | Ar-5 | Ar-1 |
| Ar-1 | Ar-4 | Ar-5 | Ar-2 |
| Ar-1 | Ar-4 | Ar-5 | Ar-3 |
| Ar-1 | Ar-4 | Ar-5 | Ar-4 |
| Ar-1 | Ar-4 | Ar-5 | Ar-5 |
| Ar-1 | Ar-4 | Ar-5 | Ar-6 |
| Ar-1 | Ar-4 | Ar-6 | Ar-1 |
| Ar-1 | Ar-4 | Ar-6 | Ar-2 |
| Ar-1 | Ar-4 | Ar-6 | Ar-3 |
| Ar-1 | Ar-4 | Ar-6 | Ar-4 |
| Ar-1 | Ar-4 | Ar-6 | Ar-5 |
| Ar-1 | Ar-4 | Ar-6 | Ar-6 |
| Ar-1 | Ar-5 | Ar-1 | Ar-2 |
| Ar-1 | Ar-5 | Ar-1 | Ar-3 |

TABLE 1-3-continued

| R1 | R3 | R4 | R6 |
|---|---|---|---|
| Ar-1 | Ar-5 | Ar-1 | Ar-4 |
| Ar-1 | Ar-5 | Ar-1 | Ar-5 |
| Ar-1 | Ar-5 | Ar-1 | Ar-6 |
| Ar-1 | Ar-5 | Ar-2 | Ar-2 |
| Ar-1 | Ar-5 | Ar-2 | Ar-3 |
| Ar-1 | Ar-5 | Ar-2 | Ar-4 |
| Ar-1 | Ar-5 | Ar-2 | Ar-5 |
| Ar-1 | Ar-5 | Ar-2 | Ar-6 |
| Ar-1 | Ar-5 | Ar-3 | Ar-2 |
| Ar-1 | Ar-5 | Ar-3 | Ar-3 |
| Ar-1 | Ar-5 | Ar-3 | Ar-4 |
| Ar-1 | Ar-5 | Ar-3 | Ar-5 |
| Ar-1 | Ar-5 | Ar-3 | Ar-6 |
| Ar-1 | Ar-5 | Ar-4 | Ar-2 |
| Ar-1 | Ar-5 | Ar-4 | Ar-3 |
| Ar-1 | Ar-5 | Ar-4 | Ar-4 |
| Ar-1 | Ar-5 | Ar-4 | Ar-5 |
| Ar-1 | Ar-5 | Ar-4 | Ar-6 |
| Ar-1 | Ar-5 | Ar-5 | Ar-1 |
| Ar-1 | Ar-5 | Ar-5 | Ar-2 |
| Ar-1 | Ar-5 | Ar-5 | Ar-3 |
| Ar-1 | Ar-5 | Ar-5 | Ar-4 |
| Ar-1 | Ar-5 | Ar-5 | Ar-5 |
| Ar-1 | Ar-5 | Ar-5 | Ar-6 |
| Ar-1 | Ar-5 | Ar-6 | Ar-1 |
| Ar-1 | Ar-5 | Ar-6 | Ar-2 |
| Ar-1 | Ar-5 | Ar-6 | Ar-3 |
| Ar-1 | Ar-5 | Ar-6 | Ar-4 |
| Ar-1 | Ar-5 | Ar-6 | Ar-5 |
| Ar-1 | Ar-5 | Ar-6 | Ar-6 |
| Ar-1 | Ar-6 | Ar-1 | Ar-2 |
| Ar-1 | Ar-6 | Ar-1 | Ar-3 |
| Ar-1 | Ar-6 | Ar-1 | Ar-4 |
| Ar-1 | Ar-6 | Ar-1 | Ar-5 |
| Ar-1 | Ar-6 | Ar-1 | Ar-6 |
| Ar-1 | Ar-6 | Ar-2 | Ar-2 |
| Ar-1 | Ar-6 | Ar-2 | Ar-3 |
| Ar-1 | Ar-6 | Ar-2 | Ar-4 |
| Ar-1 | Ar-6 | Ar-2 | Ar-5 |
| Ar-1 | Ar-6 | Ar-2 | Ar-6 |

TABLE 1-4

| R1 | R3 | R4 | R6 |
|---|---|---|---|
| Ar-1 | Ar-6 | Ar-3 | Ar-2 |
| Ar-1 | Ar-6 | Ar-3 | Ar-3 |
| Ar-1 | Ar-6 | Ar-3 | Ar-4 |
| Ar-1 | Ar-6 | Ar-3 | Ar-5 |
| Ar-1 | Ar-6 | Ar-3 | Ar-6 |
| Ar-1 | Ar-6 | Ar-4 | Ar-2 |
| Ar-1 | Ar-6 | Ar-4 | Ar-3 |
| Ar-1 | Ar-6 | Ar-4 | Ar-4 |
| Ar-1 | Ar-6 | Ar-4 | Ar-5 |
| Ar-1 | Ar-6 | Ar-4 | Ar-6 |
| Ar-1 | Ar-6 | Ar-5 | Ar-2 |
| Ar-1 | Ar-6 | Ar-5 | Ar-3 |
| Ar-1 | Ar-6 | Ar-5 | Ar-4 |
| Ar-1 | Ar-6 | Ar-5 | Ar-5 |
| Ar-1 | Ar-6 | Ar-5 | Ar-6 |
| Ar-1 | Ar-6 | Ar-6 | Ar-1 |
| Ar-1 | Ar-6 | Ar-6 | Ar-2 |
| Ar-1 | Ar-6 | Ar-6 | Ar-3 |
| Ar-1 | Ar-6 | Ar-6 | Ar-4 |
| Ar-1 | Ar-6 | Ar-6 | Ar-5 |
| Ar-1 | Ar-6 | Ar-6 | Ar-6 |
| Ar-2 | Ar-1 | Ar-1 | Ar-2 |
| Ar-2 | Ar-1 | Ar-1 | Ar-3 |
| Ar-2 | Ar-1 | Ar-1 | Ar-4 |
| Ar-2 | Ar-1 | Ar-1 | Ar-5 |
| Ar-2 | Ar-1 | Ar-1 | Ar-6 |
| Ar-2 | Ar-1 | Ar-2 | Ar-2 |
| Ar-2 | Ar-1 | Ar-2 | Ar-3 |
| Ar-2 | Ar-1 | Ar-2 | Ar-4 |
| Ar-2 | Ar-1 | Ar-2 | Ar-5 |

TABLE 1-4-continued

| R1 | R3 | R4 | R6 |
| --- | --- | --- | --- |
| Ar-2 | Ar-1 | Ar-2 | Ar-6 |
| Ar-2 | Ar-1 | Ar-3 | Ar-2 |
| Ar-2 | Ar-1 | Ar-3 | Ar-3 |
| Ar-2 | Ar-1 | Ar-3 | Ar-4 |
| Ar-2 | Ar-1 | Ar-3 | Ar-5 |
| Ar-2 | Ar-1 | Ar-3 | Ar-6 |
| Ar-2 | Ar-1 | Ar-4 | Ar-2 |
| Ar-2 | Ar-1 | Ar-4 | Ar-3 |
| Ar-2 | Ar-1 | Ar-4 | Ar-4 |
| Ar-2 | Ar-1 | Ar-4 | Ar-5 |
| Ar-2 | Ar-1 | Ar-4 | Ar-6 |
| Ar-2 | Ar-1 | Ar-5 | Ar-2 |
| Ar-2 | Ar-1 | Ar-5 | Ar-3 |
| Ar-2 | Ar-1 | Ar-5 | Ar-4 |
| Ar-2 | Ar-1 | Ar-5 | Ar-5 |
| Ar-2 | Ar-1 | Ar-5 | Ar-6 |
| Ar-2 | Ar-1 | Ar-6 | Ar-2 |
| Ar-2 | Ar-1 | Ar-6 | Ar-3 |
| Ar-2 | Ar-1 | Ar-6 | Ar-4 |
| Ar-2 | Ar-1 | Ar-6 | Ar-5 |
| Ar-2 | Ar-1 | Ar-6 | Ar-6 |
| Ar-2 | Ar-2 | Ar-1 | Ar-3 |
| Ar-2 | Ar-2 | Ar-1 | Ar-4 |
| Ar-2 | Ar-2 | Ar-1 | Ar-5 |
| Ar-2 | Ar-2 | Ar-1 | Ar-6 |
| Ar-2 | Ar-2 | Ar-2 | Ar-2 |
| Ar-2 | Ar-2 | Ar-2 | Ar-3 |
| Ar-2 | Ar-2 | Ar-2 | Ar-4 |
| Ar-2 | Ar-2 | Ar-2 | Ar-5 |
| Ar-2 | Ar-2 | Ar-2 | Ar-6 |

TABLE 1-5

| R1 | R3 | R4 | R6 |
| --- | --- | --- | --- |
| Ar-2 | Ar-2 | Ar-3 | Ar-2 |
| Ar-2 | Ar-2 | Ar-3 | Ar-3 |
| Ar-2 | Ar-2 | Ar-3 | Ar-4 |
| Ar-2 | Ar-2 | Ar-3 | Ar-5 |
| Ar-2 | Ar-2 | Ar-3 | Ar-6 |
| Ar-2 | Ar-2 | Ar-4 | Ar-2 |
| Ar-2 | Ar-2 | Ar-4 | Ar-3 |
| Ar-2 | Ar-2 | Ar-4 | Ar-4 |
| Ar-2 | Ar-2 | Ar-4 | Ar-5 |
| Ar-2 | Ar-2 | Ar-4 | Ar-6 |
| Ar-2 | Ar-2 | Ar-5 | Ar-2 |
| Ar-2 | Ar-2 | Ar-5 | Ar-3 |
| Ar-2 | Ar-2 | Ar-5 | Ar-4 |
| Ar-2 | Ar-2 | Ar-5 | Ar-5 |
| Ar-2 | Ar-2 | Ar-5 | Ar-6 |
| Ar-2 | Ar-2 | Ar-6 | Ar-2 |
| Ar-2 | Ar-2 | Ar-6 | Ar-3 |
| Ar-2 | Ar-2 | Ar-6 | Ar-4 |
| Ar-2 | Ar-2 | Ar-6 | Ar-5 |
| Ar-2 | Ar-2 | Ar-6 | Ar-6 |
| Ar-2 | Ar-3 | Ar-1 | Ar-3 |
| Ar-2 | Ar-3 | Ar-1 | Ar-4 |
| Ar-2 | Ar-3 | Ar-1 | Ar-5 |
| Ar-2 | Ar-3 | Ar-1 | Ar-6 |
| Ar-2 | Ar-3 | Ar-2 | Ar-3 |
| Ar-2 | Ar-3 | Ar-2 | Ar-4 |
| Ar-2 | Ar-3 | Ar-2 | Ar-5 |
| Ar-2 | Ar-3 | Ar-2 | Ar-6 |
| Ar-2 | Ar-3 | Ar-3 | Ar-2 |
| Ar-2 | Ar-3 | Ar-3 | Ar-3 |
| Ar-2 | Ar-3 | Ar-3 | Ar-4 |
| Ar-2 | Ar-3 | Ar-3 | Ar-5 |
| Ar-2 | Ar-3 | Ar-3 | Ar-6 |
| Ar-2 | Ar-3 | Ar-4 | Ar-2 |
| Ar-2 | Ar-3 | Ar-4 | Ar-3 |
| Ar-2 | Ar-3 | Ar-4 | Ar-4 |
| Ar-2 | Ar-3 | Ar-4 | Ar-5 |
| Ar-2 | Ar-3 | Ar-4 | Ar-6 |
| Ar-2 | Ar-3 | Ar-5 | Ar-2 |
| Ar-2 | Ar-3 | Ar-5 | Ar-3 |

TABLE 1-5-continued

| R1 | R3 | R4 | R6 |
| --- | --- | --- | --- |
| Ar-2 | Ar-3 | Ar-5 | Ar-4 |
| Ar-2 | Ar-3 | Ar-5 | Ar-5 |
| Ar-2 | Ar-3 | Ar-5 | Ar-6 |
| Ar-2 | Ar-3 | Ar-6 | Ar-2 |
| Ar-2 | Ar-3 | Ar-6 | Ar-3 |
| Ar-2 | Ar-3 | Ar-6 | Ar-4 |
| Ar-2 | Ar-3 | Ar-6 | Ar-5 |
| Ar-2 | Ar-3 | Ar-6 | Ar-6 |
| Ar-2 | Ar-4 | Ar-1 | Ar-3 |
| Ar-2 | Ar-4 | Ar-1 | Ar-4 |
| Ar-2 | Ar-4 | Ar-1 | Ar-5 |
| Ar-2 | Ar-4 | Ar-1 | Ar-6 |
| Ar-2 | Ar-4 | Ar-2 | Ar-3 |
| Ar-2 | Ar-4 | Ar-2 | Ar-4 |
| Ar-2 | Ar-4 | Ar-2 | Ar-5 |
| Ar-2 | Ar-4 | Ar-2 | Ar-6 |
| Ar-2 | Ar-4 | Ar-3 | Ar-3 |
| Ar-2 | Ar-4 | Ar-3 | Ar-4 |
| Ar-2 | Ar-4 | Ar-3 | Ar-5 |
| Ar-2 | Ar-4 | Ar-3 | Ar-6 |

TABLE 1-6

| R1 | R3 | R4 | R6 |
| --- | --- | --- | --- |
| Ar-2 | Ar-4 | Ar-4 | Ar-2 |
| Ar-2 | Ar-4 | Ar-4 | Ar-3 |
| Ar-2 | Ar-4 | Ar-4 | Ar-4 |
| Ar-2 | Ar-4 | Ar-4 | Ar-5 |
| Ar-2 | Ar-4 | Ar-4 | Ar-6 |
| Ar-2 | Ar-4 | Ar-5 | Ar-2 |
| Ar-2 | Ar-4 | Ar-5 | Ar-3 |
| Ar-2 | Ar-4 | Ar-5 | Ar-4 |
| Ar-2 | Ar-4 | Ar-5 | Ar-5 |
| Ar-2 | Ar-4 | Ar-5 | Ar-6 |
| Ar-2 | Ar-4 | Ar-6 | Ar-2 |
| Ar-2 | Ar-4 | Ar-6 | Ar-3 |
| Ar-2 | Ar-4 | Ar-6 | Ar-4 |
| Ar-2 | Ar-4 | Ar-6 | Ar-5 |
| Ar-2 | Ar-4 | Ar-6 | Ar-6 |
| Ar-2 | Ar-5 | Ar-1 | Ar-3 |
| Ar-2 | Ar-5 | Ar-1 | Ar-4 |
| Ar-2 | Ar-5 | Ar-1 | Ar-5 |
| Ar-2 | Ar-5 | Ar-1 | Ar-6 |
| Ar-2 | Ar-5 | Ar-2 | Ar-3 |
| Ar-2 | Ar-5 | Ar-2 | Ar-4 |
| Ar-2 | Ar-5 | Ar-2 | Ar-5 |
| Ar-2 | Ar-5 | Ar-2 | Ar-6 |
| Ar-2 | Ar-5 | Ar-3 | Ar-3 |
| Ar-2 | Ar-5 | Ar-3 | Ar-4 |
| Ar-2 | Ar-5 | Ar-3 | Ar-5 |
| Ar-2 | Ar-5 | Ar-3 | Ar-6 |
| Ar-2 | Ar-5 | Ar-4 | Ar-3 |
| Ar-2 | Ar-5 | Ar-4 | Ar-4 |
| Ar-2 | Ar-5 | Ar-4 | Ar-5 |
| Ar-2 | Ar-5 | Ar-4 | Ar-6 |
| Ar-2 | Ar-5 | Ar-5 | Ar-2 |
| Ar-2 | Ar-5 | Ar-5 | Ar-3 |
| Ar-2 | Ar-5 | Ar-5 | Ar-4 |
| Ar-2 | Ar-5 | Ar-5 | Ar-5 |
| Ar-2 | Ar-5 | Ar-5 | Ar-6 |
| Ar-2 | Ar-5 | Ar-6 | Ar-2 |
| Ar-2 | Ar-5 | Ar-6 | Ar-3 |
| Ar-2 | Ar-5 | Ar-6 | Ar-4 |
| Ar-2 | Ar-5 | Ar-6 | Ar-5 |
| Ar-2 | Ar-5 | Ar-6 | Ar-6 |
| Ar-2 | Ar-6 | Ar-1 | Ar-3 |
| Ar-2 | Ar-6 | Ar-1 | Ar-4 |
| Ar-2 | Ar-6 | Ar-1 | Ar-5 |
| Ar-2 | Ar-6 | Ar-1 | Ar-6 |
| Ar-2 | Ar-6 | Ar-2 | Ar-4 |
| Ar-2 | Ar-6 | Ar-2 | Ar-5 |
| Ar-2 | Ar-6 | Ar-2 | Ar-6 |
| Ar-2 | Ar-6 | Ar-3 | Ar-3 |

TABLE 1-6-continued

| R1 | R3 | R4 | R6 |
|---|---|---|---|
| Ar-2 | Ar-6 | Ar-3 | Ar-4 |
| Ar-2 | Ar-6 | Ar-3 | Ar-5 |
| Ar-2 | Ar-6 | Ar-3 | Ar-6 |
| Ar-2 | Ar-6 | Ar-4 | Ar-3 |
| Ar-2 | Ar-6 | Ar-4 | Ar-4 |
| Ar-2 | Ar-6 | Ar-4 | Ar-5 |
| Ar-2 | Ar-6 | Ar-4 | Ar-6 |
| Ar-2 | Ar-6 | Ar-5 | Ar-3 |
| Ar-2 | Ar-6 | Ar-5 | Ar-4 |
| Ar-2 | Ar-6 | Ar-5 | Ar-5 |
| Ar-2 | Ar-6 | Ar-5 | Ar-6 |

TABLE 1-7

| R1 | R3 | R4 | R6 |
|---|---|---|---|
| Ar-2 | Ar-6 | Ar-6 | Ar-2 |
| Ar-2 | Ar-6 | Ar-6 | Ar-3 |
| Ar-2 | Ar-6 | Ar-6 | Ar-4 |
| Ar-2 | Ar-6 | Ar-6 | Ar-5 |
| Ar-2 | Ar-6 | Ar-6 | Ar-6 |
| Ar-3 | Ar-1 | Ar-1 | Ar-3 |
| Ar-3 | Ar-1 | Ar-1 | Ar-4 |
| Ar-3 | Ar-1 | Ar-1 | Ar-5 |
| Ar-3 | Ar-1 | Ar-1 | Ar-6 |
| Ar-3 | Ar-1 | Ar-2 | Ar-3 |
| Ar-3 | Ar-1 | Ar-2 | Ar-4 |
| Ar-3 | Ar-1 | Ar-2 | Ar-5 |
| Ar-3 | Ar-1 | Ar-2 | Ar-6 |
| Ar-3 | Ar-1 | Ar-3 | Ar-3 |
| Ar-3 | Ar-1 | Ar-3 | Ar-4 |
| Ar-3 | Ar-1 | Ar-3 | Ar-5 |
| Ar-3 | Ar-1 | Ar-3 | Ar-6 |
| Ar-3 | Ar-1 | Ar-4 | Ar-3 |
| Ar-3 | Ar-1 | Ar-4 | Ar-4 |
| Ar-3 | Ar-1 | Ar-4 | Ar-5 |
| Ar-3 | Ar-1 | Ar-4 | Ar-6 |
| Ar-3 | Ar-1 | Ar-5 | Ar-3 |
| Ar-3 | Ar-1 | Ar-5 | Ar-4 |
| Ar-3 | Ar-1 | Ar-5 | Ar-5 |
| Ar-3 | Ar-1 | Ar-5 | Ar-6 |
| Ar-3 | Ar-1 | Ar-6 | Ar-3 |
| Ar-3 | Ar-1 | Ar-6 | Ar-4 |
| Ar-3 | Ar-1 | Ar-6 | Ar-5 |
| Ar-3 | Ar-1 | Ar-6 | Ar-6 |
| Ar-3 | Ar-2 | Ar-1 | Ar-4 |
| Ar-3 | Ar-2 | Ar-1 | Ar-5 |
| Ar-3 | Ar-2 | Ar-1 | Ar-6 |
| Ar-3 | Ar-2 | Ar-2 | Ar-3 |
| Ar-3 | Ar-2 | Ar-2 | Ar-4 |
| Ar-3 | Ar-2 | Ar-2 | Ar-5 |
| Ar-3 | Ar-2 | Ar-2 | Ar-6 |
| Ar-3 | Ar-2 | Ar-3 | Ar-3 |
| Ar-3 | Ar-2 | Ar-3 | Ar-4 |
| Ar-3 | Ar-2 | Ar-3 | Ar-5 |
| Ar-3 | Ar-2 | Ar-3 | Ar-6 |
| Ar-3 | Ar-2 | Ar-4 | Ar-3 |
| Ar-3 | Ar-2 | Ar-4 | Ar-4 |
| Ar-3 | Ar-2 | Ar-4 | Ar-5 |
| Ar-3 | Ar-2 | Ar-4 | Ar-6 |
| Ar-3 | Ar-2 | Ar-5 | Ar-3 |
| Ar-3 | Ar-2 | Ar-5 | Ar-4 |
| Ar-3 | Ar-2 | Ar-5 | Ar-5 |
| Ar-3 | Ar-2 | Ar-5 | Ar-6 |
| Ar-3 | Ar-2 | Ar-6 | Ar-3 |
| Ar-3 | Ar-2 | Ar-6 | Ar-4 |
| Ar-3 | Ar-2 | Ar-6 | Ar-5 |
| Ar-3 | Ar-2 | Ar-6 | Ar-6 |
| Ar-3 | Ar-3 | Ar-1 | Ar-4 |
| Ar-3 | Ar-3 | Ar-1 | Ar-5 |
| Ar-3 | Ar-3 | Ar-1 | Ar-6 |
| Ar-3 | Ar-3 | Ar-2 | Ar-4 |
| Ar-3 | Ar-3 | Ar-2 | Ar-5 |

TABLE 1-7-continued

| R1 | R3 | R4 | R6 |
|---|---|---|---|
| Ar-3 | Ar-3 | Ar-2 | Ar-6 |
| Ar-3 | Ar-3 | Ar-3 | Ar-3 |
| Ar-3 | Ar-3 | Ar-3 | Ar-4 |
| Ar-3 | Ar-3 | Ar-3 | Ar-5 |

TABLE 1-8

| R1 | R3 | R4 | R6 |
|---|---|---|---|
| Ar-3 | Ar-3 | Ar-3 | Ar-6 |
| Ar-3 | Ar-3 | Ar-4 | Ar-3 |
| Ar-3 | Ar-3 | Ar-4 | Ar-4 |
| Ar-3 | Ar-3 | Ar-4 | Ar-5 |
| Ar-3 | Ar-3 | Ar-4 | Ar-6 |
| Ar-3 | Ar-3 | Ar-5 | Ar-3 |
| Ar-3 | Ar-3 | Ar-5 | Ar-4 |
| Ar-3 | Ar-3 | Ar-5 | Ar-5 |
| Ar-3 | Ar-3 | Ar-5 | Ar-6 |
| Ar-3 | Ar-3 | Ar-6 | Ar-3 |
| Ar-3 | Ar-3 | Ar-6 | Ar-4 |
| Ar-3 | Ar-3 | Ar-6 | Ar-5 |
| Ar-3 | Ar-3 | Ar-6 | Ar-6 |
| Ar-3 | Ar-4 | Ar-1 | Ar-4 |
| Ar-3 | Ar-4 | Ar-1 | Ar-5 |
| Ar-3 | Ar-4 | Ar-1 | Ar-6 |
| Ar-3 | Ar-4 | Ar-2 | Ar-4 |
| Ar-3 | Ar-4 | Ar-2 | Ar-5 |
| Ar-3 | Ar-4 | Ar-2 | Ar-6 |
| Ar-3 | Ar-4 | Ar-3 | Ar-4 |
| Ar-3 | Ar-4 | Ar-3 | Ar-5 |
| Ar-3 | Ar-4 | Ar-3 | Ar-6 |
| Ar-3 | Ar-4 | Ar-4 | Ar-3 |
| Ar-3 | Ar-4 | Ar-4 | Ar-4 |
| Ar-3 | Ar-4 | Ar-4 | Ar-5 |
| Ar-3 | Ar-4 | Ar-4 | Ar-6 |
| Ar-3 | Ar-4 | Ar-5 | Ar-3 |
| Ar-3 | Ar-4 | Ar-5 | Ar-4 |
| Ar-3 | Ar-4 | Ar-5 | Ar-5 |
| Ar-3 | Ar-4 | Ar-5 | Ar-6 |
| Ar-3 | Ar-4 | Ar-6 | Ar-3 |
| Ar-3 | Ar-4 | Ar-6 | Ar-4 |
| Ar-3 | Ar-4 | Ar-6 | Ar-5 |
| Ar-3 | Ar-4 | Ar-6 | Ar-6 |
| Ar-3 | Ar-5 | Ar-1 | Ar-4 |
| Ar-3 | Ar-5 | Ar-1 | Ar-5 |
| Ar-3 | Ar-5 | Ar-1 | Ar-6 |
| Ar-3 | Ar-5 | Ar-2 | Ar-4 |
| Ar-3 | Ar-5 | Ar-2 | Ar-5 |
| Ar-3 | Ar-5 | Ar-2 | Ar-6 |
| Ar-3 | Ar-5 | Ar-3 | Ar-4 |
| Ar-3 | Ar-5 | Ar-3 | Ar-5 |
| Ar-3 | Ar-5 | Ar-3 | Ar-6 |
| Ar-3 | Ar-5 | Ar-4 | Ar-4 |
| Ar-3 | Ar-5 | Ar-4 | Ar-5 |
| Ar-3 | Ar-5 | Ar-4 | Ar-6 |
| Ar-3 | Ar-5 | Ar-5 | Ar-3 |
| Ar-3 | Ar-5 | Ar-5 | Ar-4 |
| Ar-3 | Ar-5 | Ar-5 | Ar-5 |
| Ar-3 | Ar-5 | Ar-5 | Ar-6 |
| Ar-3 | Ar-5 | Ar-6 | Ar-3 |
| Ar-3 | Ar-5 | Ar-6 | Ar-4 |
| Ar-3 | Ar-5 | Ar-6 | Ar-5 |
| Ar-3 | Ar-5 | Ar-6 | Ar-6 |
| Ar-3 | Ar-6 | Ar-1 | Ar-4 |
| Ar-3 | Ar-6 | Ar-1 | Ar-5 |
| Ar-3 | Ar-6 | Ar-1 | Ar-6 |
| Ar-3 | Ar-6 | Ar-2 | Ar-4 |
| Ar-3 | Ar-6 | Ar-2 | Ar-5 |
| Ar-3 | Ar-6 | Ar-2 | Ar-6 |

TABLE 1-9

| R1 | R3 | R4 | R6 |
|---|---|---|---|
| Ar-3 | Ar-6 | Ar-3 | Ar-4 |
| Ar-3 | Ar-6 | Ar-3 | Ar-5 |
| Ar-3 | Ar-6 | Ar-3 | Ar-6 |
| Ar-3 | Ar-6 | Ar-4 | Ar-4 |
| Ar-3 | Ar-6 | Ar-4 | Ar-5 |
| Ar-3 | Ar-6 | Ar-4 | Ar-6 |
| Ar-3 | Ar-6 | Ar-5 | Ar-4 |
| Ar-3 | Ar-6 | Ar-5 | Ar-5 |
| Ar-3 | Ar-6 | Ar-5 | Ar-6 |
| Ar-3 | Ar-6 | Ar-6 | Ar-3 |
| Ar-3 | Ar-6 | Ar-6 | Ar-4 |
| Ar-3 | Ar-6 | Ar-6 | Ar-5 |
| Ar-3 | Ar-6 | Ar-6 | Ar-6 |
| Ar-4 | Ar-1 | Ar-1 | Ar-4 |
| Ar-4 | Ar-1 | Ar-1 | Ar-5 |
| Ar-4 | Ar-1 | Ar-1 | Ar-6 |
| Ar-4 | Ar-1 | Ar-2 | Ar-4 |
| Ar-4 | Ar-1 | Ar-2 | Ar-5 |
| Ar-4 | Ar-1 | Ar-2 | Ar-6 |
| Ar-4 | Ar-1 | Ar-3 | Ar-4 |
| Ar-4 | Ar-1 | Ar-3 | Ar-5 |
| Ar-4 | Ar-1 | Ar-3 | Ar-6 |
| Ar-4 | Ar-1 | Ar-4 | Ar-4 |
| Ar-4 | Ar-1 | Ar-4 | Ar-5 |
| Ar-4 | Ar-1 | Ar-4 | Ar-6 |
| Ar-4 | Ar-1 | Ar-5 | Ar-4 |
| Ar-4 | Ar-1 | Ar-5 | Ar-5 |
| Ar-4 | Ar-1 | Ar-5 | Ar-6 |
| Ar-4 | Ar-1 | Ar-6 | Ar-4 |
| Ar-4 | Ar-1 | Ar-6 | Ar-5 |
| Ar-4 | Ar-1 | Ar-6 | Ar-6 |
| Ar-4 | Ar-2 | Ar-1 | Ar-5 |
| Ar-4 | Ar-2 | Ar-1 | Ar-6 |
| Ar-4 | Ar-2 | Ar-2 | Ar-4 |
| Ar-4 | Ar-2 | Ar-2 | Ar-5 |
| Ar-4 | Ar-2 | Ar-2 | Ar-6 |
| Ar-4 | Ar-2 | Ar-3 | Ar-4 |
| Ar-4 | Ar-2 | Ar-3 | Ar-5 |
| Ar-4 | Ar-2 | Ar-3 | Ar-6 |
| Ar-4 | Ar-2 | Ar-4 | Ar-4 |
| Ar-4 | Ar-2 | Ar-4 | Ar-5 |
| Ar-4 | Ar-2 | Ar-4 | Ar-6 |
| Ar-4 | Ar-2 | Ar-5 | Ar-4 |
| Ar-4 | Ar-2 | Ar-5 | Ar-5 |
| Ar-4 | Ar-2 | Ar-5 | Ar-6 |
| Ar-4 | Ar-2 | Ar-6 | Ar-4 |
| Ar-4 | Ar-2 | Ar-6 | Ar-5 |
| Ar-4 | Ar-2 | Ar-6 | Ar-6 |
| Ar-4 | Ar-3 | Ar-1 | Ar-5 |
| Ar-4 | Ar-3 | Ar-1 | Ar-6 |
| Ar-4 | Ar-3 | Ar-2 | Ar-5 |
| Ar-4 | Ar-3 | Ar-2 | Ar-6 |
| Ar-4 | Ar-3 | Ar-3 | Ar-4 |
| Ar-4 | Ar-3 | Ar-3 | Ar-5 |
| Ar-4 | Ar-3 | Ar-3 | Ar-6 |
| Ar-4 | Ar-3 | Ar-4 | Ar-4 |
| Ar-4 | Ar-3 | Ar-4 | Ar-5 |
| Ar-4 | Ar-3 | Ar-4 | Ar-6 |
| Ar-4 | Ar-3 | Ar-5 | Ar-4 |
| Ar-4 | Ar-3 | Ar-5 | Ar-5 |
| Ar-4 | Ar-3 | Ar-5 | Ar-6 |

TABLE 1-10

| R1 | R3 | R4 | R6 |
|---|---|---|---|
| Ar-4 | Ar-3 | Ar-6 | Ar-4 |
| Ar-4 | Ar-3 | Ar-6 | Ar-5 |
| Ar-4 | Ar-3 | Ar-6 | Ar-6 |
| Ar-4 | Ar-4 | Ar-1 | Ar-5 |
| Ar-4 | Ar-4 | Ar-1 | Ar-6 |
| Ar-4 | Ar-4 | Ar-2 | Ar-5 |
| Ar-4 | Ar-4 | Ar-2 | Ar-6 |
| Ar-4 | Ar-4 | Ar-3 | Ar-5 |
| Ar-4 | Ar-4 | Ar-3 | Ar-6 |
| Ar-4 | Ar-4 | Ar-4 | Ar-4 |
| Ar-4 | Ar-4 | Ar-4 | Ar-5 |
| Ar-4 | Ar-4 | Ar-4 | Ar-6 |
| Ar-4 | Ar-4 | Ar-5 | Ar-4 |
| Ar-4 | Ar-4 | Ar-5 | Ar-5 |
| Ar-4 | Ar-4 | Ar-5 | Ar-6 |
| Ar-4 | Ar-4 | Ar-6 | Ar-4 |
| Ar-4 | Ar-4 | Ar-6 | Ar-5 |
| Ar-4 | Ar-4 | Ar-6 | Ar-6 |
| Ar-4 | Ar-5 | Ar-1 | Ar-5 |
| Ar-4 | Ar-5 | Ar-1 | Ar-6 |
| Ar-4 | Ar-5 | Ar-2 | Ar-5 |
| Ar-4 | Ar-5 | Ar-2 | Ar-6 |
| Ar-4 | Ar-5 | Ar-3 | Ar-5 |
| Ar-4 | Ar-5 | Ar-3 | Ar-6 |
| Ar-4 | Ar-5 | Ar-4 | Ar-5 |
| Ar-4 | Ar-5 | Ar-4 | Ar-6 |
| Ar-4 | Ar-5 | Ar-5 | Ar-4 |
| Ar-4 | Ar-5 | Ar-5 | Ar-5 |
| Ar-4 | Ar-5 | Ar-5 | Ar-6 |
| Ar-4 | Ar-5 | Ar-6 | Ar-4 |
| Ar-4 | Ar-5 | Ar-6 | Ar-5 |
| Ar-4 | Ar-5 | Ar-6 | Ar-6 |
| Ar-4 | Ar-6 | Ar-1 | Ar-5 |
| Ar-4 | Ar-6 | Ar-1 | Ar-6 |
| Ar-4 | Ar-6 | Ar-2 | Ar-5 |
| Ar-4 | Ar-6 | Ar-2 | Ar-6 |
| Ar-4 | Ar-6 | Ar-3 | Ar-5 |
| Ar-4 | Ar-6 | Ar-3 | Ar-6 |
| Ar-4 | Ar-6 | Ar-4 | Ar-5 |
| Ar-4 | Ar-6 | Ar-4 | Ar-6 |
| Ar-4 | Ar-6 | Ar-5 | Ar-5 |
| Ar-4 | Ar-6 | Ar-5 | Ar-6 |
| Ar-4 | Ar-6 | Ar-6 | Ar-4 |
| Ar-4 | Ar-6 | Ar-6 | Ar-5 |
| Ar-4 | Ar-6 | Ar-6 | Ar-6 |
| Ar-5 | Ar-1 | Ar-1 | Ar-5 |
| Ar-5 | Ar-1 | Ar-1 | Ar-6 |
| Ar-5 | Ar-1 | Ar-2 | Ar-5 |
| Ar-5 | Ar-1 | Ar-2 | Ar-6 |
| Ar-5 | Ar-1 | Ar-3 | Ar-5 |
| Ar-5 | Ar-1 | Ar-3 | Ar-6 |
| Ar-5 | Ar-1 | Ar-4 | Ar-5 |
| Ar-5 | Ar-1 | Ar-4 | Ar-6 |
| Ar-5 | Ar-1 | Ar-5 | Ar-5 |
| Ar-5 | Ar-1 | Ar-5 | Ar-6 |
| Ar-5 | Ar-1 | Ar-6 | Ar-5 |
| Ar-5 | Ar-1 | Ar-6 | Ar-6 |
| Ar-5 | Ar-2 | Ar-1 | Ar-6 |
| Ar-5 | Ar-2 | Ar-2 | Ar-5 |
| Ar-5 | Ar-2 | Ar-2 | Ar-6 |
| Ar-5 | Ar-2 | Ar-3 | Ar-5 |
| Ar-5 | Ar-2 | Ar-3 | Ar-6 |

TABLE 1-11

| R1 | R3 | R4 | R6 |
|---|---|---|---|
| Ar-5 | Ar-2 | Ar-4 | Ar-5 |
| Ar-5 | Ar-2 | Ar-4 | Ar-6 |
| Ar-5 | Ar-2 | Ar-5 | Ar-5 |
| Ar-5 | Ar-2 | Ar-5 | Ar-6 |
| Ar-5 | Ar-2 | Ar-6 | Ar-5 |
| Ar-5 | Ar-2 | Ar-6 | Ar-6 |
| Ar-5 | Ar-3 | Ar-1 | Ar-6 |
| Ar-5 | Ar-3 | Ar-2 | Ar-6 |
| Ar-5 | Ar-3 | Ar-3 | Ar-5 |
| Ar-5 | Ar-3 | Ar-3 | Ar-6 |
| Ar-5 | Ar-3 | Ar-4 | Ar-5 |
| Ar-5 | Ar-3 | Ar-4 | Ar-6 |
| Ar-5 | Ar-3 | Ar-5 | Ar-5 |
| Ar-5 | Ar-3 | Ar-5 | Ar-6 |
| Ar-5 | Ar-3 | Ar-6 | Ar-5 |
| Ar-5 | Ar-3 | Ar-6 | Ar-6 |
| Ar-5 | Ar-4 | Ar-1 | Ar-6 |

TABLE 1-11-continued

| R1 | R3 | R4 | R6 |
|---|---|---|---|
| Ar-5 | Ar-4 | Ar-2 | Ar-6 |
| Ar-5 | Ar-4 | Ar-3 | Ar-6 |
| Ar-5 | Ar-4 | Ar-4 | Ar-5 |
| Ar-5 | Ar-4 | Ar-4 | Ar-6 |
| Ar-5 | Ar-4 | Ar-5 | Ar-5 |
| Ar-5 | Ar-4 | Ar-5 | Ar-6 |
| Ar-5 | Ar-4 | Ar-6 | Ar-5 |
| Ar-5 | Ar-4 | Ar-6 | Ar-6 |
| Ar-5 | Ar-5 | Ar-1 | Ar-6 |
| Ar-5 | Ar-5 | Ar-2 | Ar-6 |
| Ar-5 | Ar-5 | Ar-3 | Ar-6 |
| Ar-5 | Ar-5 | Ar-4 | Ar-6 |
| Ar-5 | Ar-5 | Ar-5 | Ar-5 |
| Ar-5 | Ar-5 | Ar-5 | Ar-6 |
| Ar-5 | Ar-5 | Ar-6 | Ar-5 |
| Ar-5 | Ar-5 | Ar-6 | Ar-6 |
| Ar-5 | Ar-6 | Ar-1 | Ar-6 |
| Ar-5 | Ar-6 | Ar-2 | Ar-6 |
| Ar-5 | Ar-6 | Ar-3 | Ar-6 |
| Ar-5 | Ar-6 | Ar-4 | Ar-6 |
| Ar-5 | Ar-6 | Ar-5 | Ar-6 |
| Ar-5 | Ar-6 | Ar-6 | Ar-5 |
| Ar-5 | Ar-6 | Ar-6 | Ar-6 |
| Ar-6 | Ar-1 | Ar-1 | Ar-6 |
| Ar-6 | Ar-1 | Ar-2 | Ar-6 |
| Ar-6 | Ar-1 | Ar-3 | Ar-6 |
| Ar-6 | Ar-1 | Ar-4 | Ar-6 |
| Ar-6 | Ar-1 | Ar-5 | Ar-6 |
| Ar-6 | Ar-1 | Ar-6 | Ar-6 |
| Ar-6 | Ar-2 | Ar-2 | Ar-6 |
| Ar-6 | Ar-2 | Ar-3 | Ar-6 |
| Ar-6 | Ar-2 | Ar-4 | Ar-6 |
| Ar-6 | Ar-2 | Ar-5 | Ar-6 |
| Ar-6 | Ar-2 | Ar-6 | Ar-6 |
| Ar-6 | Ar-3 | Ar-3 | Ar-6 |
| Ar-6 | Ar-3 | Ar-4 | Ar-6 |
| Ar-6 | Ar-3 | Ar-5 | Ar-6 |
| Ar-6 | Ar-3 | Ar-6 | Ar-6 |
| Ar-6 | Ar-4 | Ar-4 | Ar-6 |
| Ar-6 | Ar-4 | Ar-5 | Ar-6 |
| Ar-6 | Ar-4 | Ar-6 | Ar-6 |
| Ar-6 | Ar-5 | Ar-5 | Ar-6 |
| Ar-6 | Ar-5 | Ar-6 | Ar-6 |
| Ar-6 | Ar-6 | Ar-6 | Ar-6 |

$R^2$ and $R^5$ are each preferably hydrogen, an alkyl group, a carbonyl group, an oxycarbonyl group, or an aryl group, preferably hydrogen or an alkyl group in view of thermal stability, more preferably hydrogen in view of the easiness of obtaining a narrow full width at half maximum in an emission spectrum.

$R^8$ and $R^9$ are each preferably an alkyl group, an aryl group, a heteroaryl group, fluorine, a fluorine-containing alkyl group, a fluorine-containing heteroaryl group, or a fluorine-containing aryl group, more preferably fluorine or a fluorine-containing aryl group in view of being stable against excitation light and capable of obtaining higher fluorescence quantum yield. Fluorine is still more preferable in view of the easiness of synthesis.

The fluorine-containing aryl group is an aryl group containing fluorine; examples thereof include a fluorophenyl group, a trifluoromethylphenyl group, and pentafluorophenyl group. The fluorine-containing heteroaryl group is a heteroaryl group containing fluorine; examples thereof include a fluoropyridyl group, a trifluoromethylpyridyl group, and trifluoropyridyl group. The fluorine-containing alkyl group is an alkyl group containing fluorine; examples thereof include a trifluoromethyl group and a pentafluoroethyl group.

X is preferably C—$R^7$ in view of photostability.

When X is C—$R^7$, the substituent $R^7$ has a great influence on the durability of the compound represented by General Formula (5), that is, a temporal reduction in the emission intensity. That is, when $R^7$ is hydrogen, this hydrogen has high reactivity and easily reacts with water and oxygen in the air, thus causing the compound to be decomposed. When $R^7$ is a substituent having a large degree of freedom of the motion of a molecular chain such as an alkyl group, although the reactivity indeed reduces, the compounds aggregate with the lapse of time in the composition, resulting in a reduction in emission intensity caused by concentration quenching. Thus, $R^7$ is preferably a group that is rigid, is small in the degree of freedom of motion, and is difficult to cause aggregation, and specifically preferably any of a substituted or unsubstituted aryl group and a substituted or unsubstituted heteroaryl group.

In view of giving higher fluorescence quantum yield, being more resistant to thermal decomposition, and photostability, X is preferably C—$R^7$ in which $R^7$ is a substituted or unsubstituted aryl group. In view of not impairing emission wavelength, the aryl group is preferably a phenyl group, a biphenyl group, a terphenyl group, a naphthyl group, a fluorenyl group, a phenanthryl group, or an anthracenyl group.

In addition, to increase the photostability, the twist of the carbon-carbon bond between $R^7$ and the pyrromethene skeleton is required to be appropriately reduced. An excessively large twist causes a reduction in photostability, such as an increase in reactivity against the excitation light. In view of these circumstances, $R^7$ is preferably a substituted or unsubstituted phenyl group, a substituted or unsubstituted biphenyl group, a substituted or unsubstituted terphenyl group, or a substituted or unsubstituted naphthyl group, more preferably a substituted or unsubstituted phenyl group, a substituted or unsubstituted biphenyl group, or a substituted or unsubstituted terphenyl group, and particularly preferably a substituted or unsubstituted phenyl group.

$R^7$ is preferably a moderately bulky substituent. $R^7$ has bulkiness to some extent, whereby the aggregation of molecules can be prevented, and consequently, the emission efficiency and durability further improve.

A further preferred example of the bulky substituent is the structure represented by the following General Formula (6).

[Chem. 3]

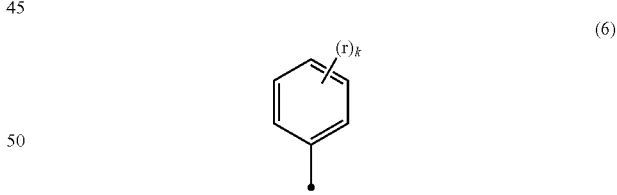

(6)

r is selected from the group consisting of hydrogen, an alkyl group, a cycloalkyl group, a heterocyclic group, an alkenyl group, a cycloalkenyl group, an alkynyl group, a hydroxy group, a thiol group, an alkoxy group, an alkylthio group, an aryl ether group, an aryl thioether group, an aryl group, a heteroaryl group, halogen, a cyano group, an aldehyde group, a carbonyl group, a carboxyl group, an oxycarbonyl group, a carbamoyl group, an amino group, a nitro group, a silyl group, a siloxanyl group, a boryl group, and a phosphine oxide group. k is an integer of 1 to 3. When k is 2 or more, r is optionally the same as or different from each other.

In view of the capability of giving higher fluorescence quantum yield, r is preferably a substituted or unsubstituted aryl group. Preferred examples of the aryl group include a phenyl group and a naphthyl group in particular. When r is an aryl group, k in General Formula (6) is preferably 1 or 2, and k is more preferably 2 in view of preventing the aggregation of molecules. In addition, at least one of rs is preferably substituted by an alkyl group. Particularly preferred examples of the alkyl group in this case include a methyl group, an ethyl group, and a tert-butyl group in view of thermal stability.

In view of controlling fluorescence wavelength and absorption wavelength and increasing compatibility with the solvent, r is preferably a substituted or unsubstituted alkyl group, a substituted or unsubstituted alkoxy group, or halogen and more preferably a methyl group, an ethyl group, a tert-butyl group, or a methoxy group. In view of dispersibility, r is particularly preferably a tert-butyl group or a methoxy group, which can prevent quenching caused by the aggregation of molecules.

As another mode of the compound represented by General Formula (5), at least one of $R^1$ to $R^7$ is preferably an electron withdrawing group. In particular, preferred is (1) at least one of $R^1$ to $R^6$ being an electron withdrawing group, (2) $R^7$ being an electron withdrawing group, or (3) at least one of $R^1$ to $R^6$ being an electron withdrawing group and $R^7$ being an electron withdrawing group. The electron withdrawing group is thus introduced to the pyrromethene skeleton, whereby the electron density of the pyrromethene skeleton can be greatly reduced. With this reduction in electron density, the stability against oxygen further improves, and the durability can be further improved.

The electron withdrawing group is called also an electron accepting group and is an atomic group that attracts an electron from a substituted atomic group by the inductive effect and/or the resonance effect in the organic electron theory. Examples of the electron withdrawing group include ones having a positive value as a substituent constant (σp (para)) of Hammett's Rule. The substituent constant (σp (para)) of Hammett's Rule can be cited from Kagaku Binran Kiso-Hen Revised 5th Edition (II, p. 380).

Although the phenyl group has an example taking a positive value, the electron withdrawing group does not include the phenyl group in the present application.

Examples of the electron withdrawing group include —F (σp: +0.20), —Cl (σp: +0.28), —Br (σp: +0.30), —I (σp: +0.30), —CO$_2$R$^{12}$ (σp: +0.45 when R$^{12}$ is an ethyl group), —CONH$_2$ (σp: +0.38), —COR$^{12}$ (σp: +0.49 when R$^{12}$ is a methyl group), —CF$_3$ (σp: +0.51), —SO$_2$R$^{12}$ (σp: +0.69 when R$^{12}$ is a methyl group), and —NO$_2$ (σp: +0.81). R$^{12}$s each independently represent a hydrogen atom, a substituted or unsubstituted aromatic hydrocarbon group with a ring-forming carbon number of 6 to 30, a substituted or unsubstituted heterocyclic group with a ring-forming carbon number of 5 to 30, a substituted or unsubstituted C1-30 alkyl group, or a substituted or unsubstituted C1-30 cycloalkyl group. Specific examples of these groups include examples similar to those described above.

Preferred examples of the electron withdrawing group include fluorine, a fluorine-containing aryl group, a fluorine-containing heteroaryl group, a fluorine-containing alkyl group, a substituted or unsubstituted acyl group, a substituted or unsubstituted ester group, a substituted or unsubstituted amide group, a substituted or unsubstituted sulfonyl group, and a cyano group. This is because they are resistant to chemical decomposition.

More preferred examples of the electron withdrawing group include a fluorine-containing alkyl group, a substituted or unsubstituted acyl group, a substituted or unsubstituted ester group, and a cyano group. This is because they prevent concentration quenching, leading to an effect of improving emission quantum yield. Particularly preferred is a substituted or unsubstituted ester group.

In view of improving the durability, it is preferable that at least one of $R^2$ and $R^5$ is independently an electron withdrawing group. Preferably, at least one of $R^2$ and $R^5$ is independently a substituted or unsubstituted ester group in particular, since the durability can be improved without decreasing the color purity. It is particularly preferable in view of the durability that particularly both $R^2$ and $R^5$ are independently substituted or unsubstituted ester groups.

In still another mode of the compound represented by General Formula (5), any m group(s) of $R^1$ to $R^7$ is/are preferably a group(s) represented by the following General Formula (7).

[Chem. 4]

(7)

M is a linking group and selected from a single bond, an alkylene group, an arylene group, and a heteroarylene group.

$R^{10}$ is independently a substituted or unsubstituted alkyl group.

m and n are each a natural number.

—OR$^{10}$ is an alkoxy group, and the bulkiness thereof can prevent quenching caused by the aggregation of molecules. m is 2 or more and 7 or less. As m, 2 or more improves the aggregation prevention effect and thus is preferable; 3 or more as m enables the whole molecule to be covered by bulky substituents, accordingly makes it possible to prevent quenching caused by the aggregation of molecules and to achieve high emission efficiency, and thus is more preferable. Still more preferably, m is 4 or more.

In General Formula (7), n is independently and preferably 1 or more and 5 or less, more preferably 1 or more and 3 or less, still more preferably 1, in view of improving the emission efficiency of the light-emitting material.

In cases where M is a group other than a single bond, the group is a spacer between the pyrromethene skeleton and —OR$^{10}$. Having a spacer between the pyrromethene skeleton and —OR$^{10}$ further prevents the aggregation of the pyrromethene skeletons, and thus, is preferable, and M is preferably selected from an alkylene group, an arylene group, and a heteroarylene group. Among these, an arylene group and a heteroarylene group, which have high rigidity, are preferable, and a phenylene group is particularly preferable because this group does not cause the twist of the carbon-carbon bond to be excessively large.

Examples of $R^{10}$ include a methyl group, an ethyl group, a n-propyl group, an isopropyl group, a n-butyl group, a sec-butyl group, a tert-butyl group, a pentyl group, a hexyl group, and the like. Without particular limitation, a methyl group is preferable in view of the easiness of synthesis.

Because the aggregation prevention effect is improved, at least two of $R^1$, $R^3$, $R^4$, and $R^6$ are preferably groups represented by General Formula (7), and at least three of $R^1$, $R^3$, $R^4$, and $R^6$ are more preferably groups represented by General Formula (7). Furthermore, all of $R^1$, $R^3$, $R^4$, and $R^6$ are particularly preferably groups represented by General Formula (7) because the whole molecule can be covered by bulky substituents.

In view of being more resistant to thermal decomposition and photostable, it is preferable that $R^7$ is a group represented by General Formula (6) or that $R^7$ is a group represented by General Formula (7).

One particularly preferred example of the compound represented by General Formula (5) is a case in which all $R^1$, $R^3$, $R^4$, and $R^6$ are independently substituted or unsubstituted alkyl groups, X is C—$R^7$, and furthermore, $R^7$ is a substituted aryl group, particularly preferably a group represented by General Formula (6).

In addition, another particularly preferred example of the compound represented by General Formula (5) is a case in which all $R^1$, $R^3$, $R^4$, and $R^6$ are independently selected from Ar-1 to Ar-6 described above, X is C—$R^7$, and furthermore, $R^7$ is a substituted aryl group, particularly preferably an aryl group substituted with a methoxy group.

The following shows examples of the compound represented by General Formula (5); this compound is not limited to these examples.

[Chem. 5]

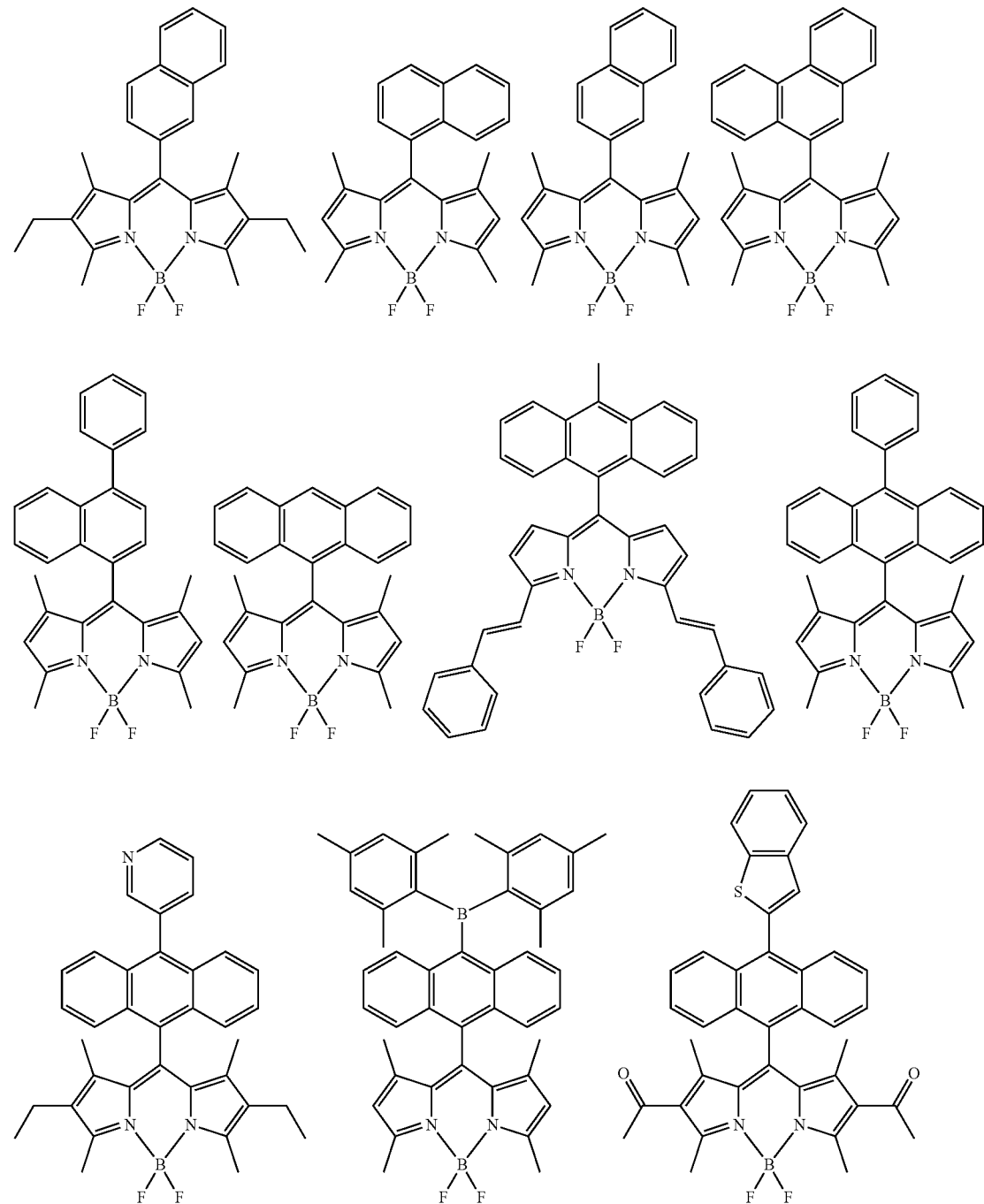

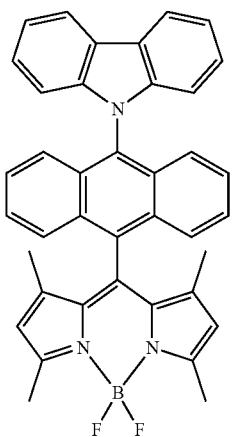
[Chem. 6]
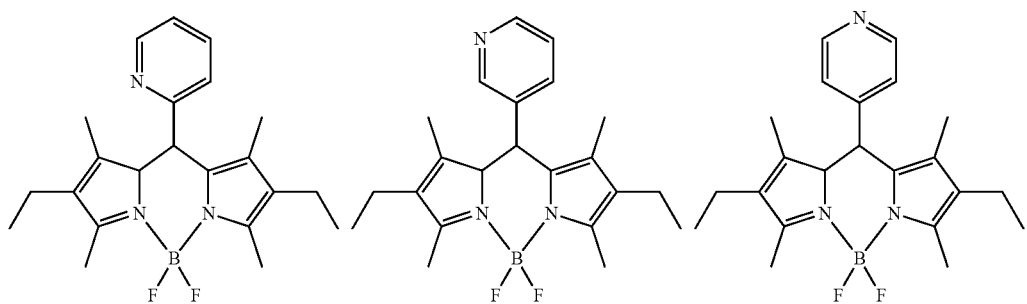
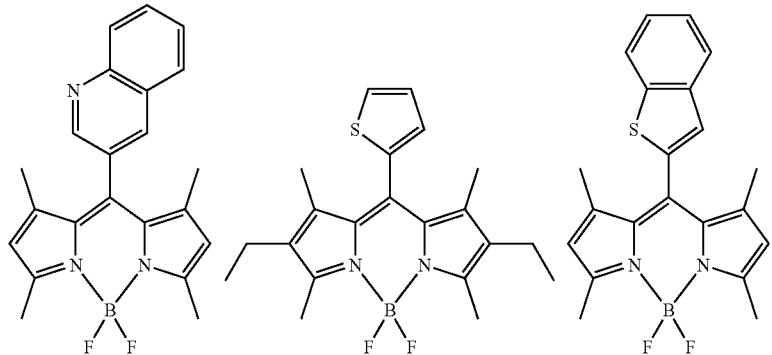
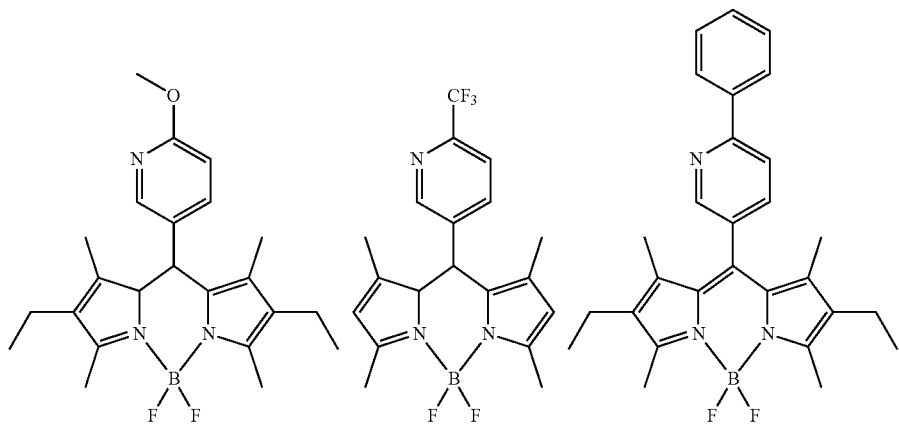

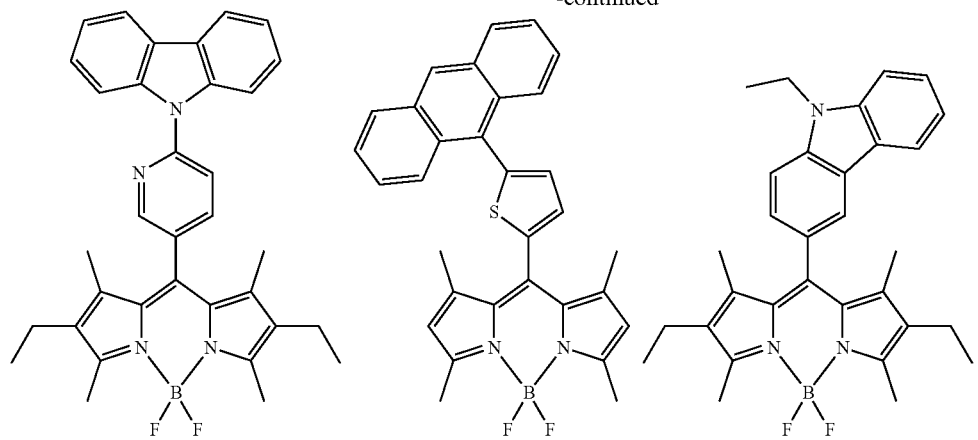
[Chem. 7]
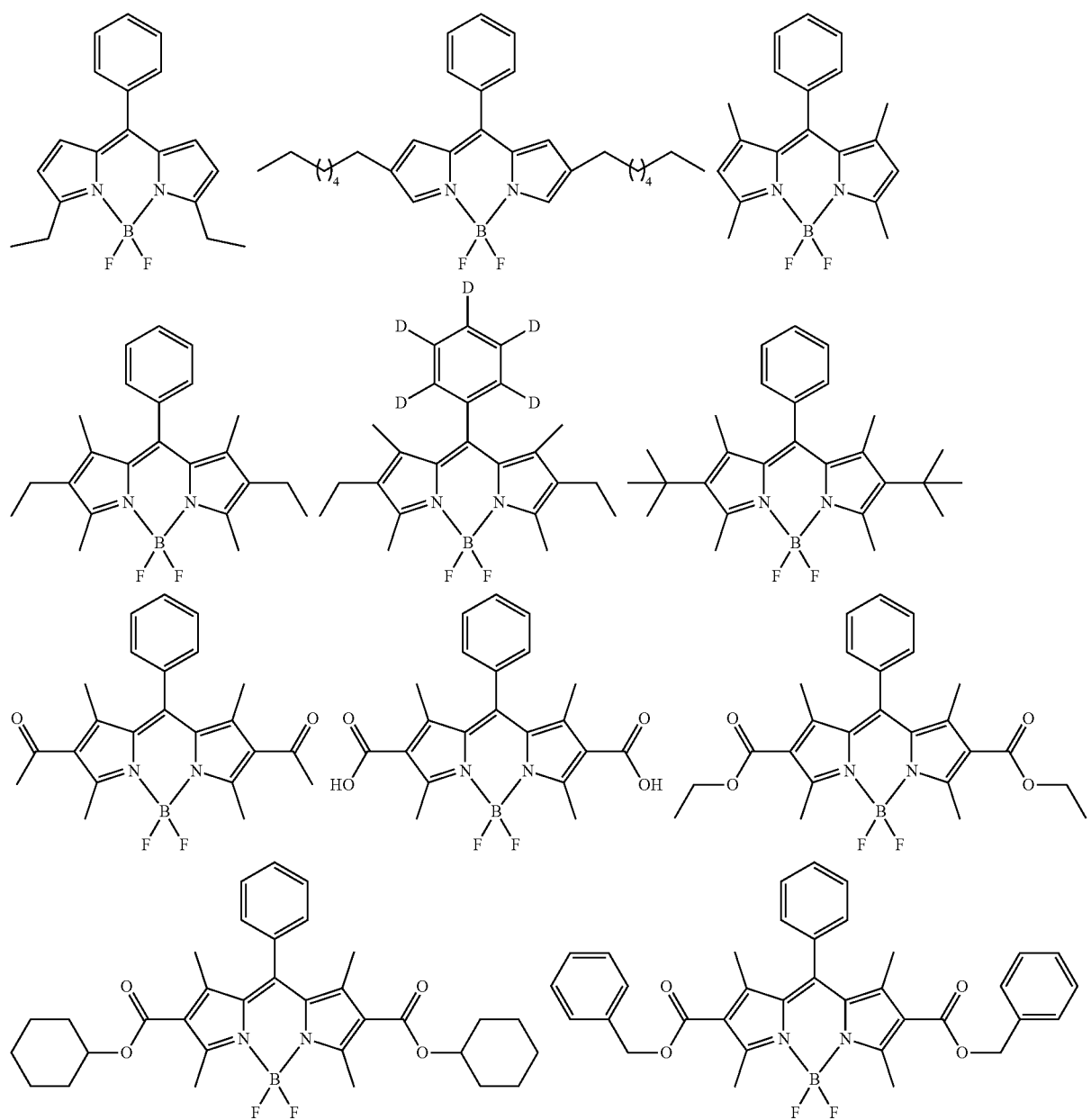

29
30
-continued
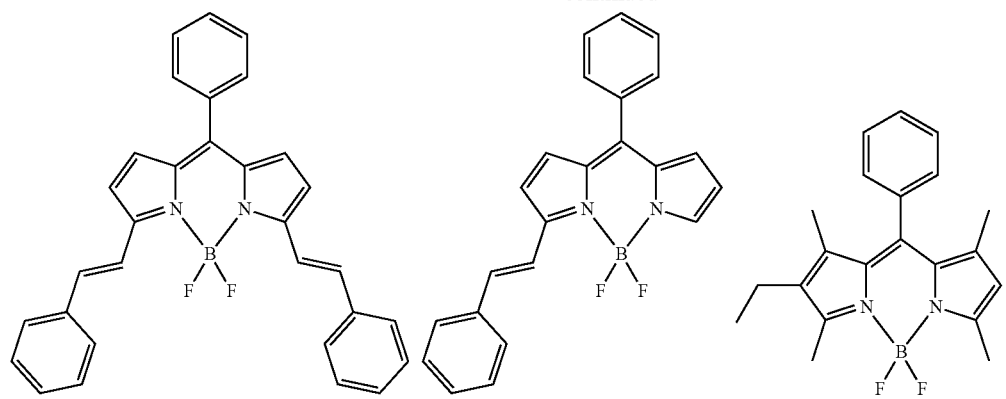
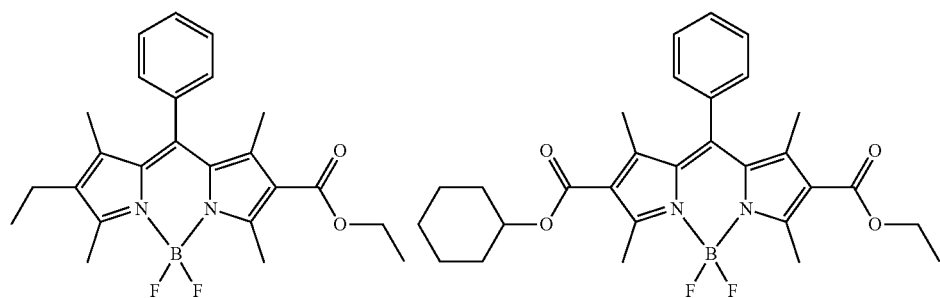
[Chem. 8]
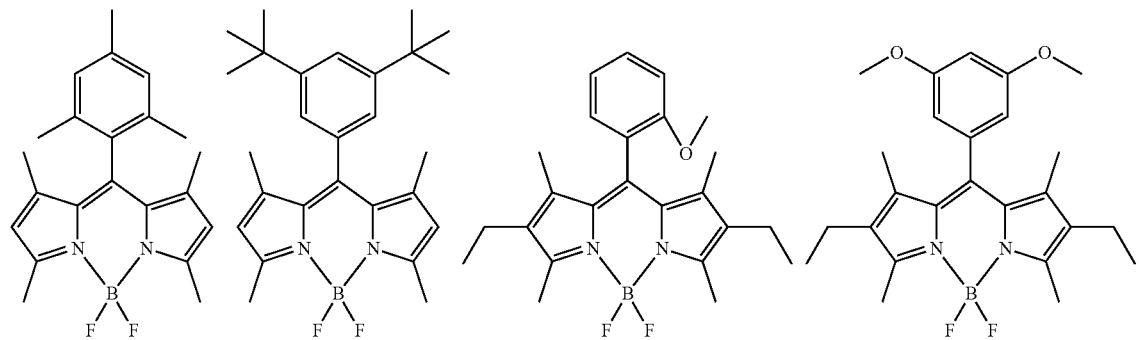
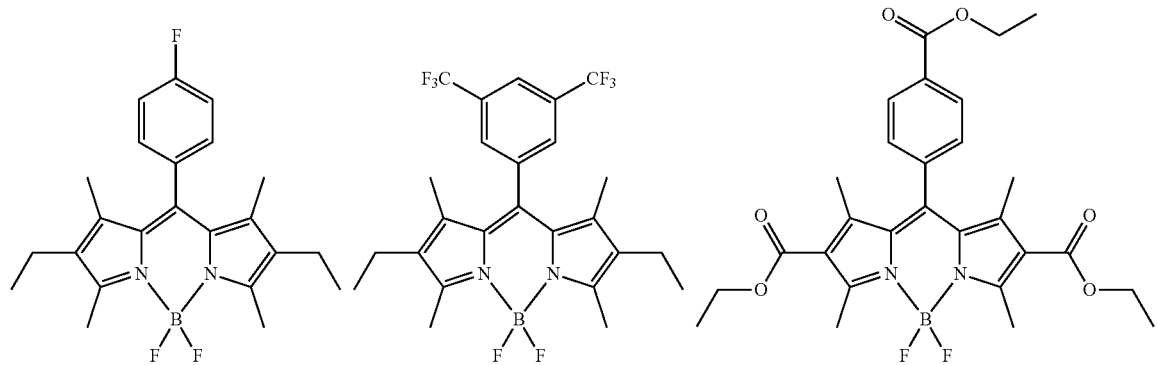

-continued
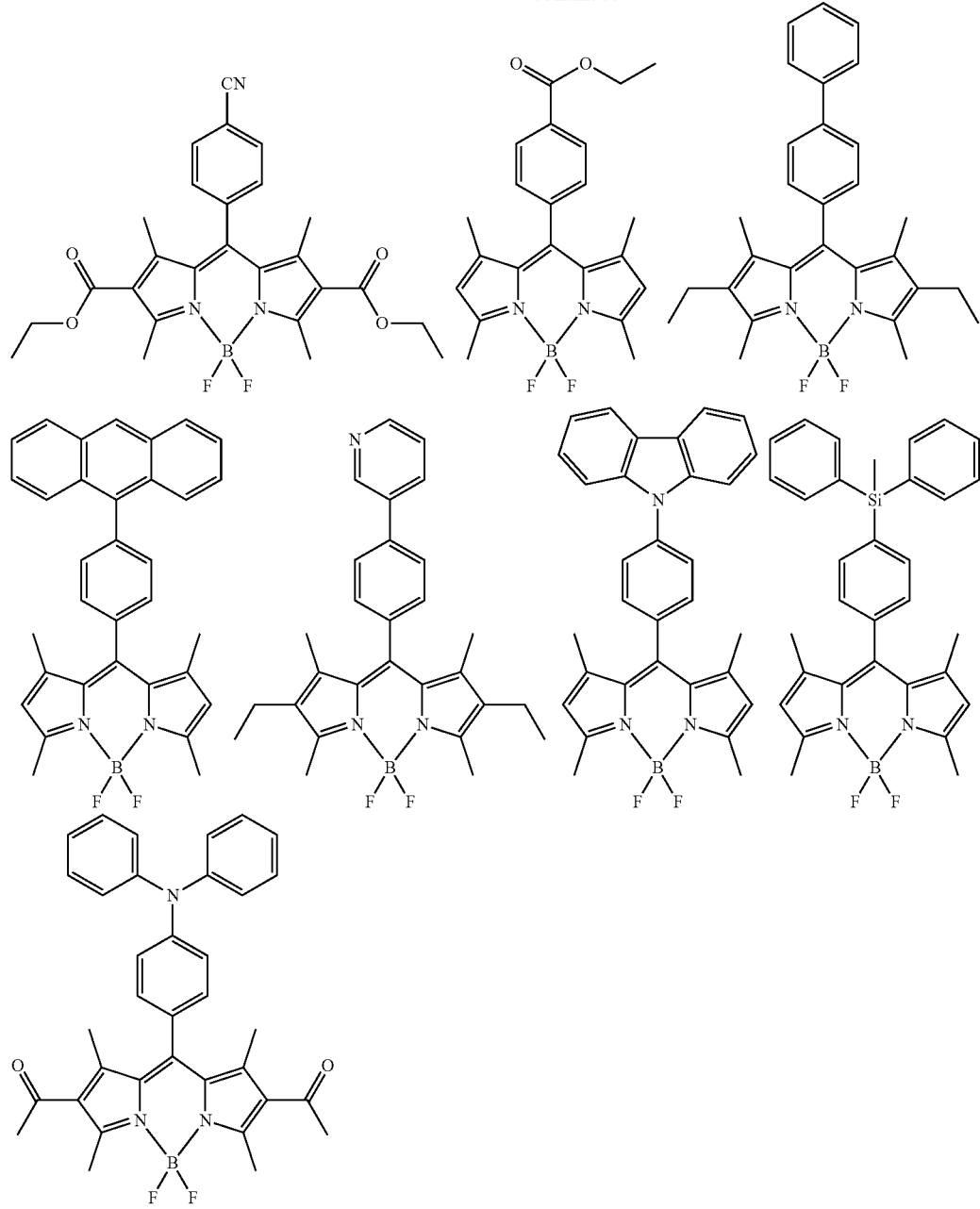
[Chem. 9]
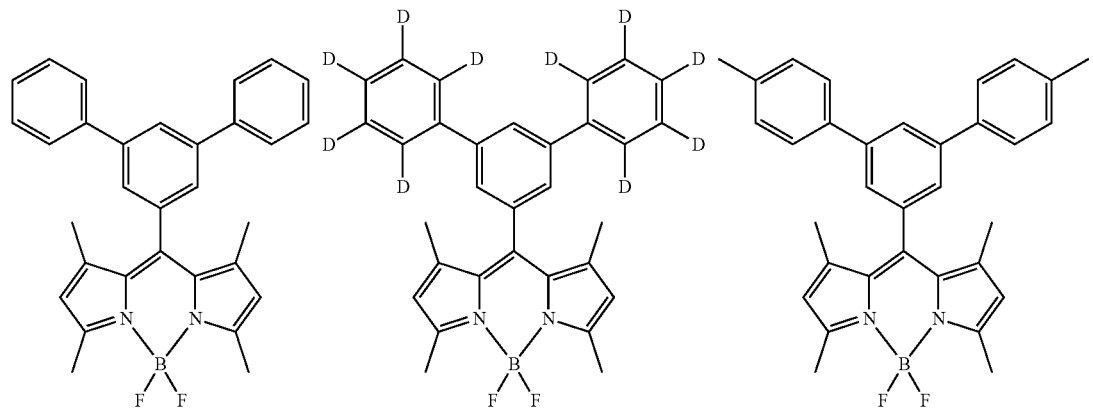

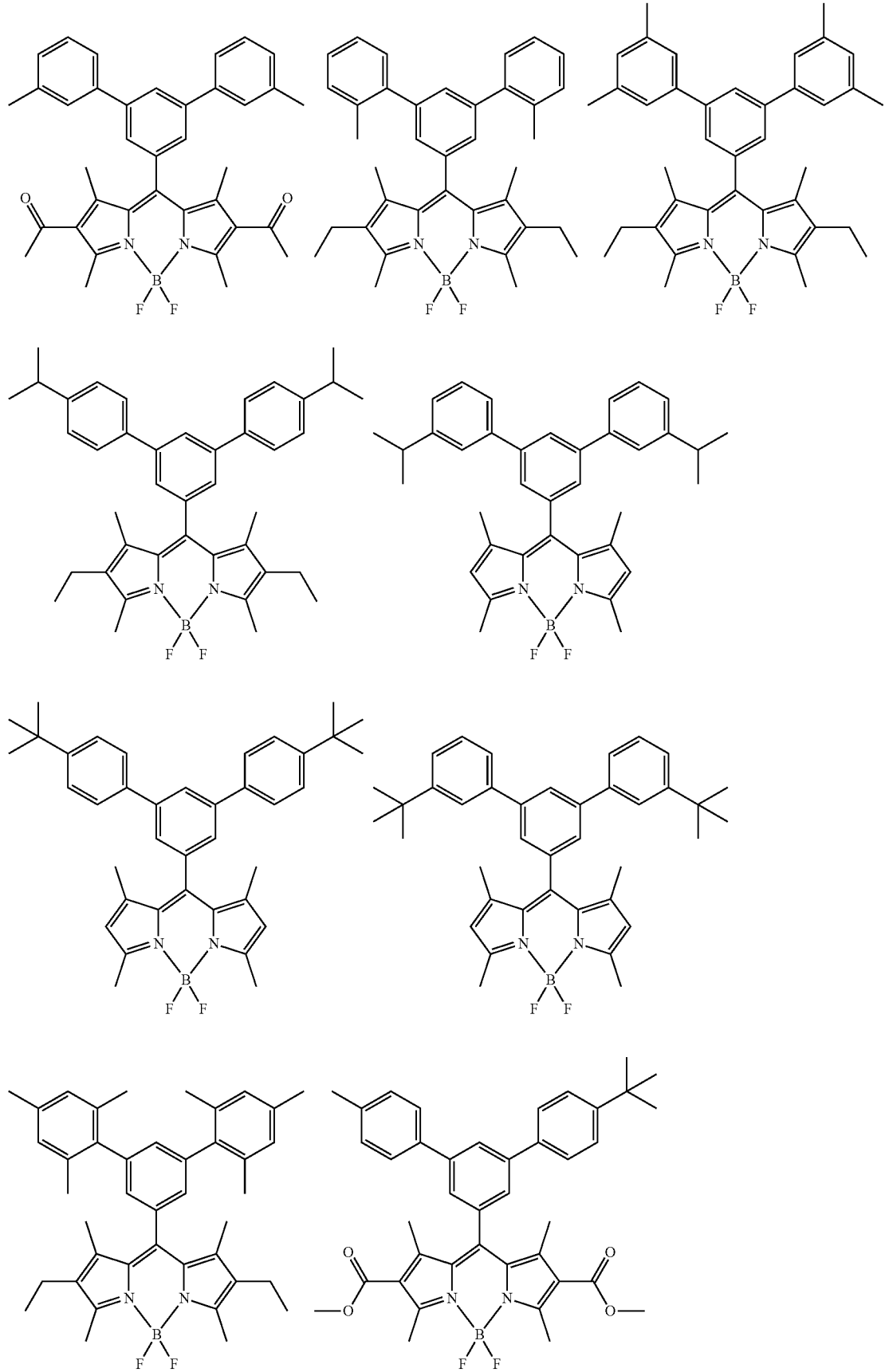

-continued
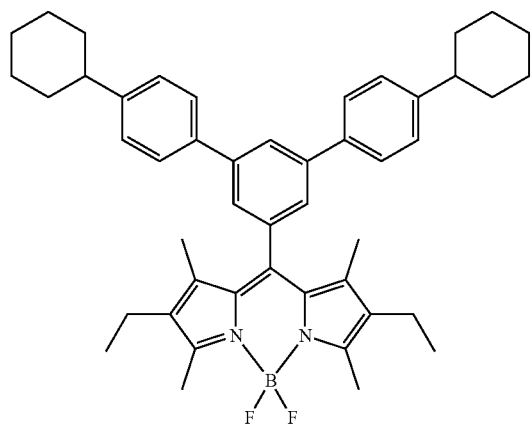
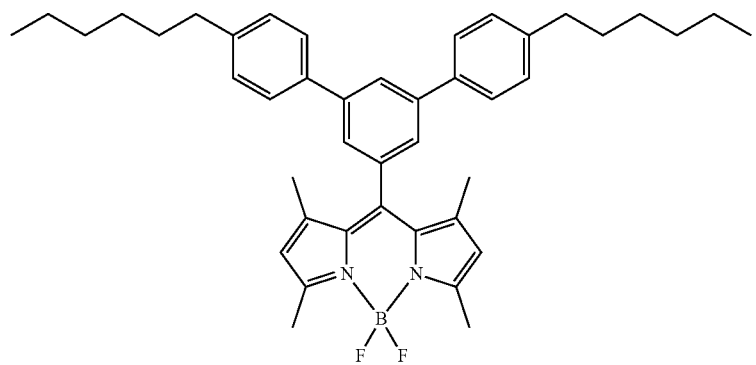
[Chem. 10]
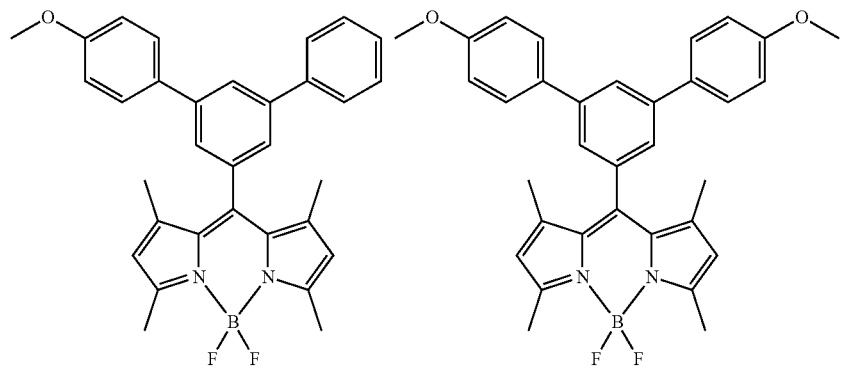
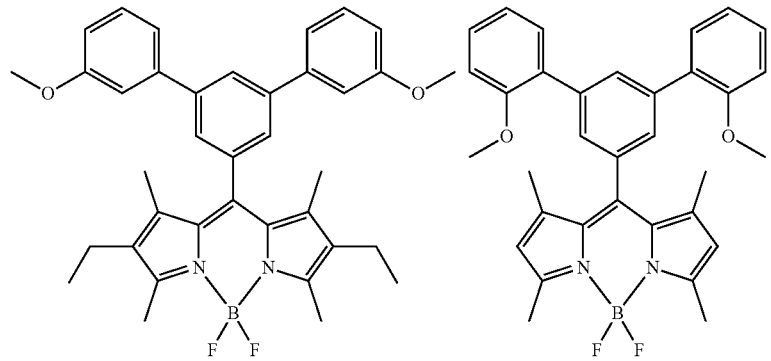

-continued
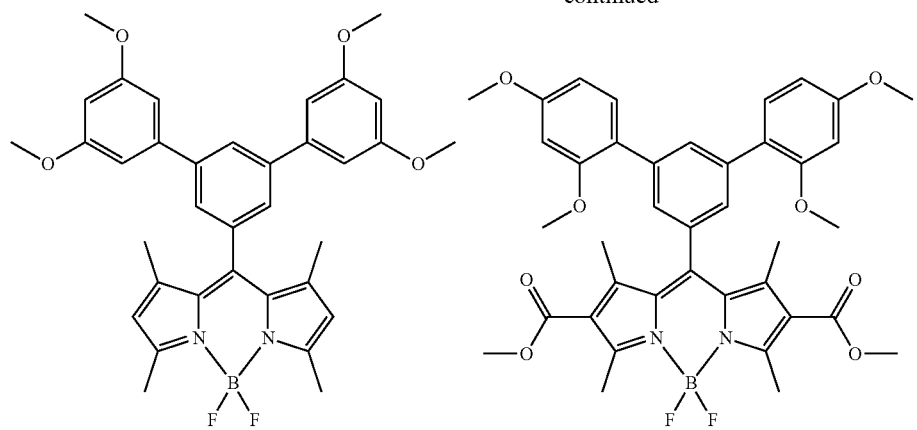
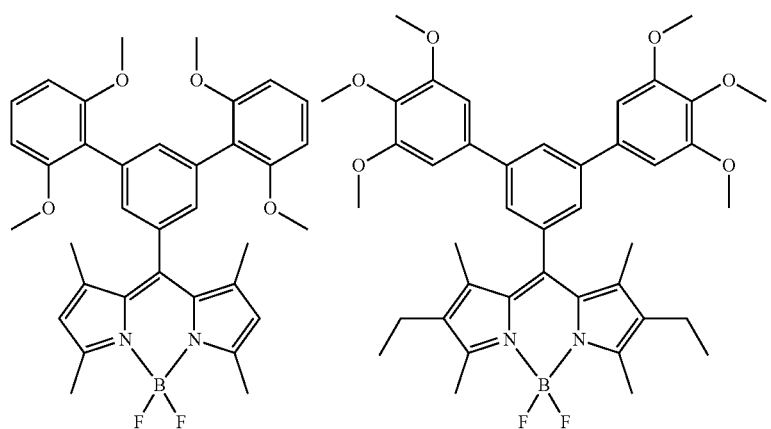
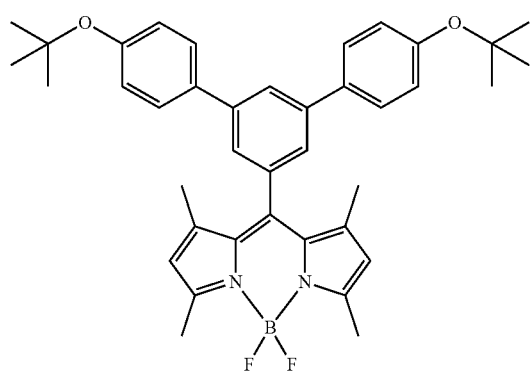
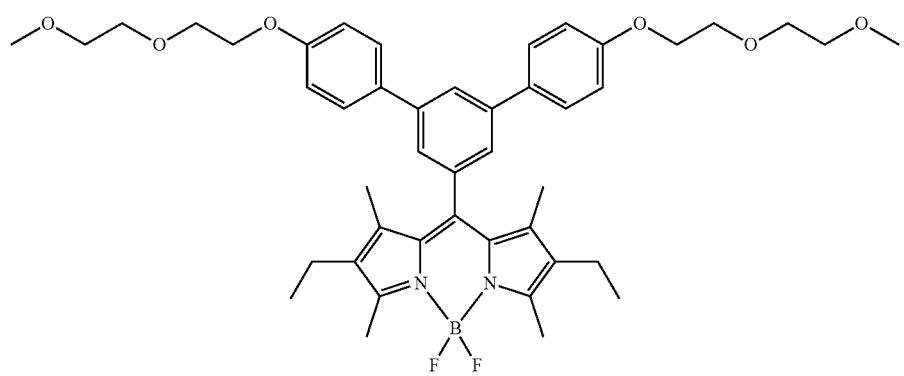

-continued
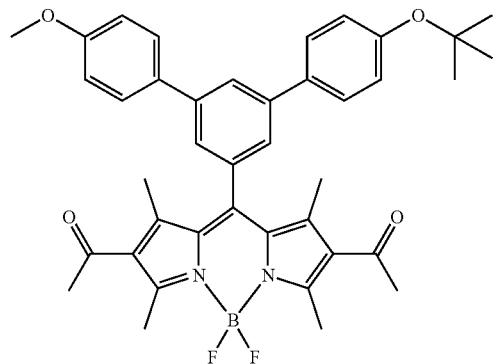
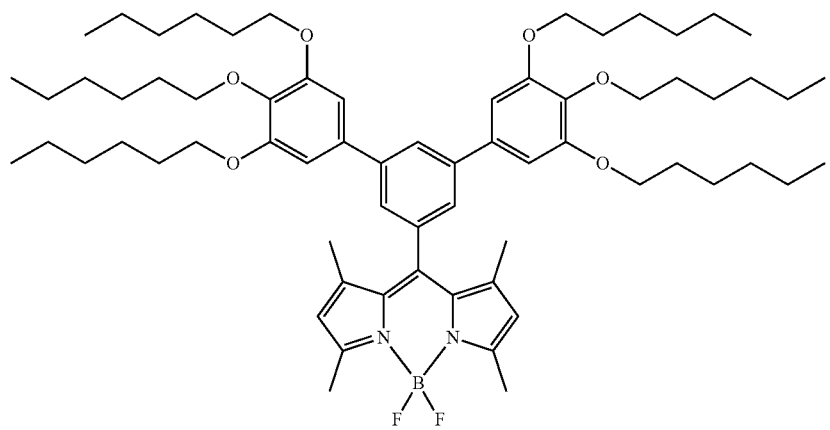
[Chem. 11]
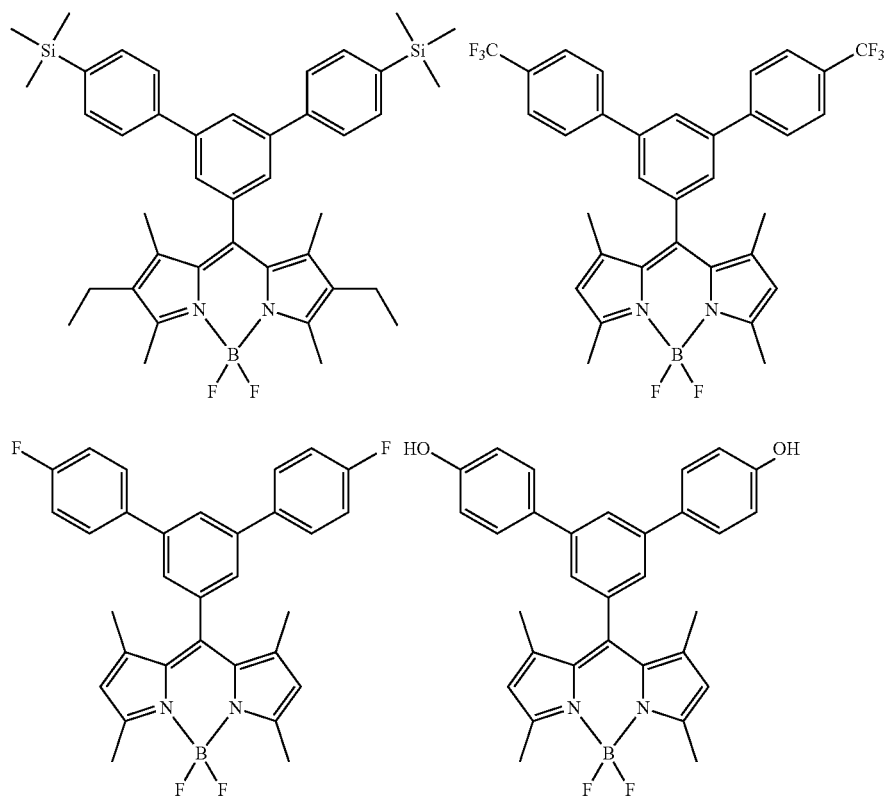

-continued
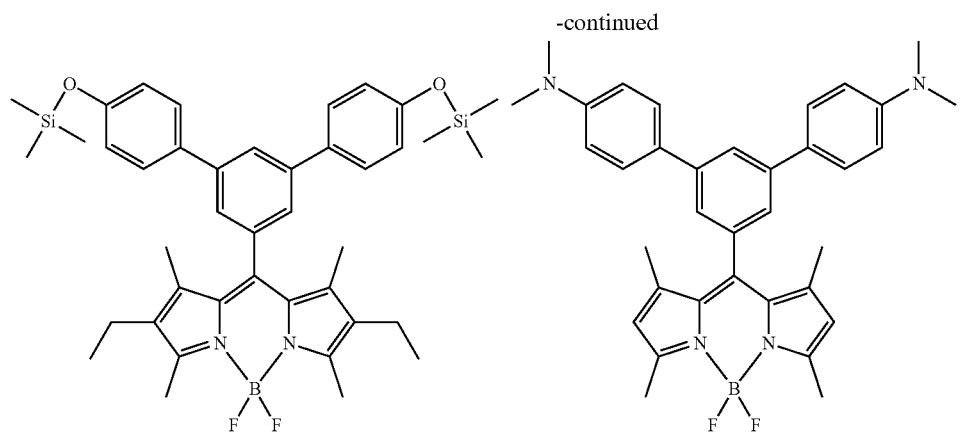
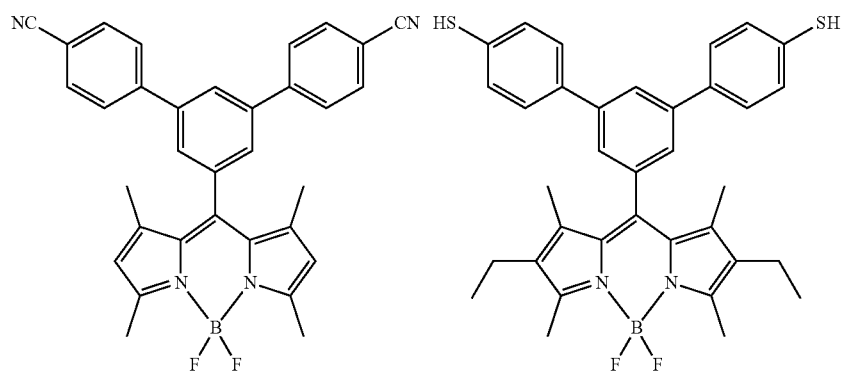
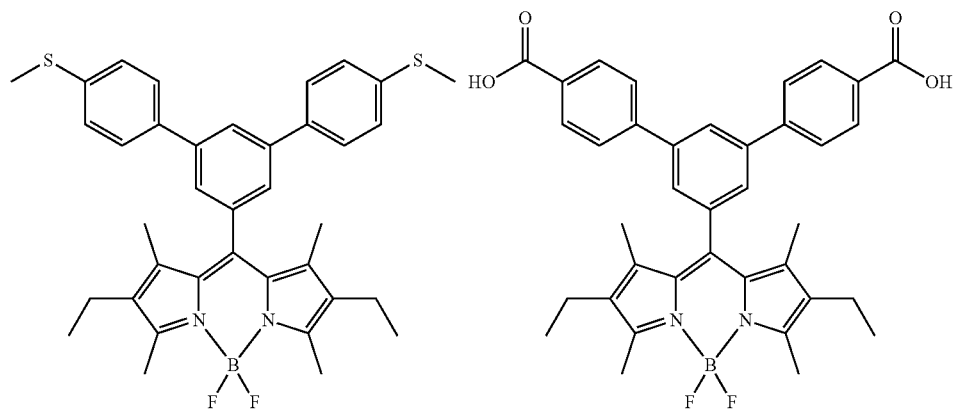
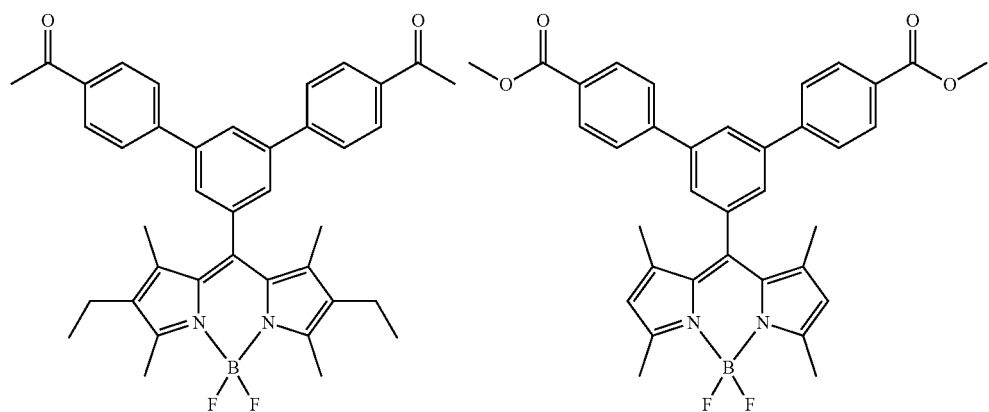

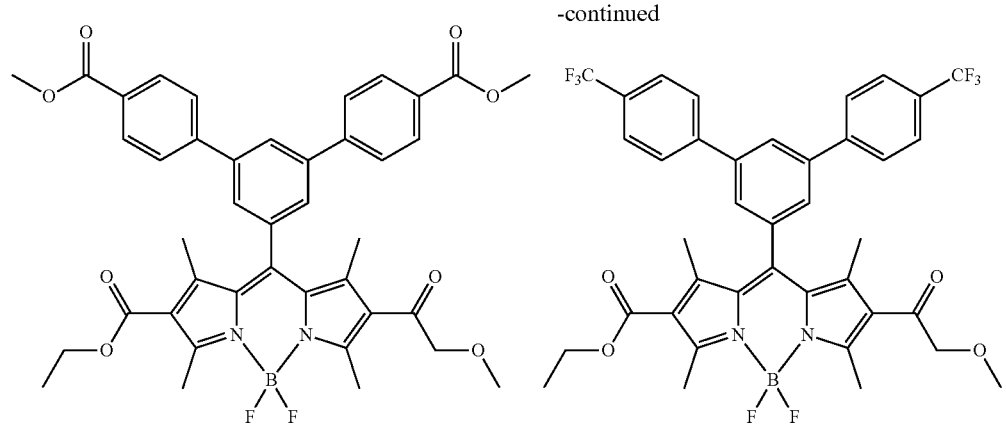
[Chem. 12]
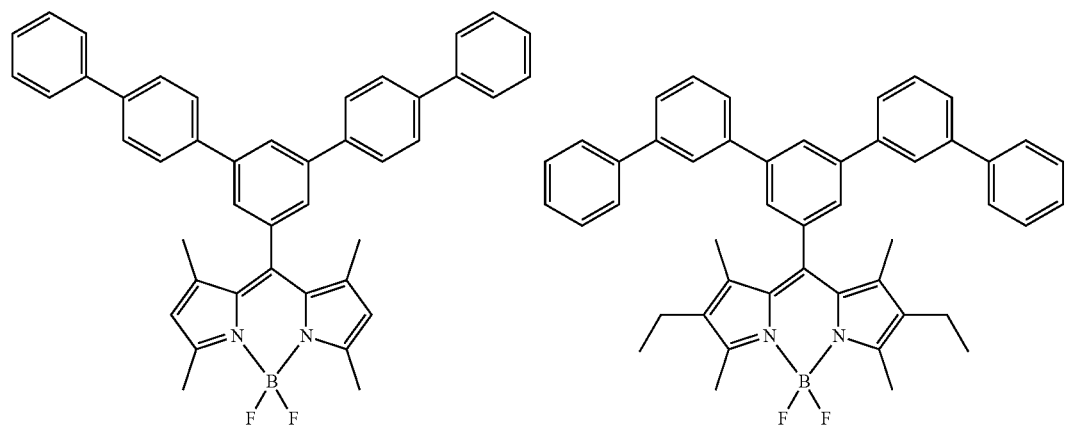
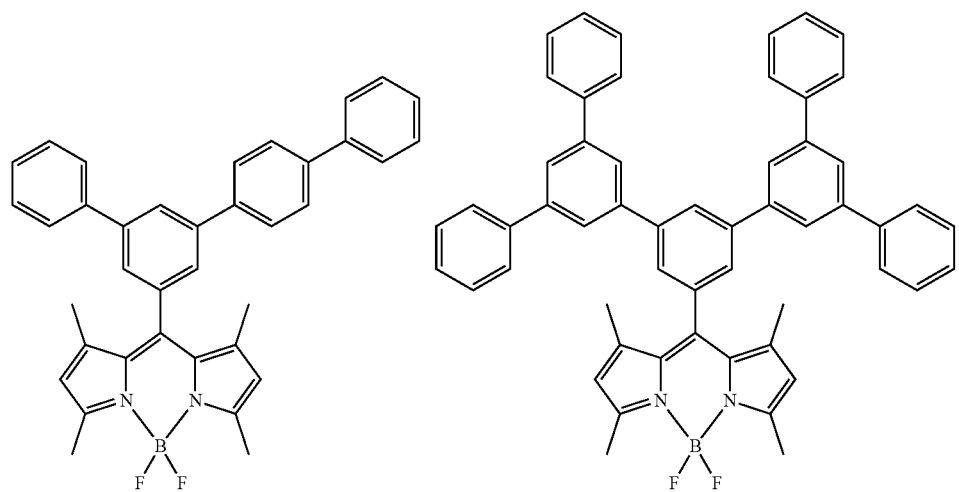

-continued
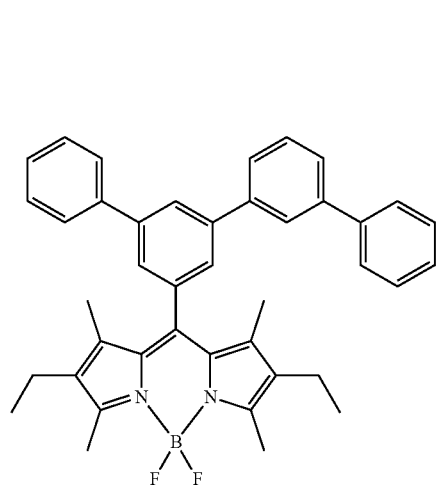
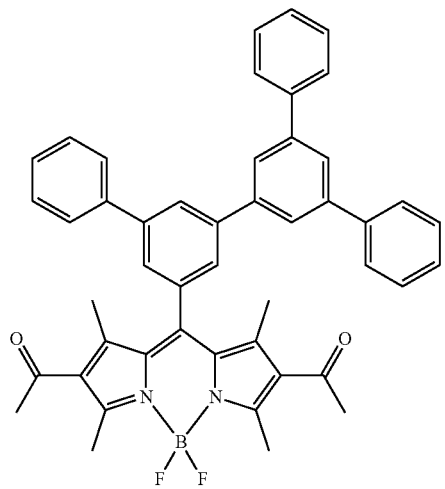
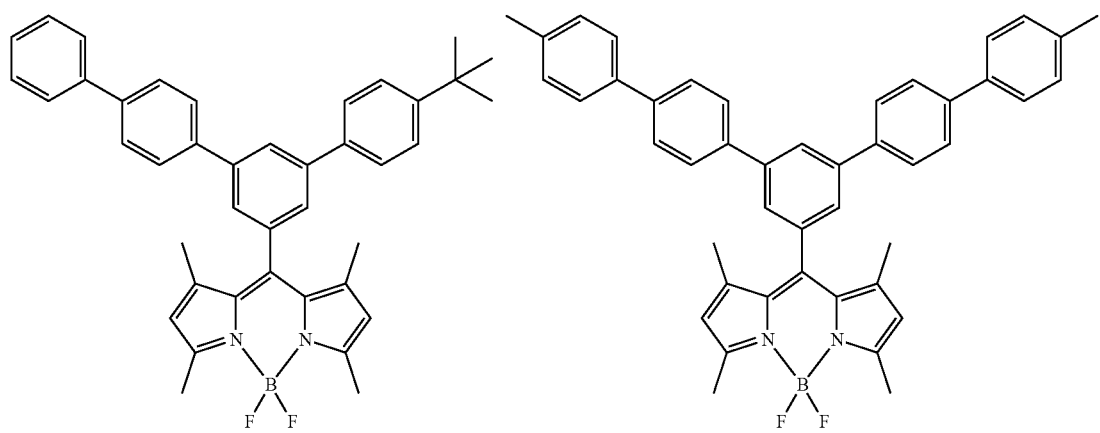
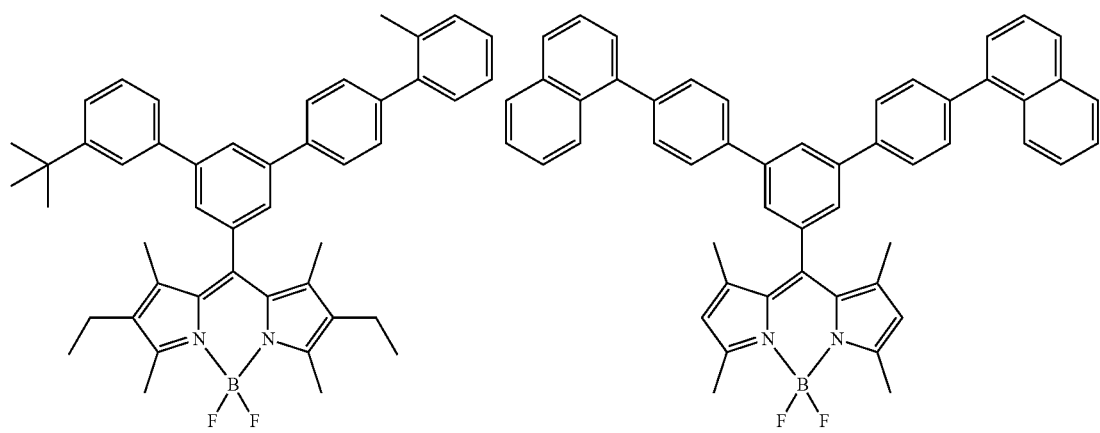

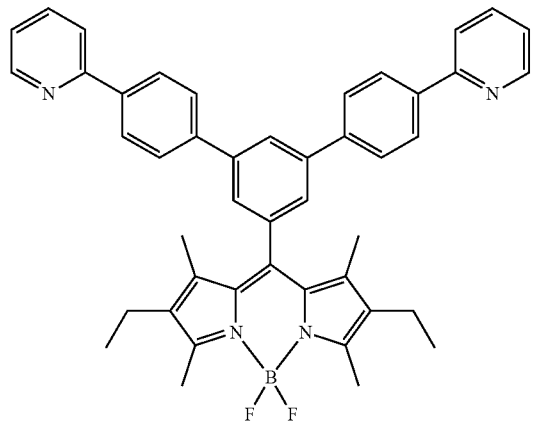
[Chem. 13]
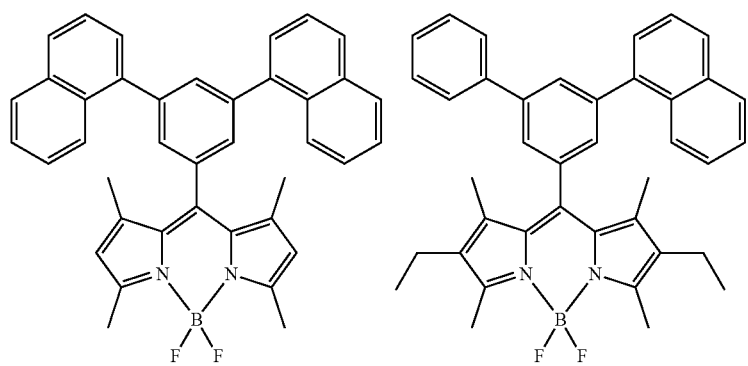
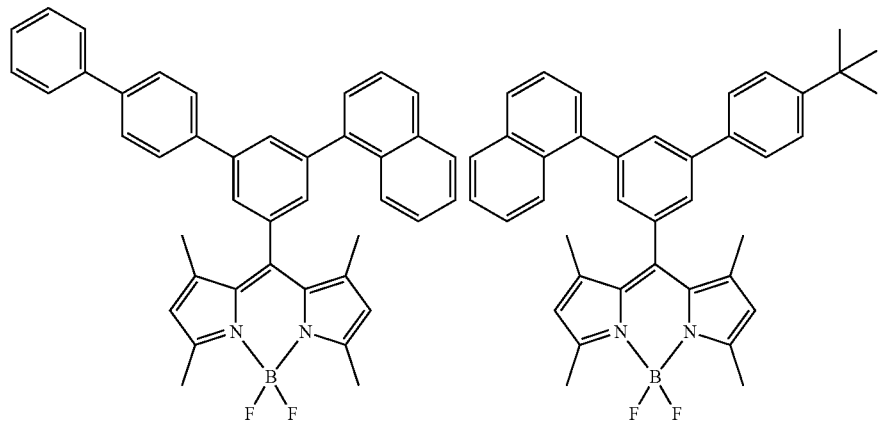
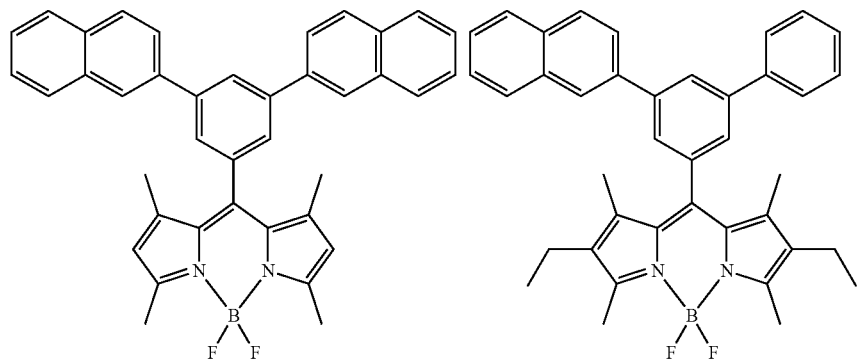

-continued
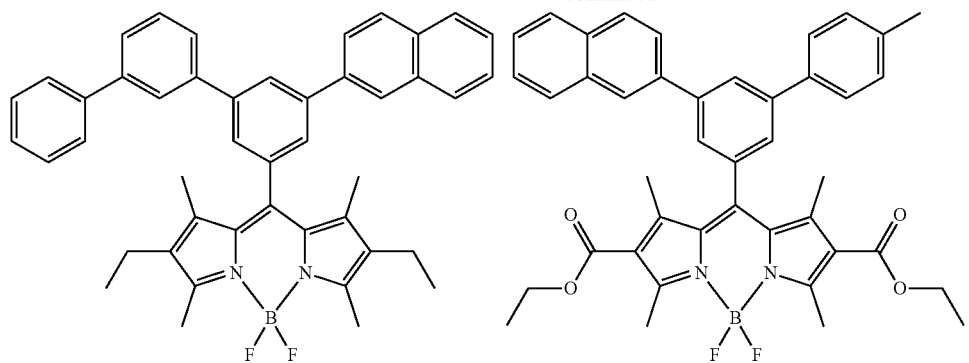
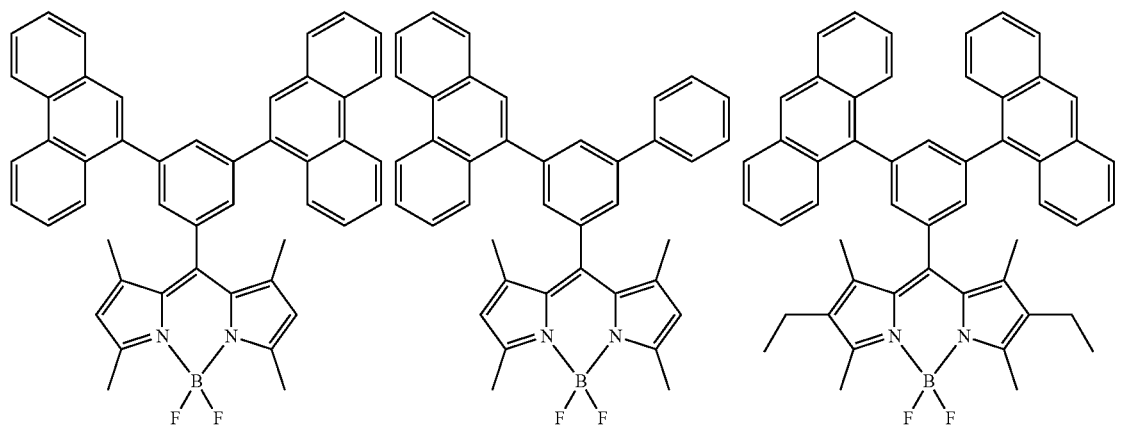
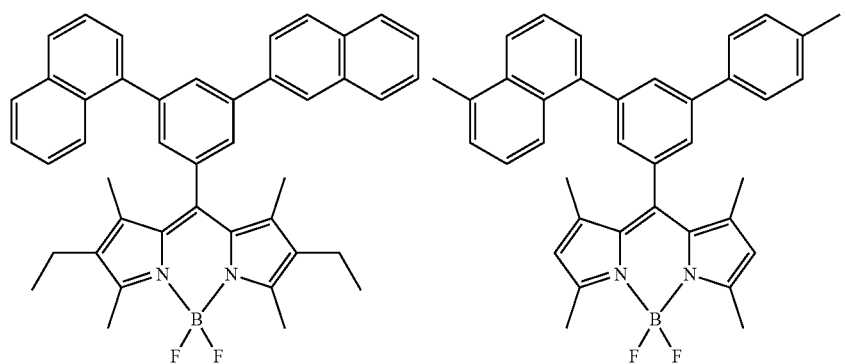
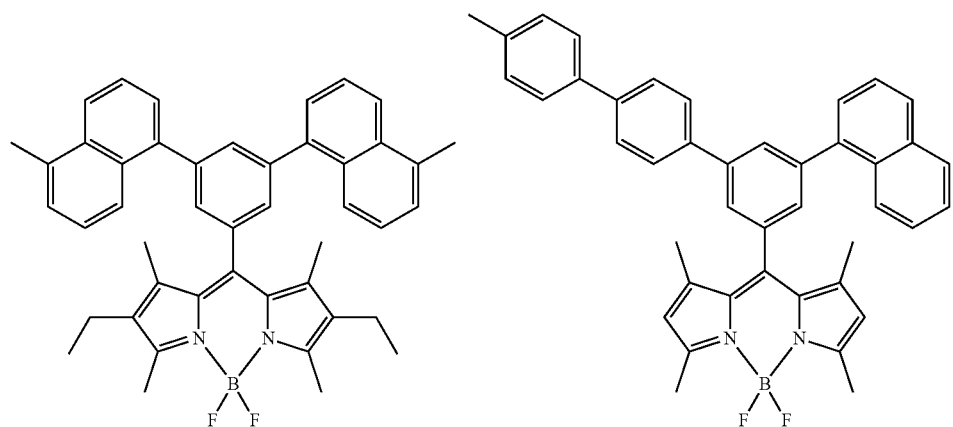

[Chem. 14]
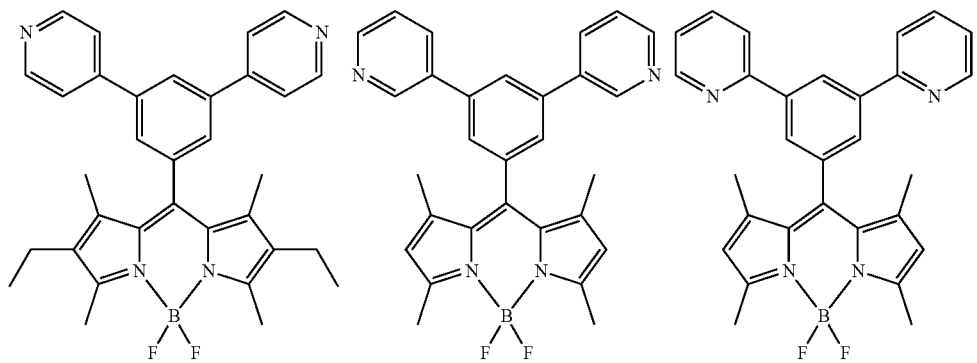
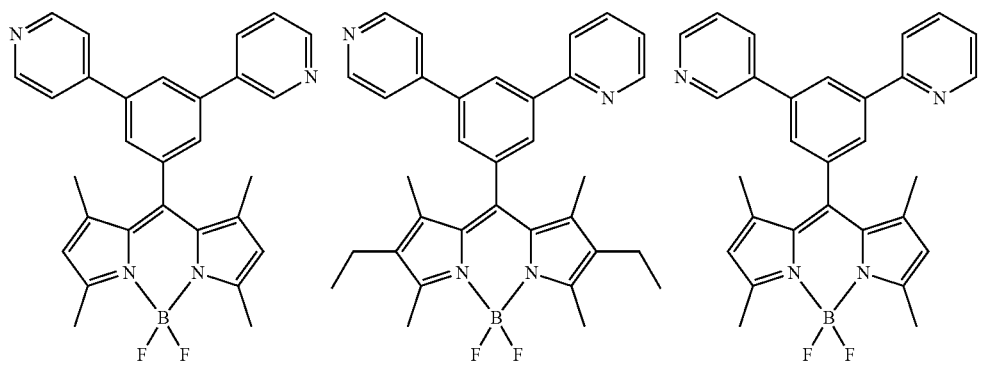
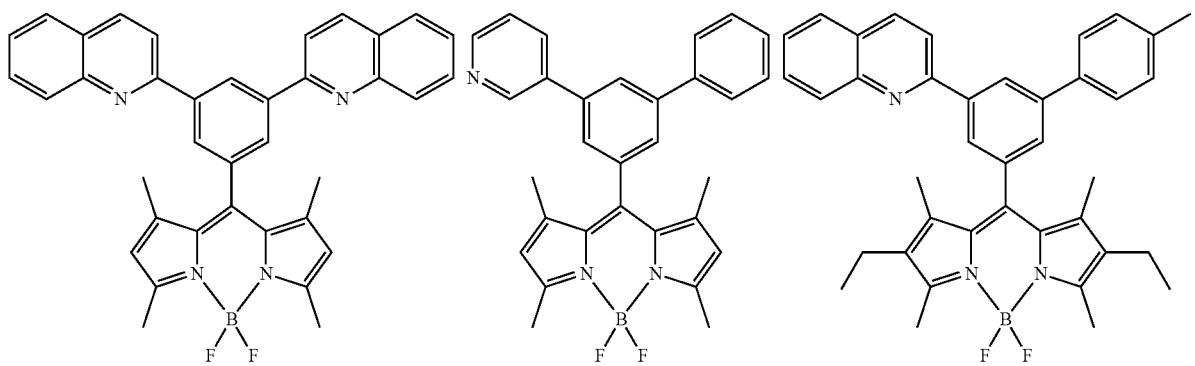
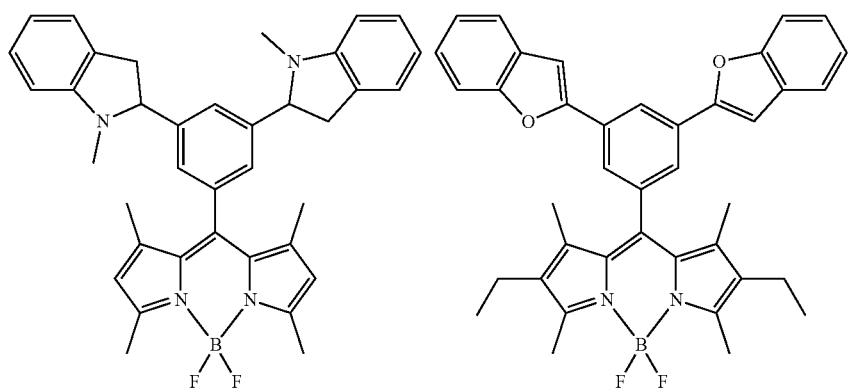

-continued
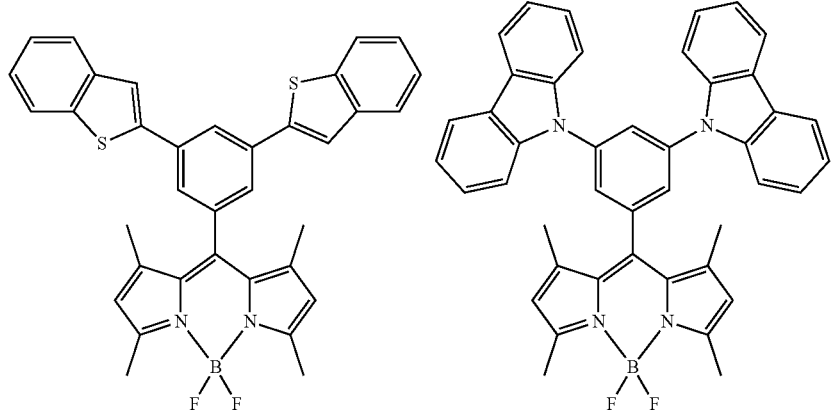
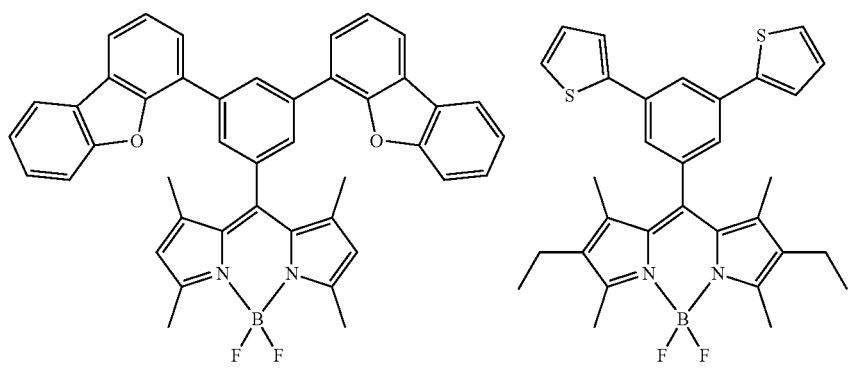
[Chem. 15]
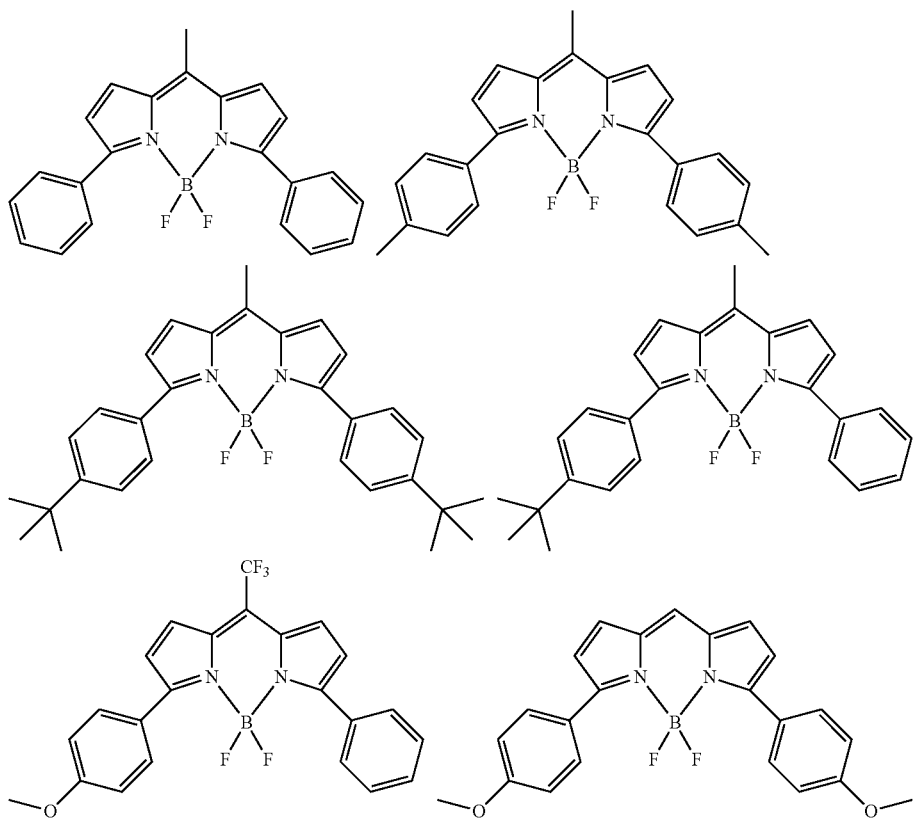

-continued
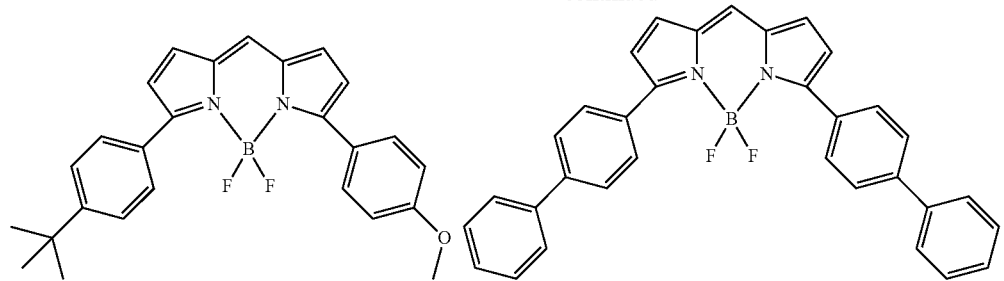
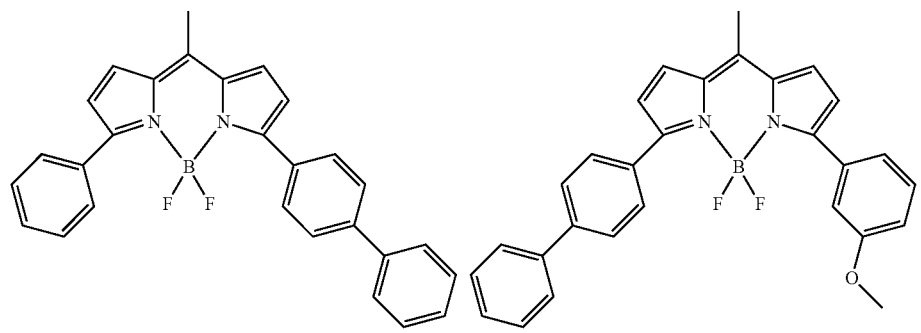
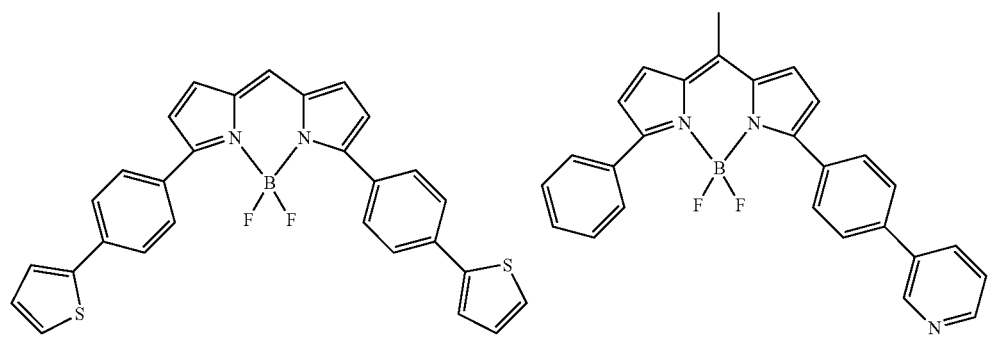
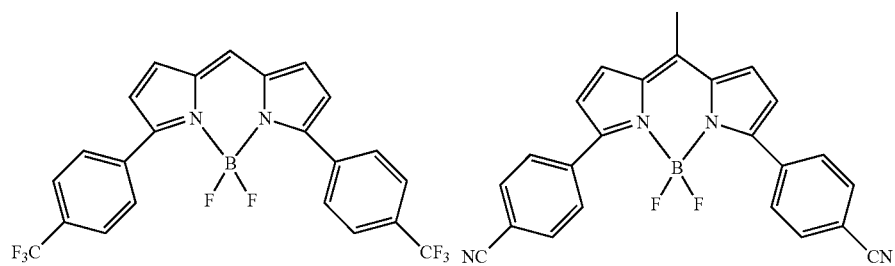
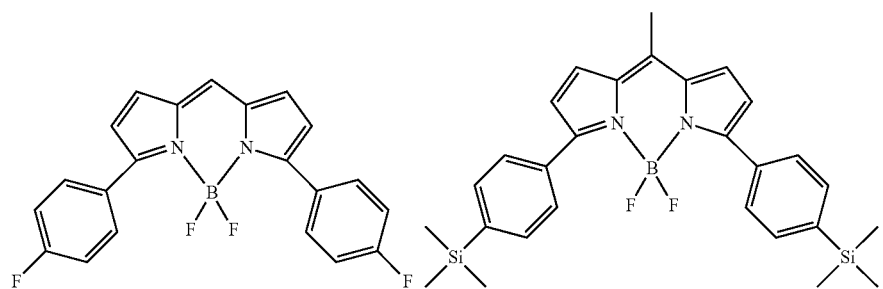

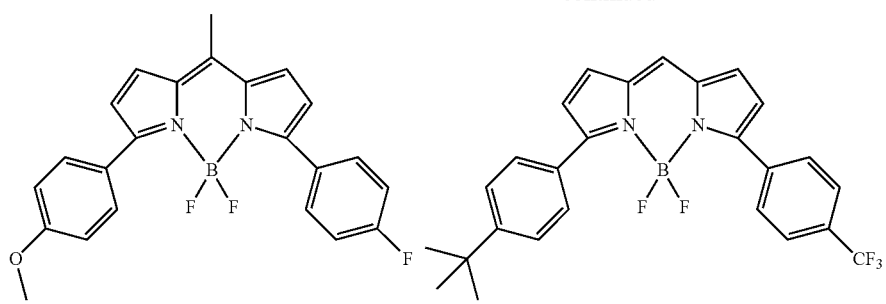
[Chem. 16]
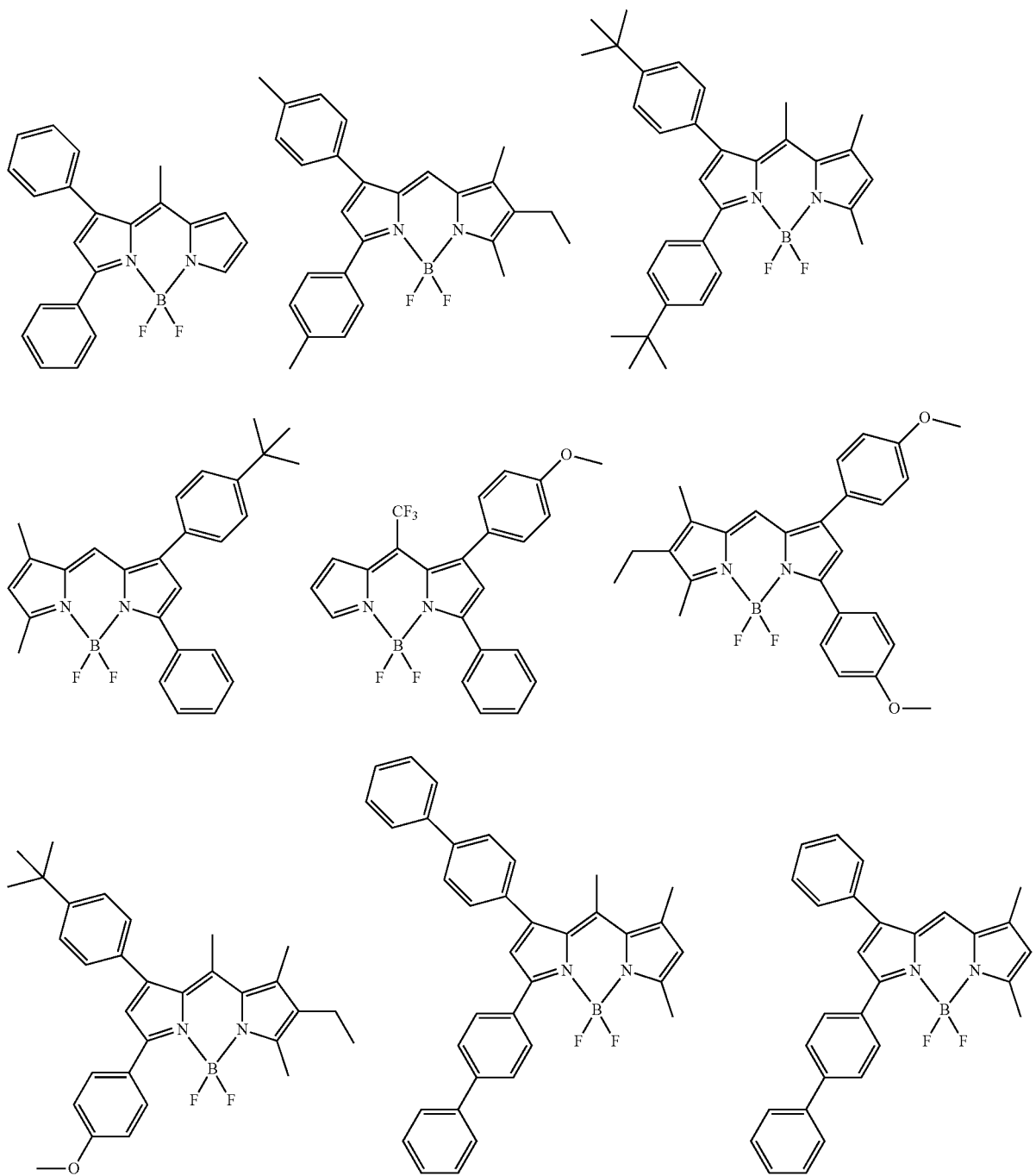

-continued
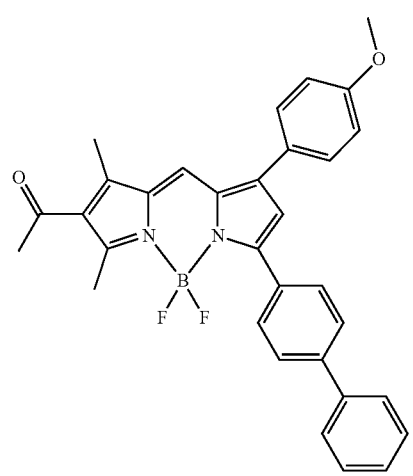
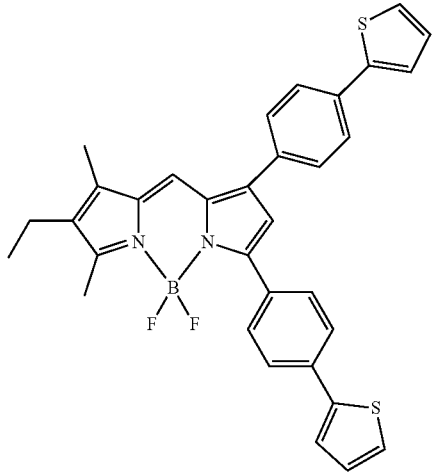
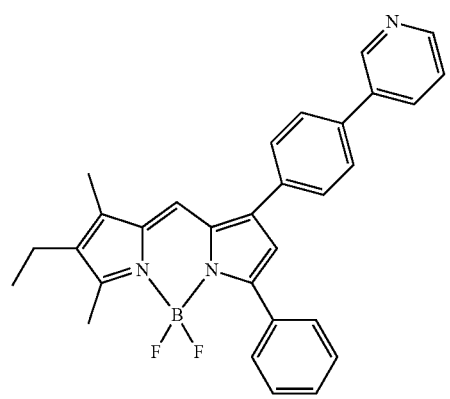
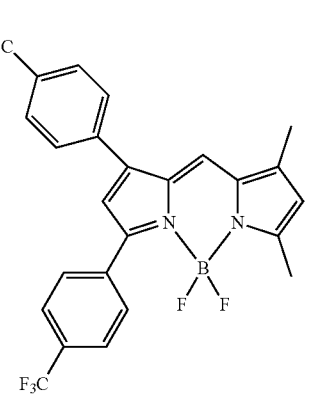
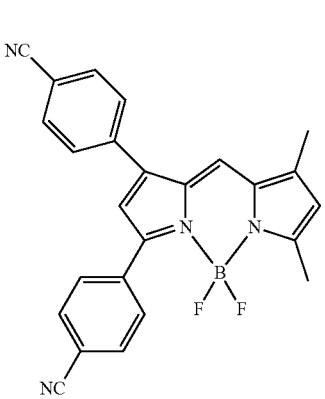
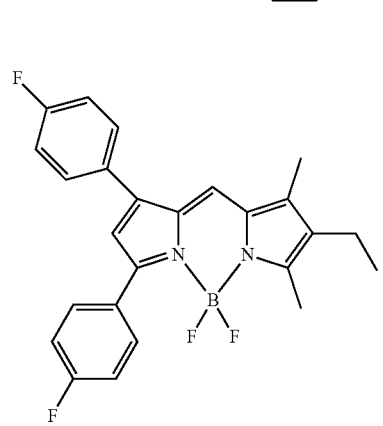
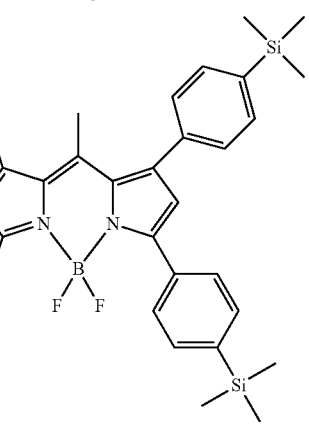
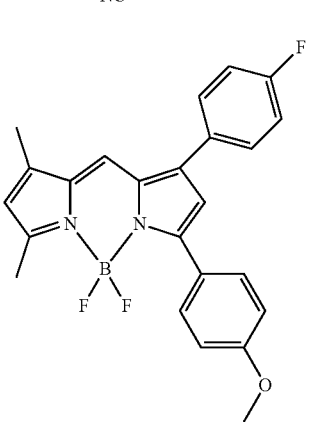
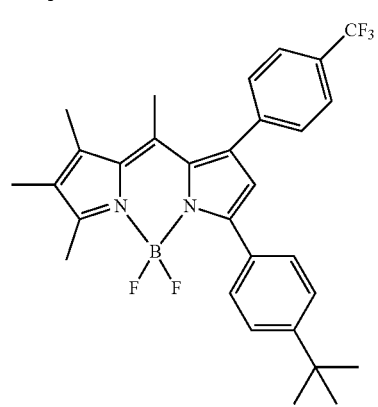

-continued
[Chem. 17]
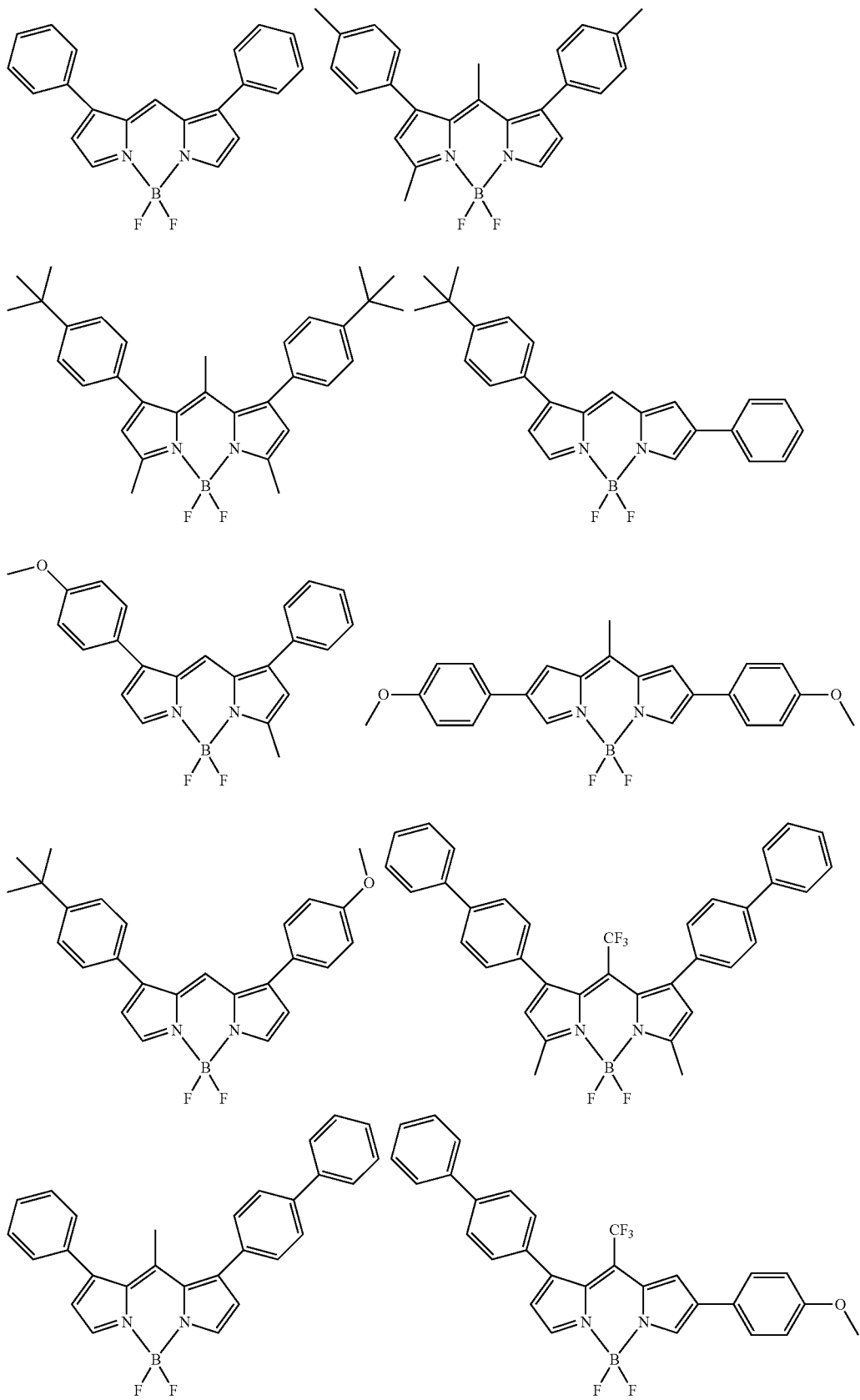

-continued
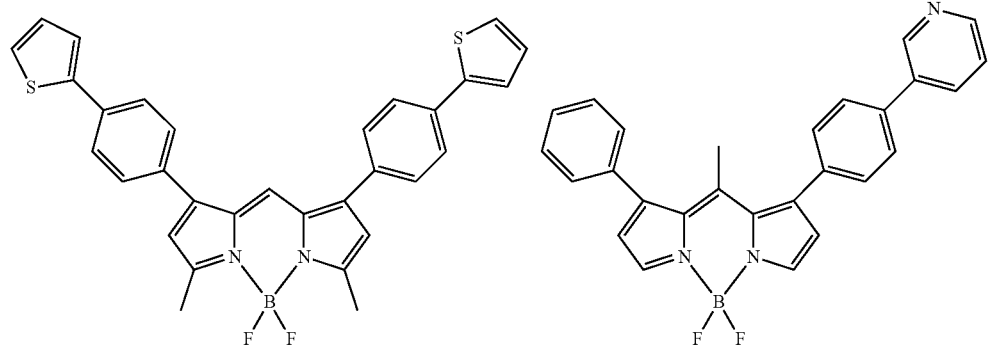
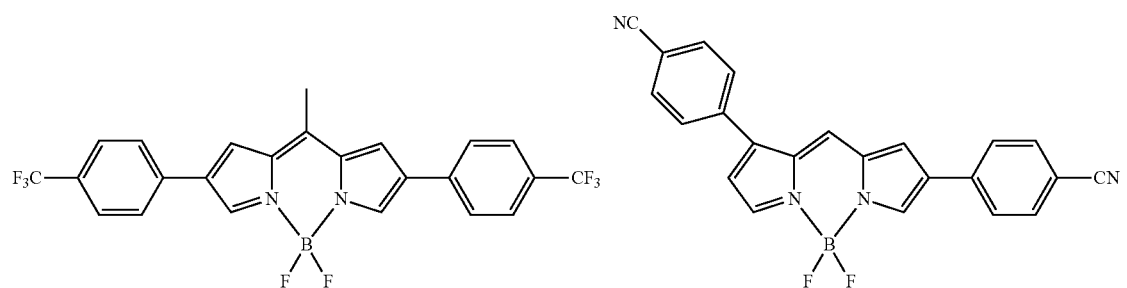
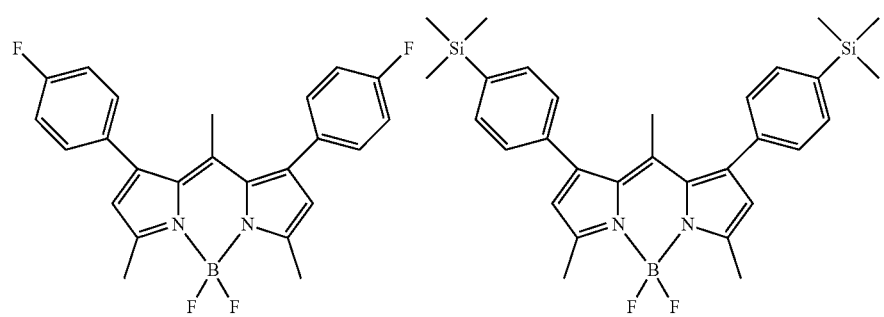
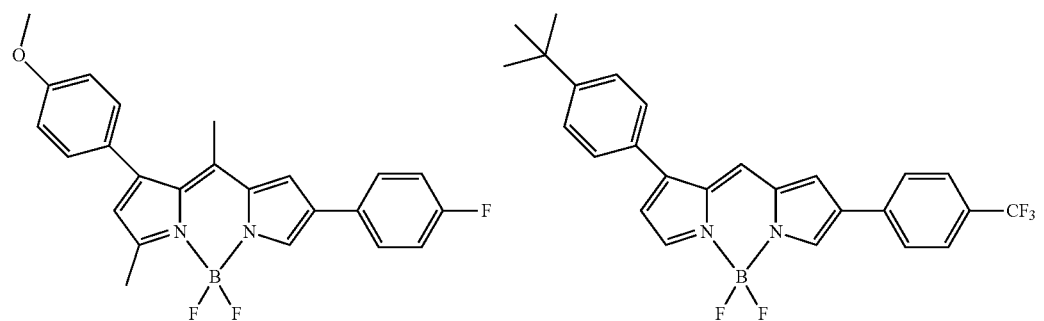
[Chem. 18]
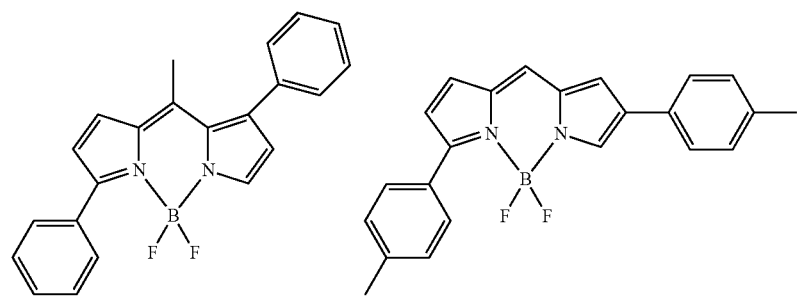

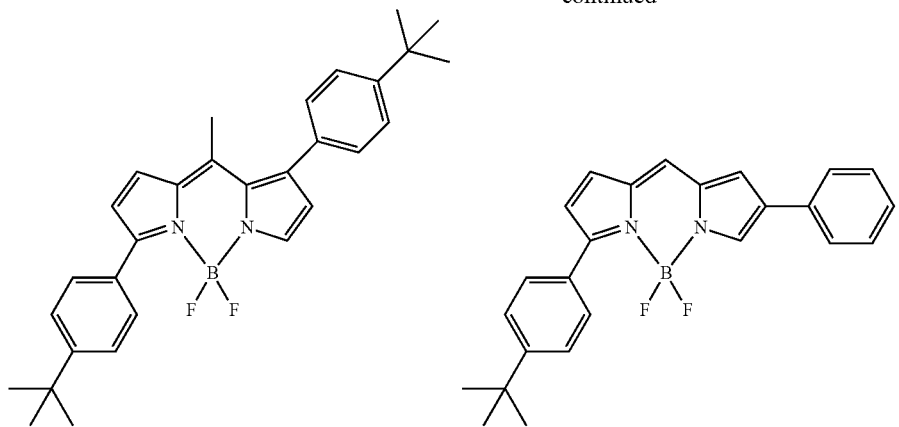
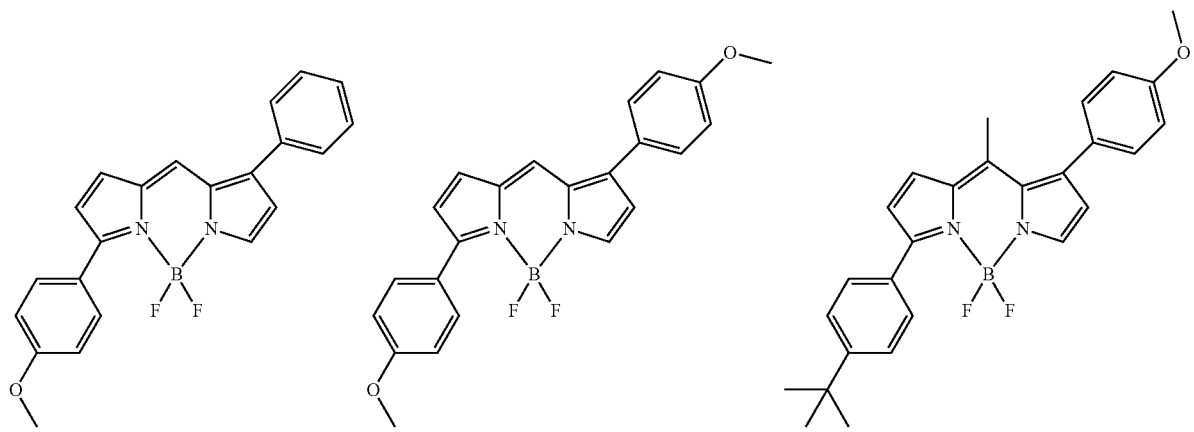
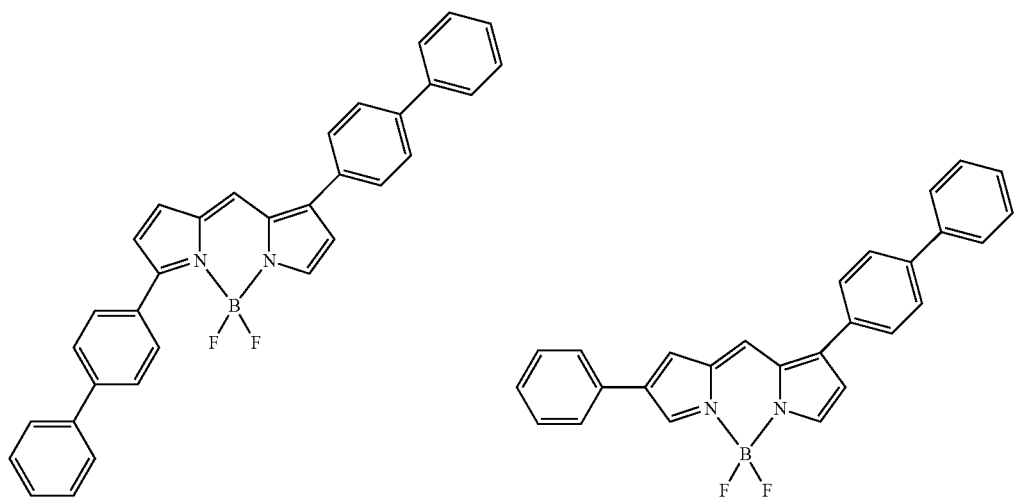

-continued
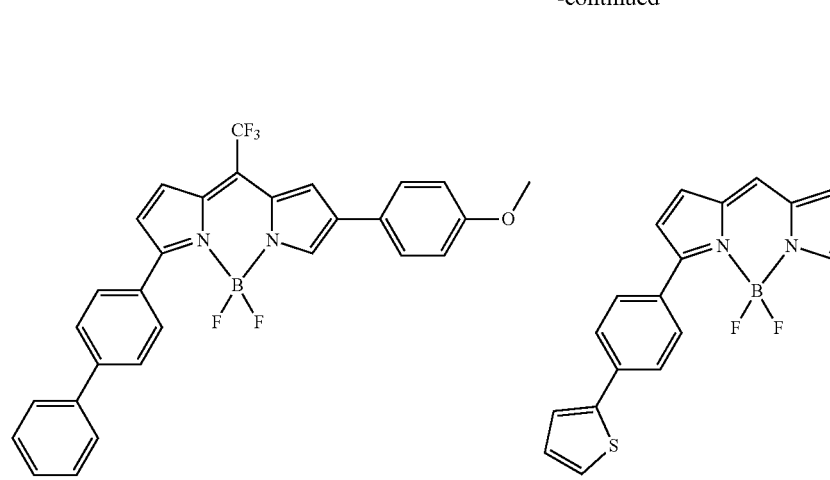
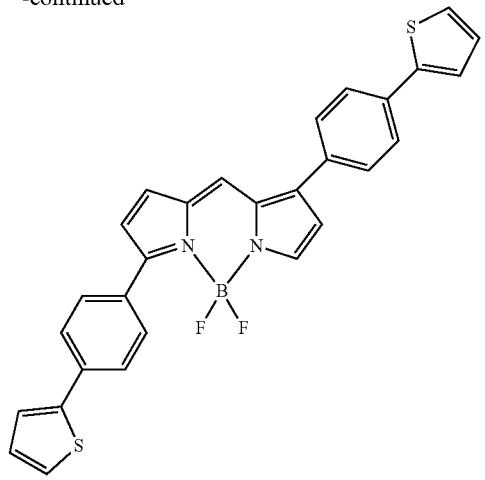
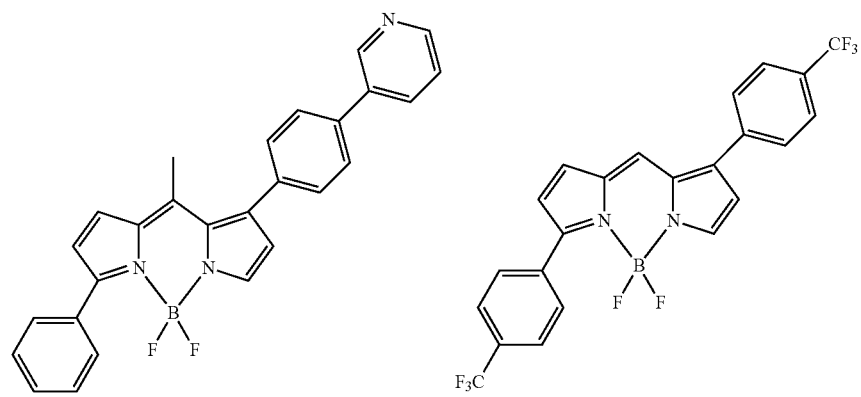
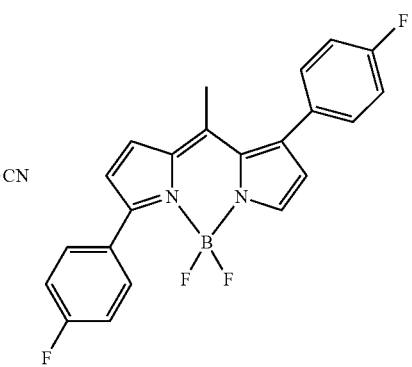
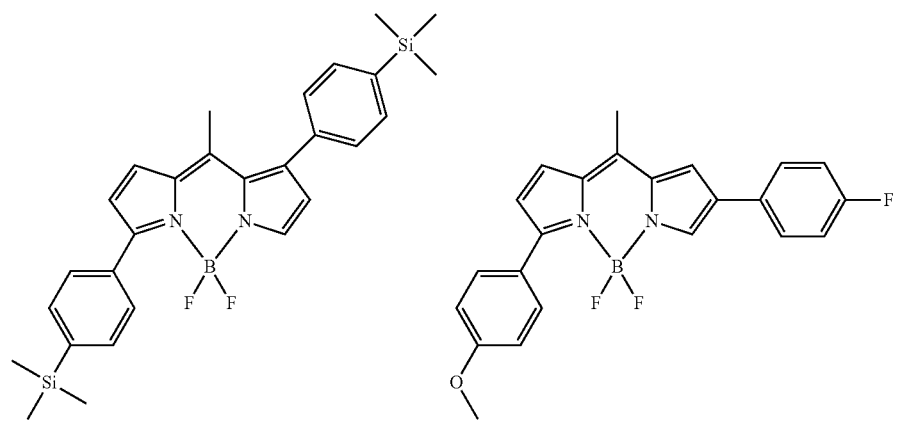

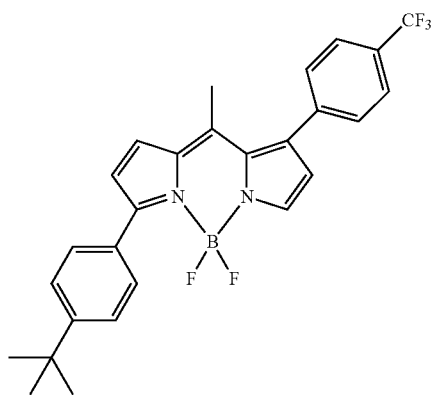
[Chem. 19]
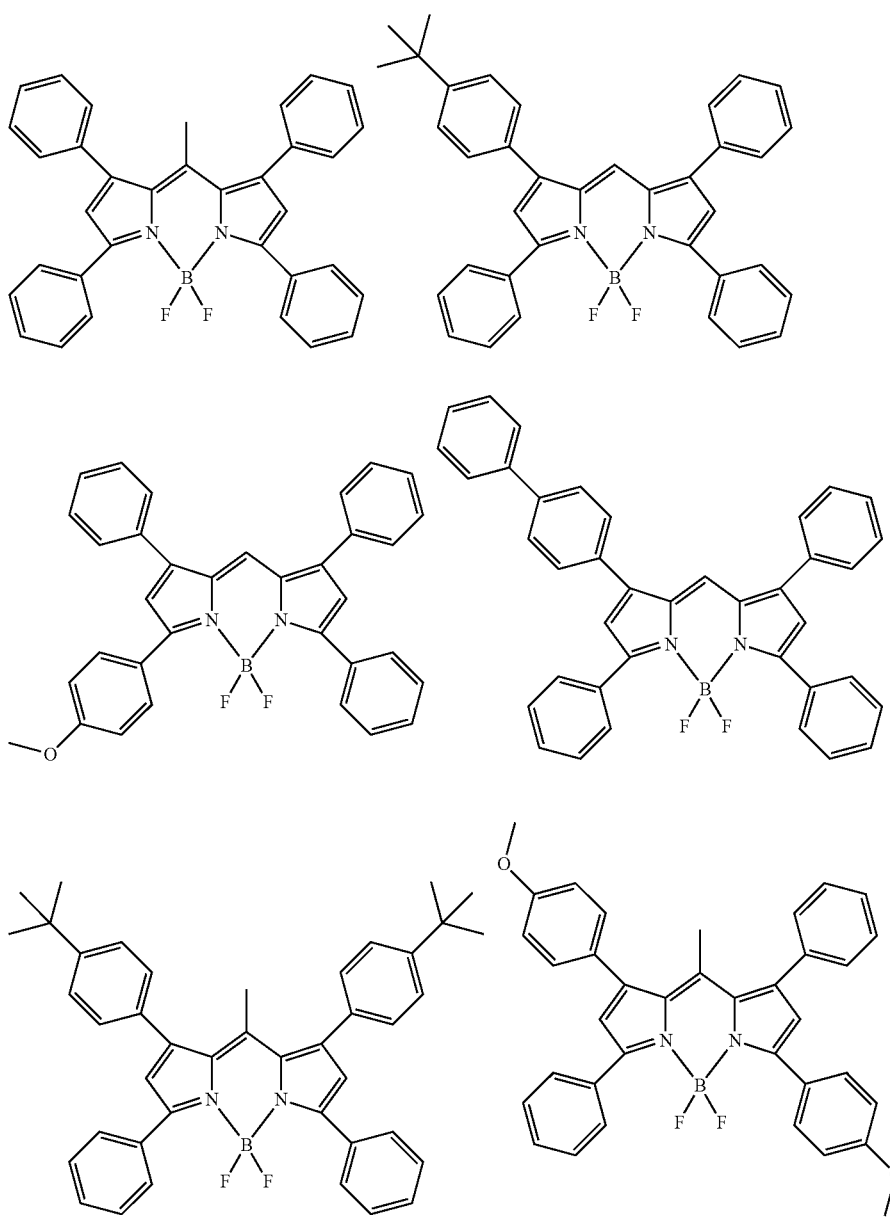

-continued
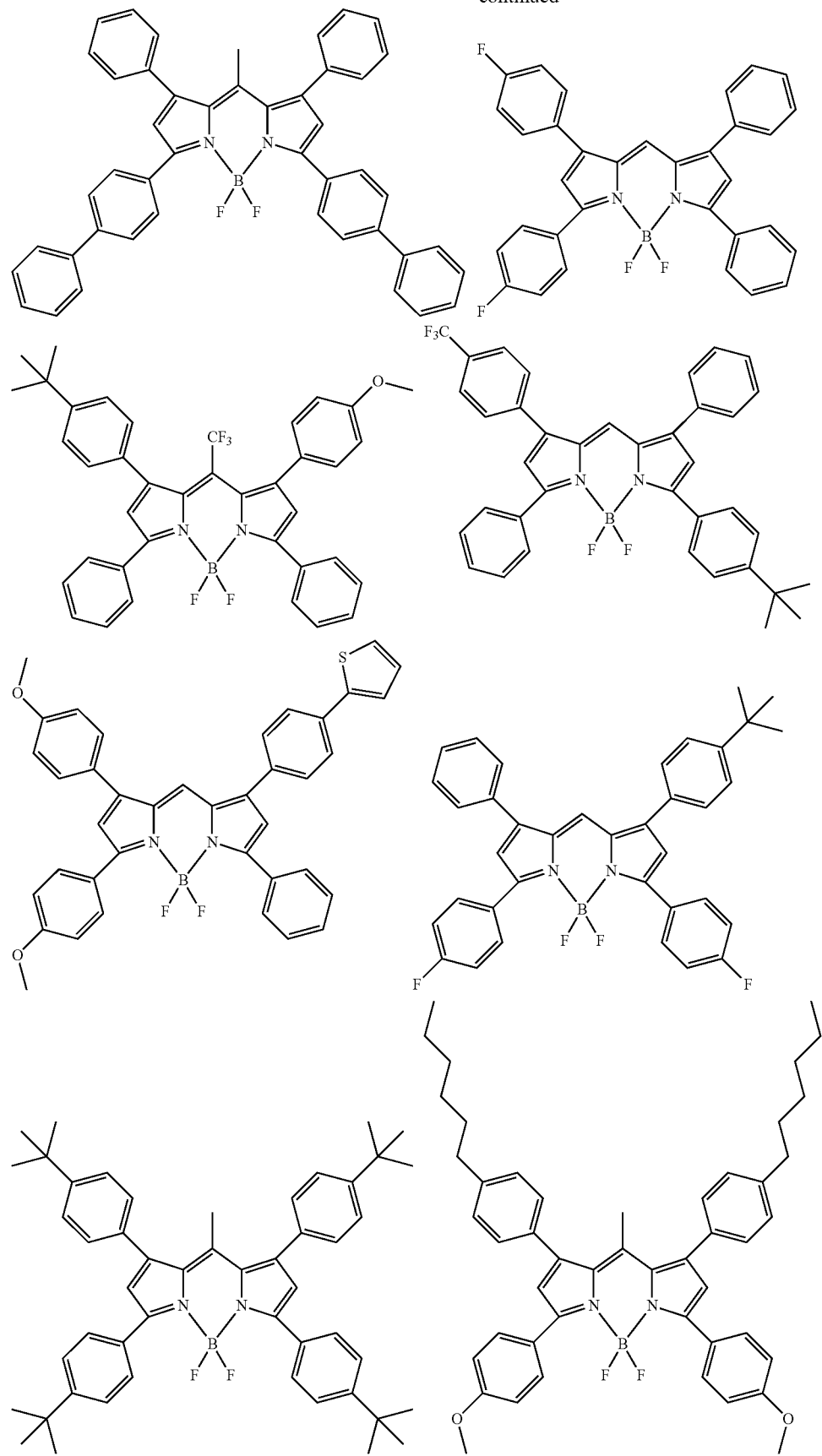

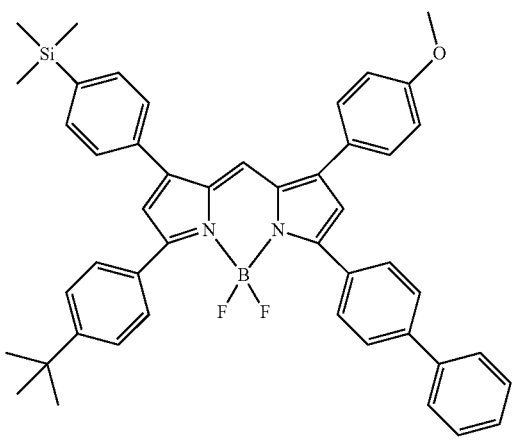
[Chem. 20]
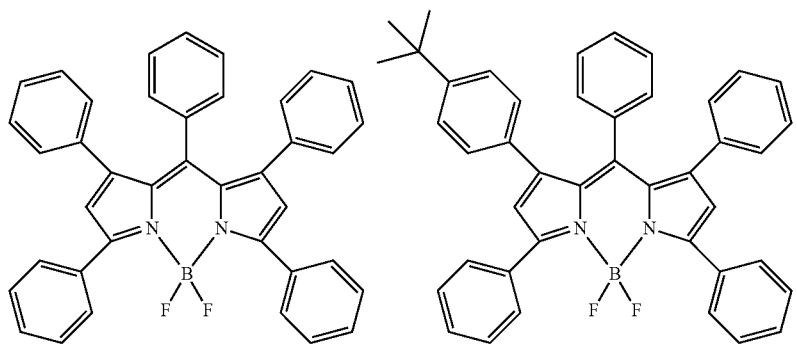
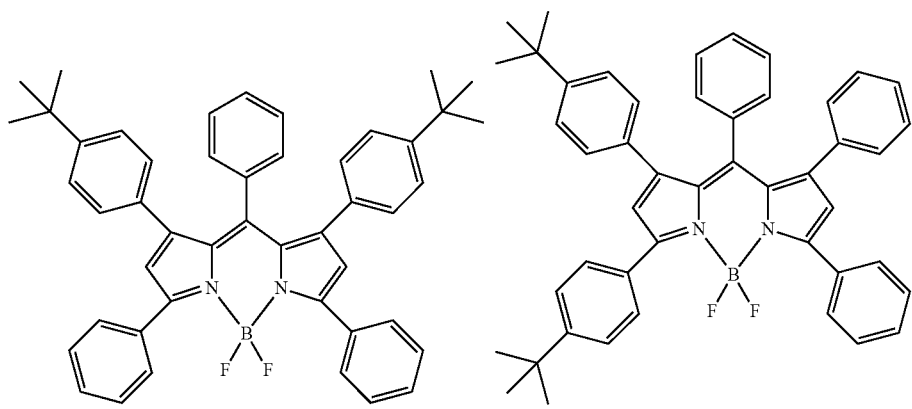
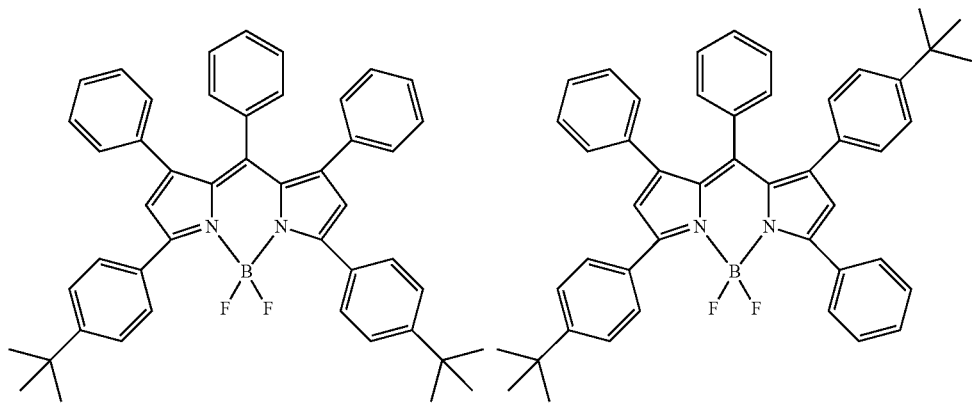

-continued
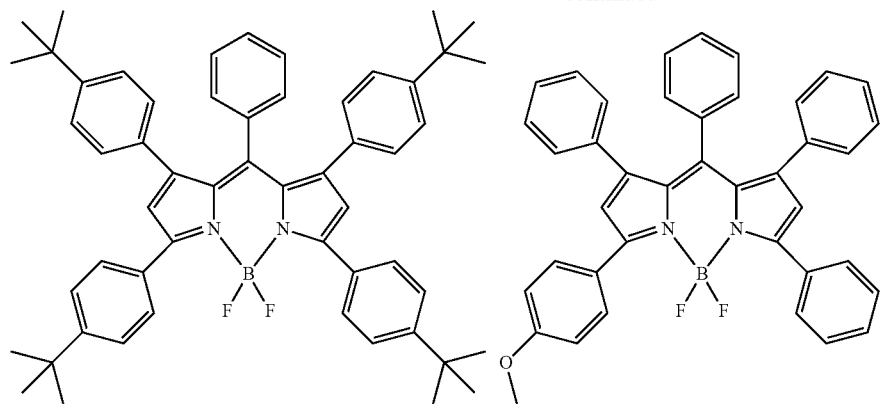
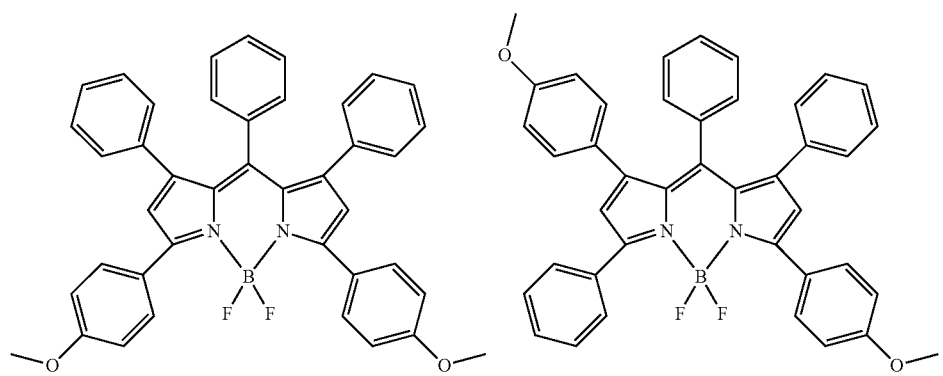
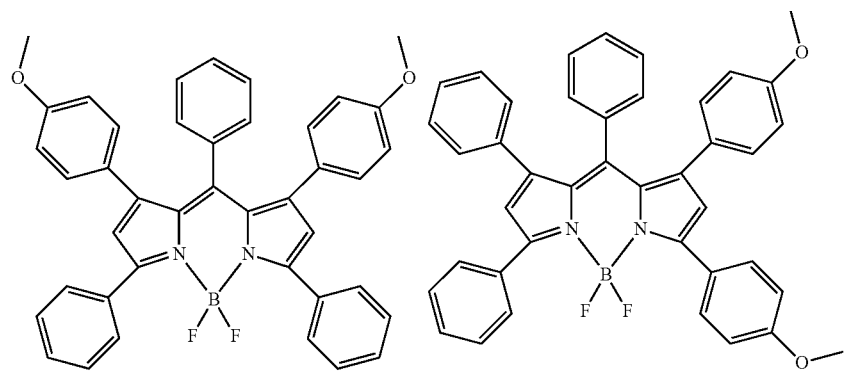
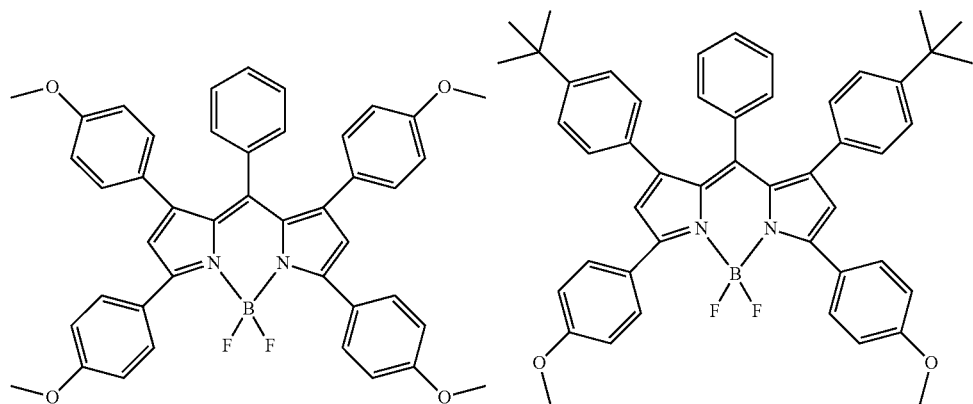

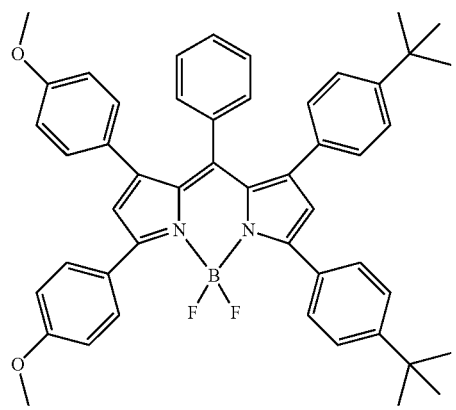
[Chem. 21]
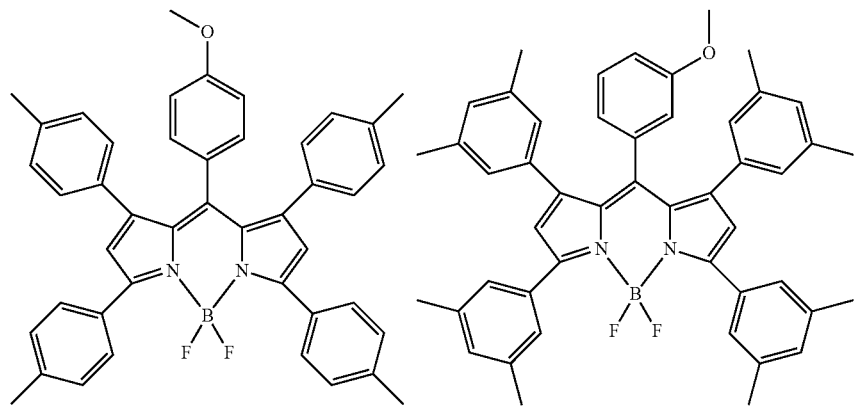
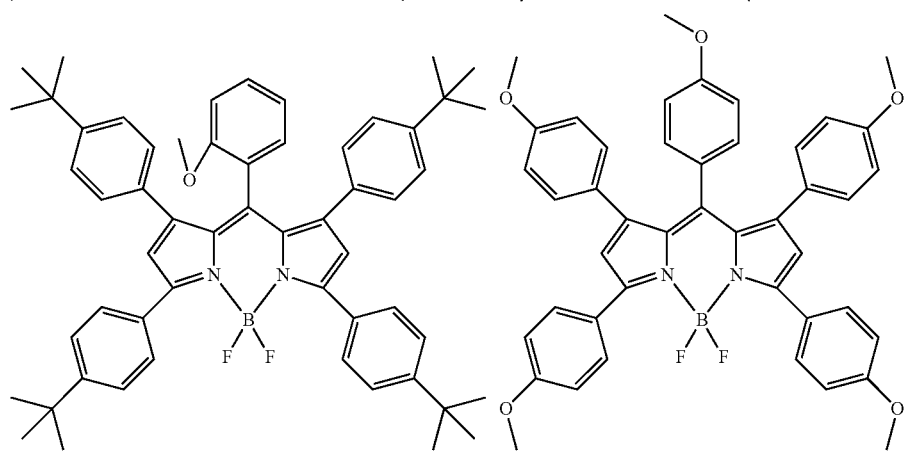
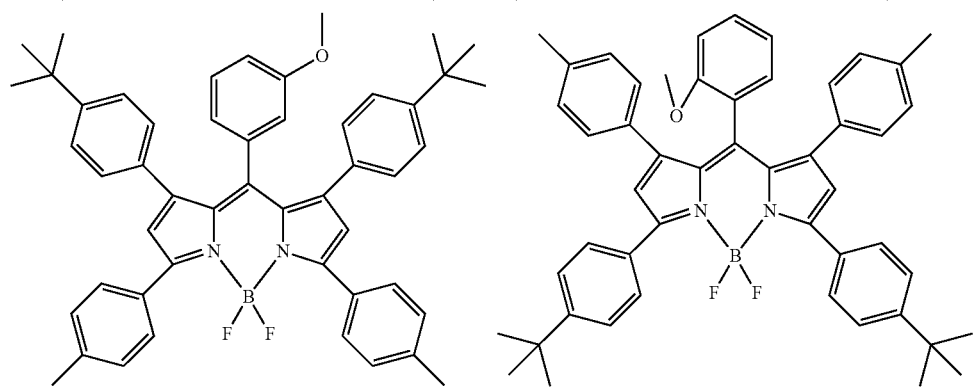

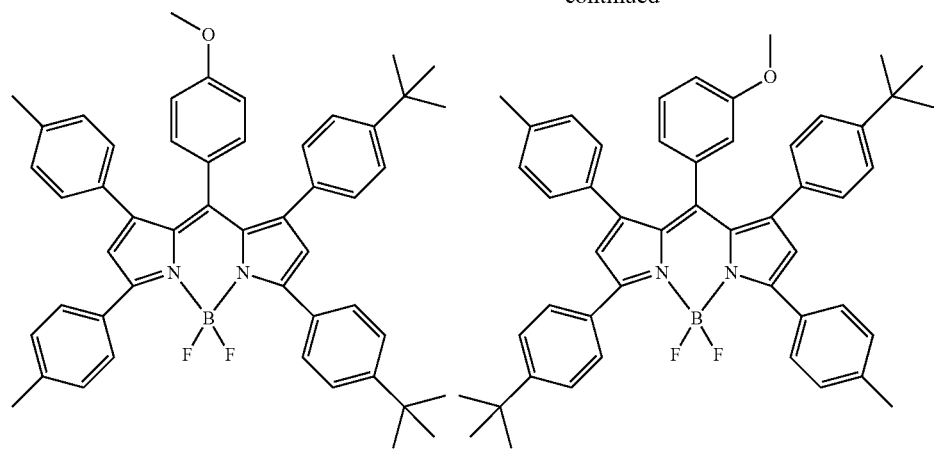
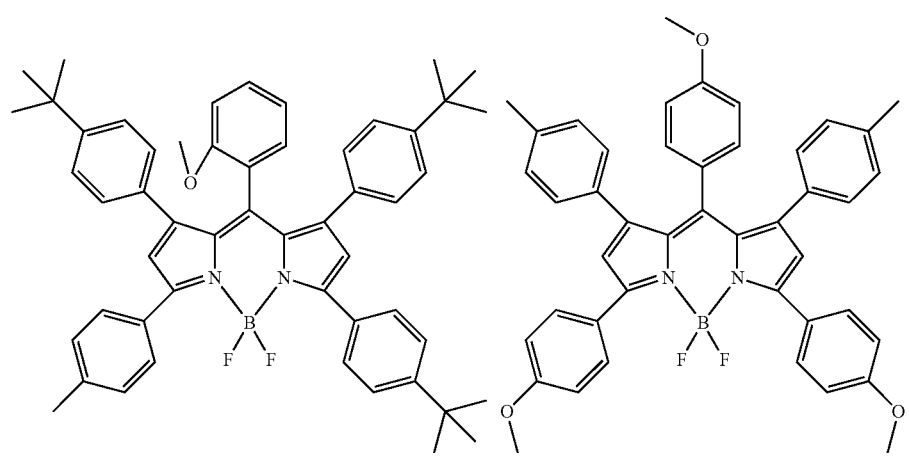
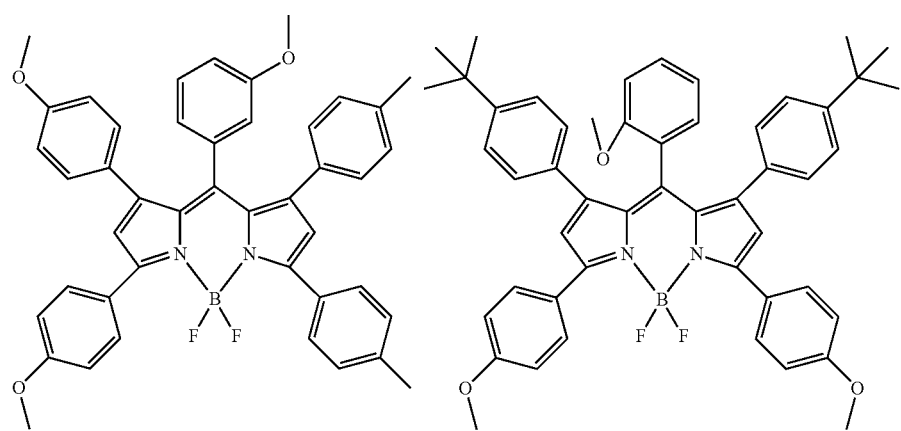

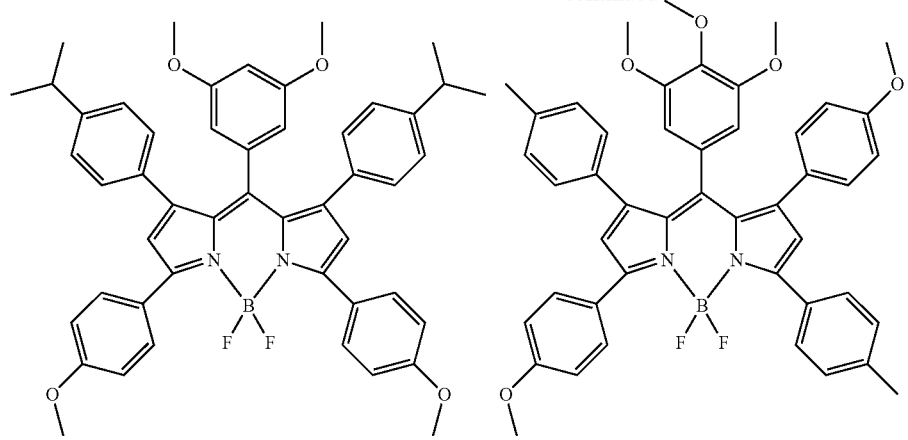
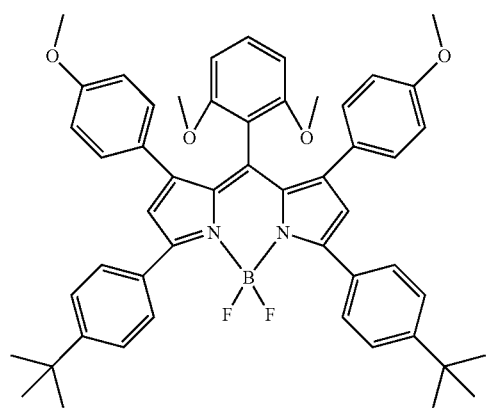
[Chem. 22]
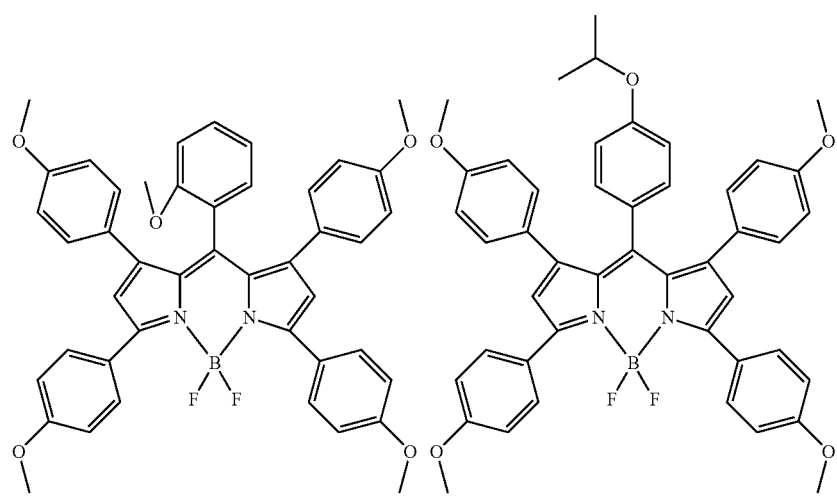

-continued
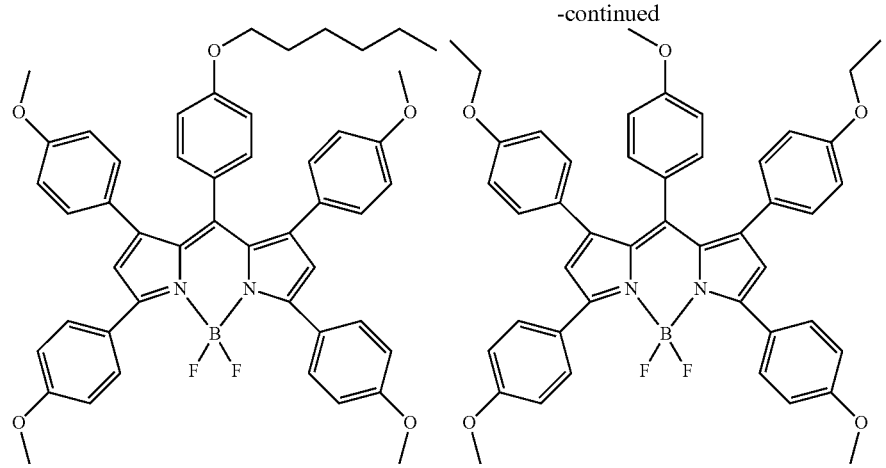
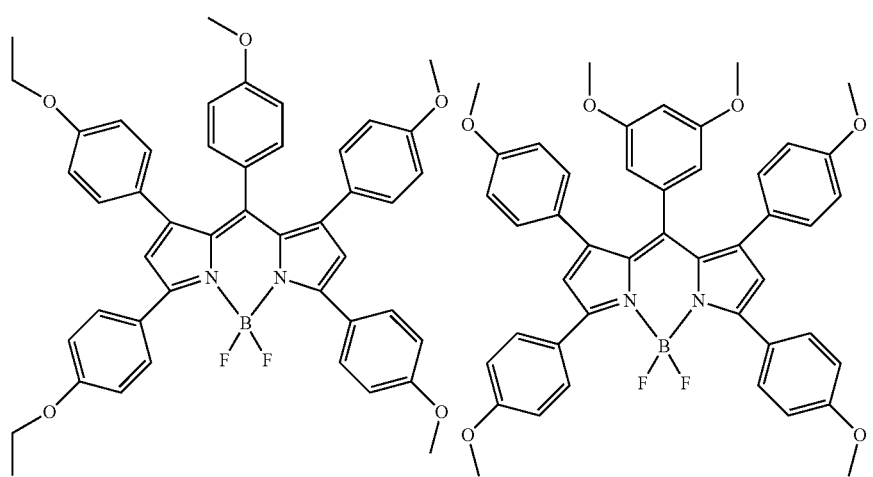
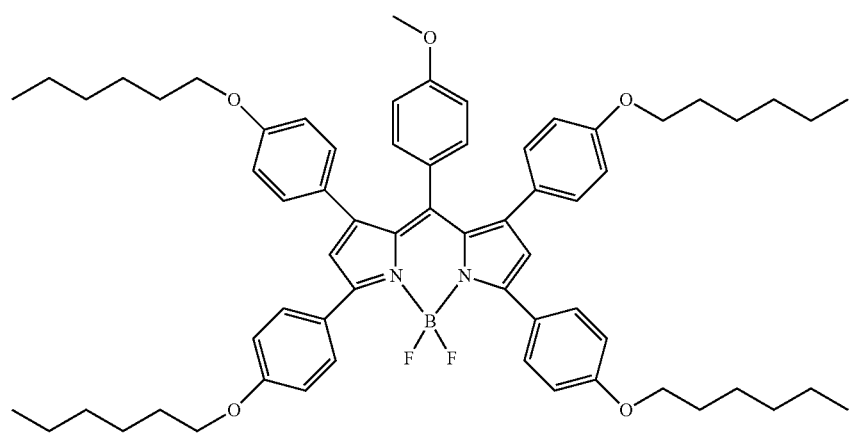

-continued
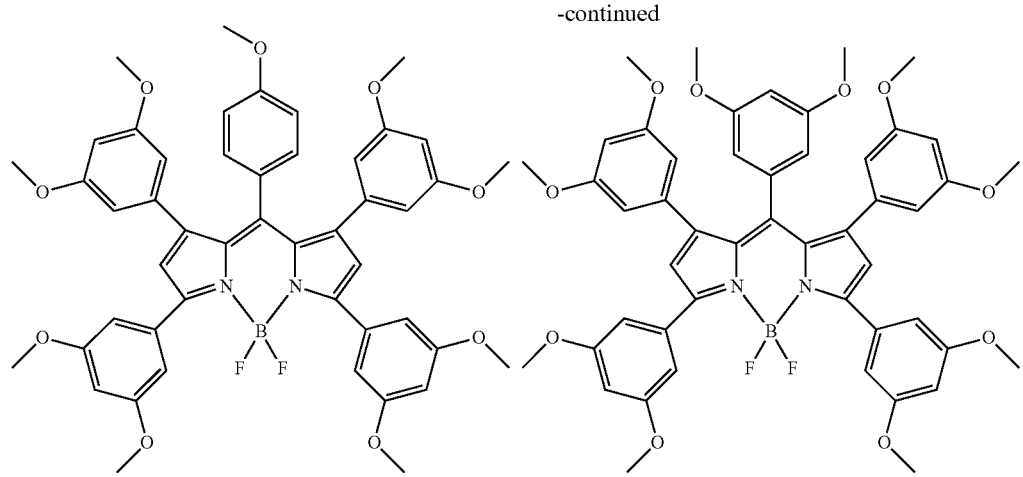
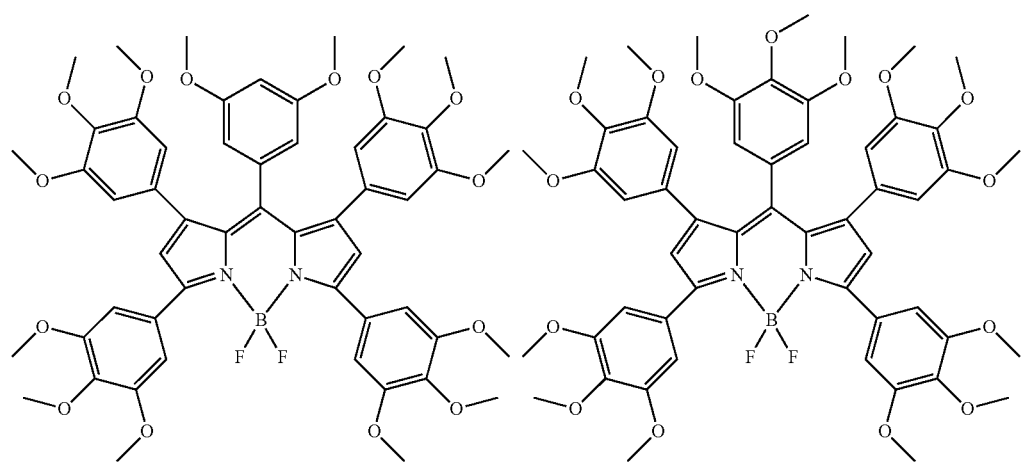
[Chem. 23]
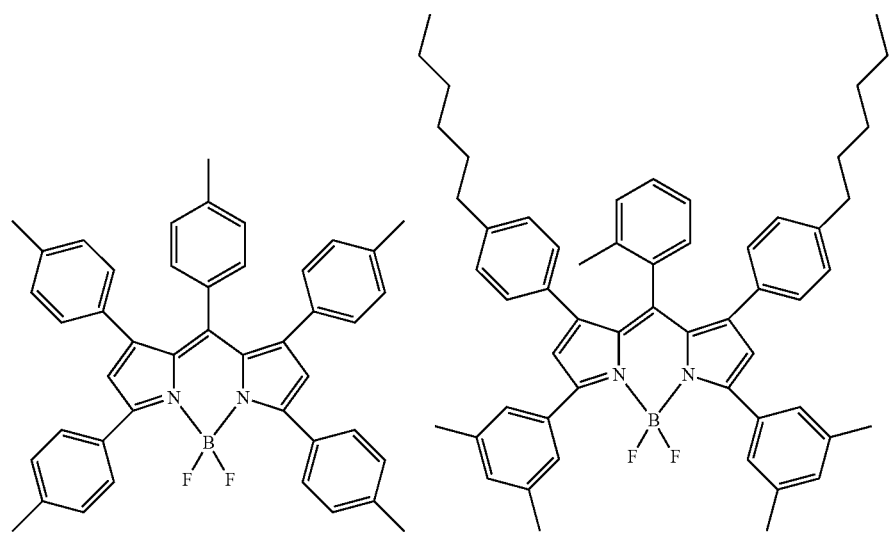

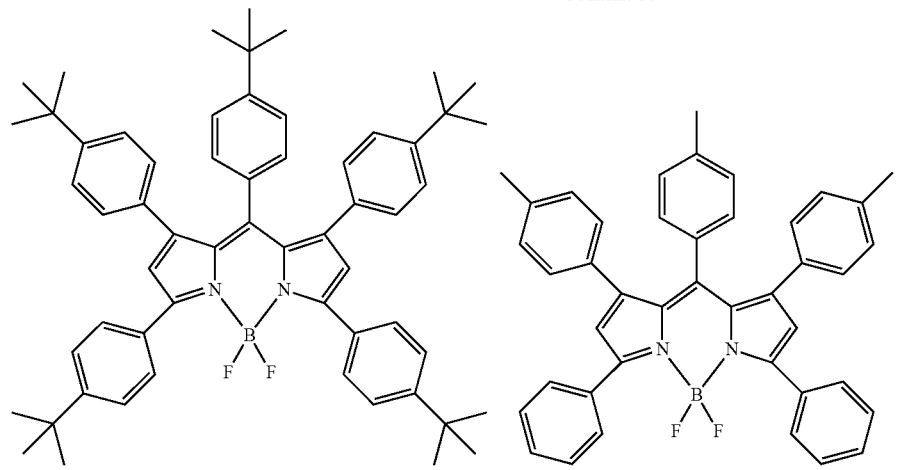
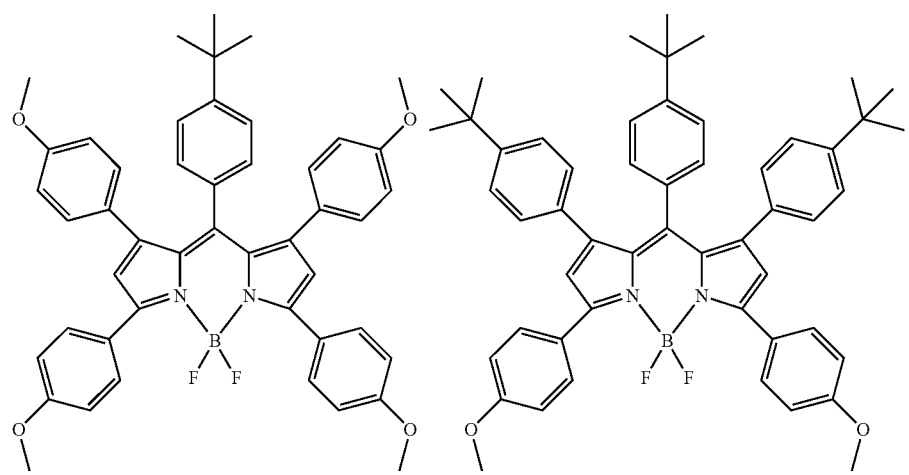
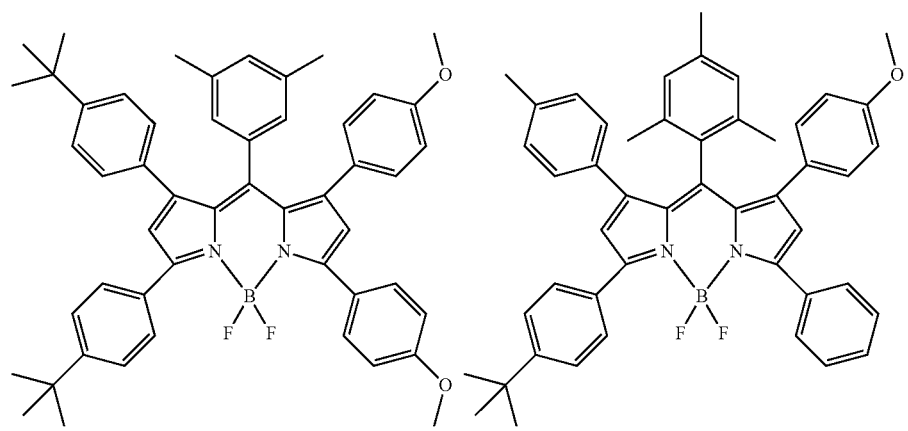

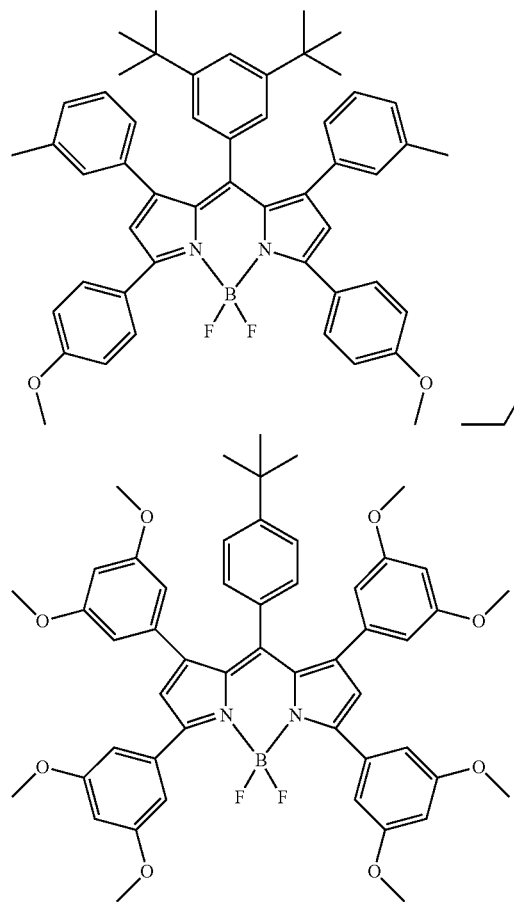
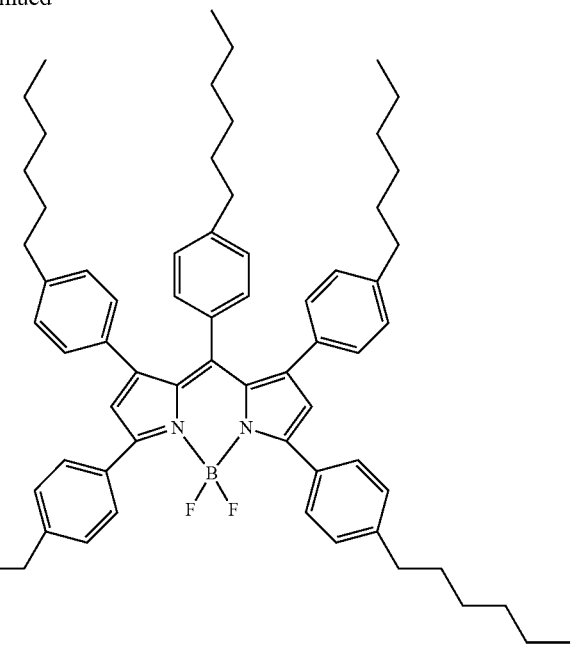
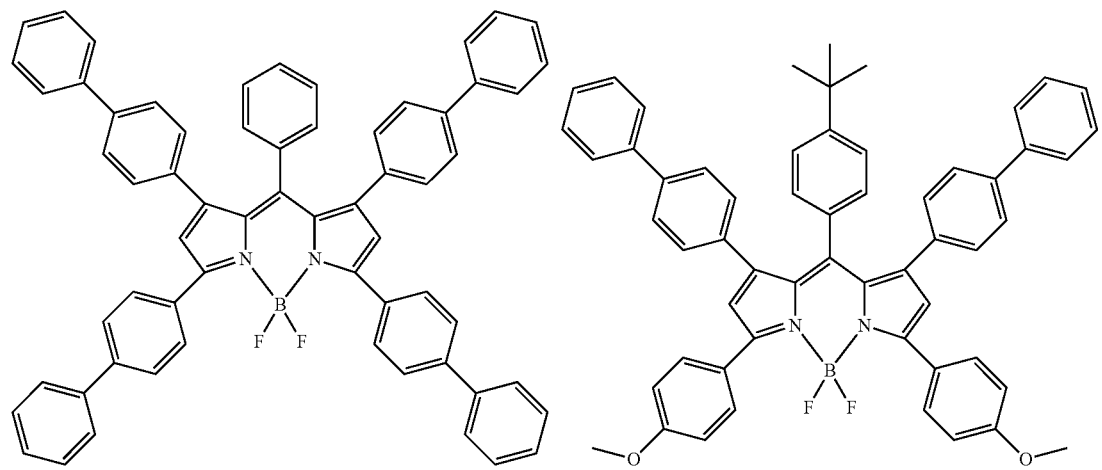
[Chem. 24]

91
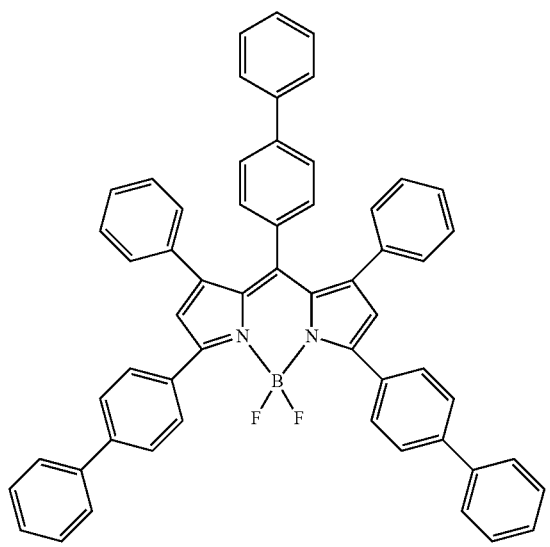
92
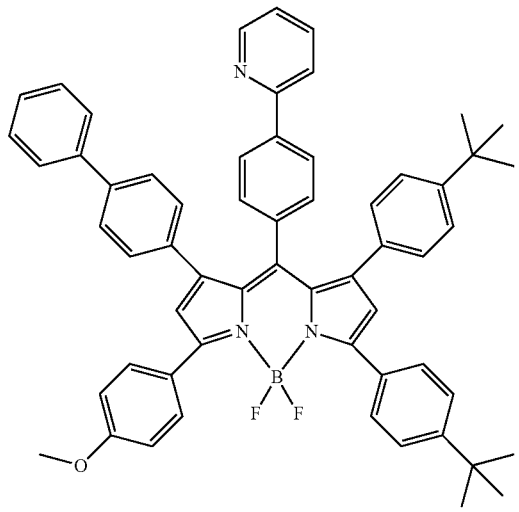
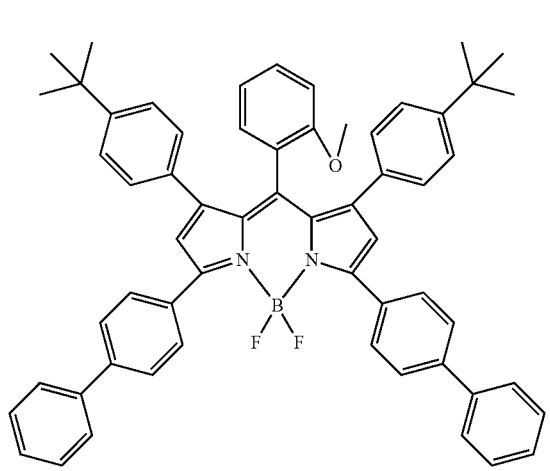
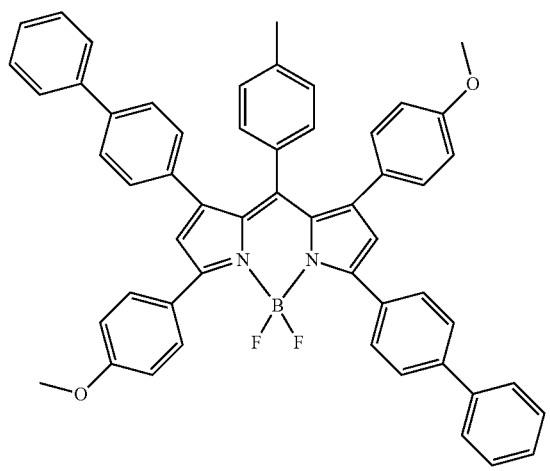
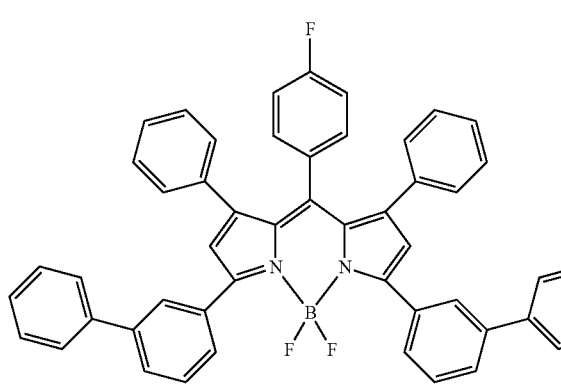
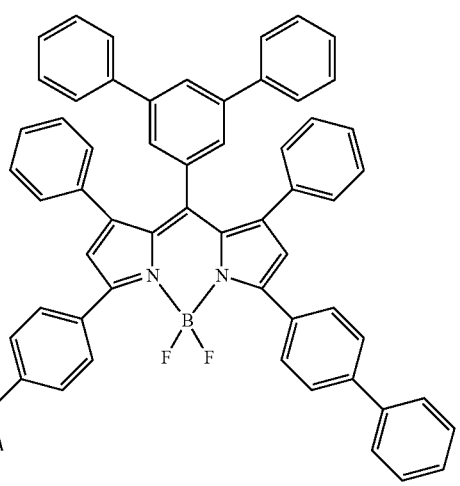

[Chem. 25]
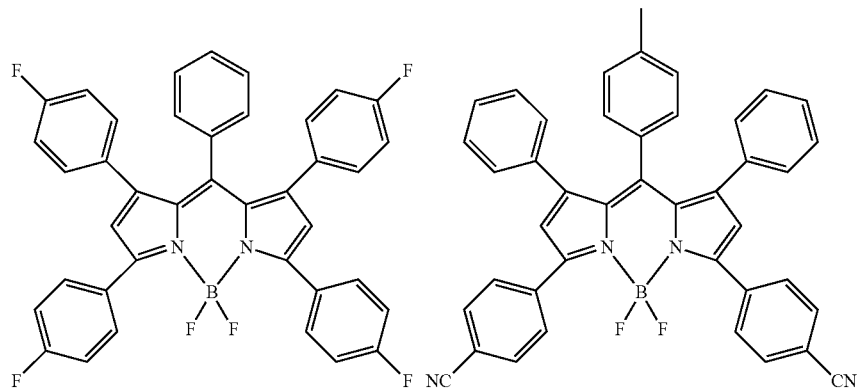
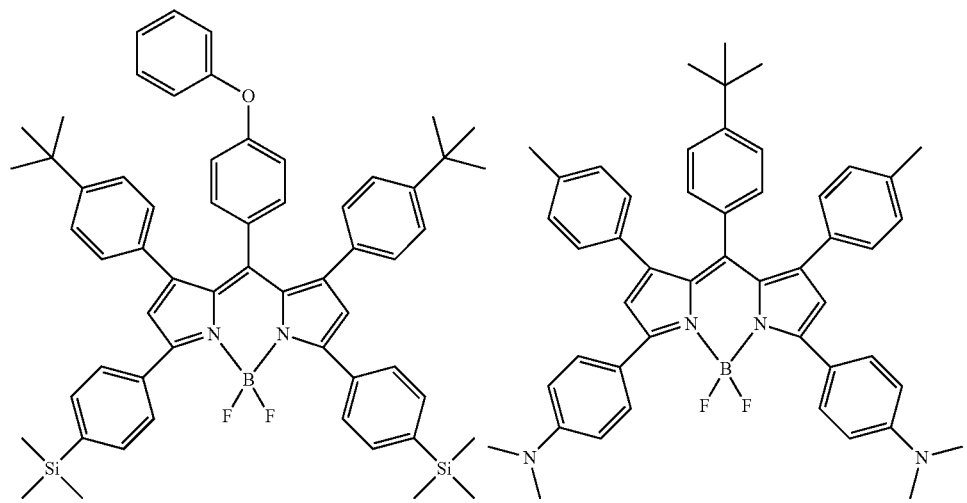
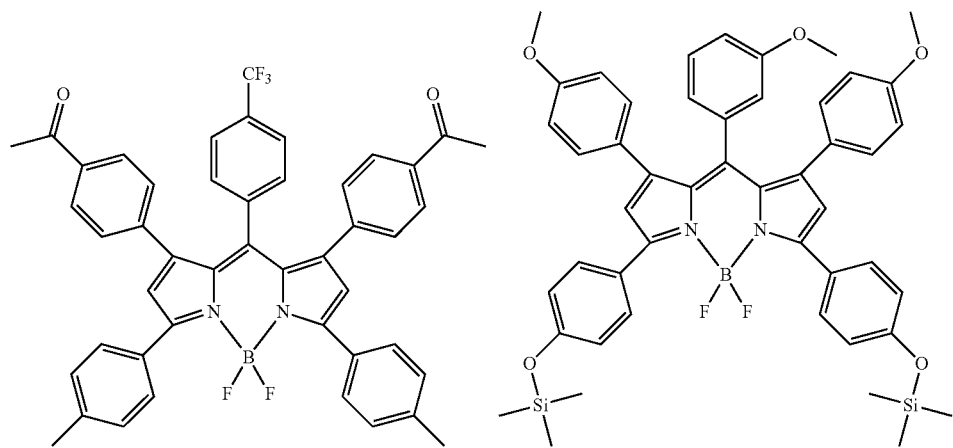

-continued
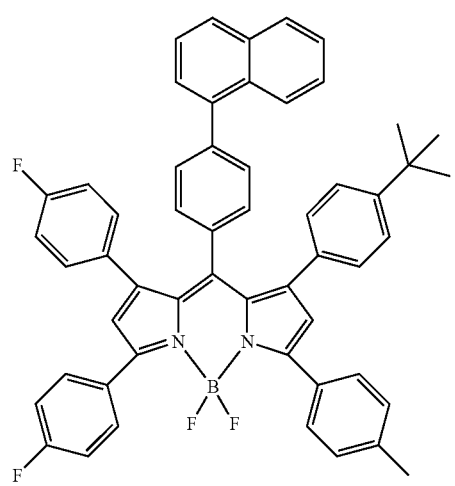
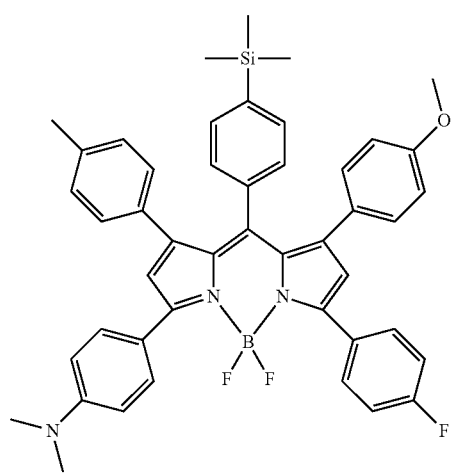
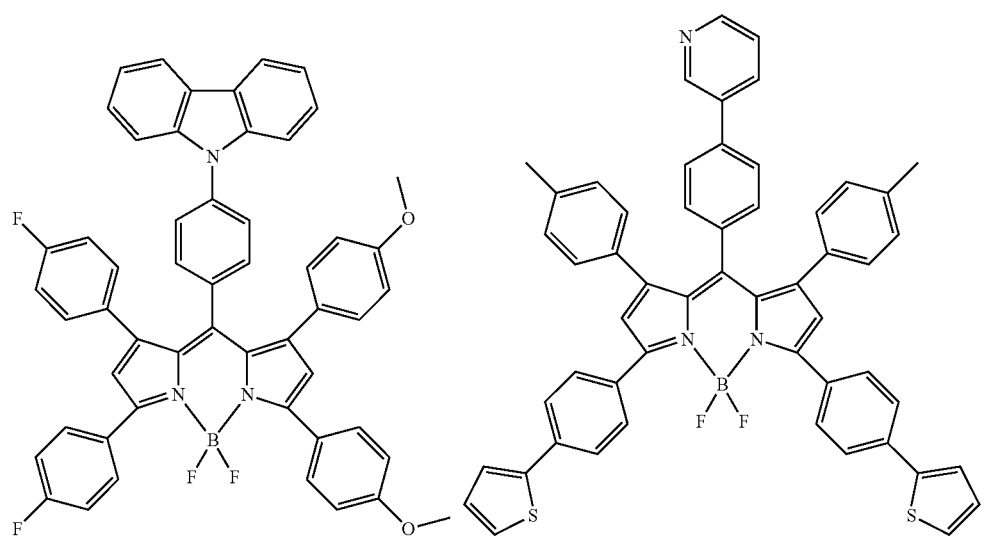
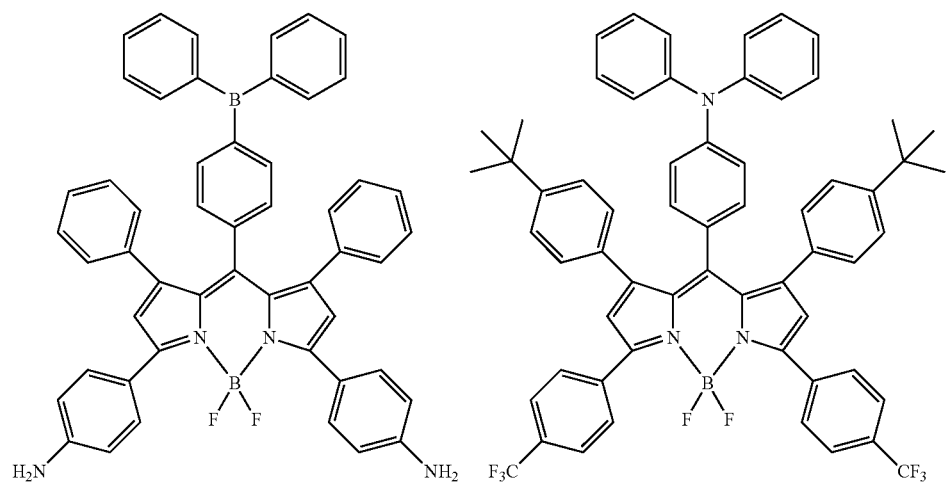

[Chem. 26]
-continued
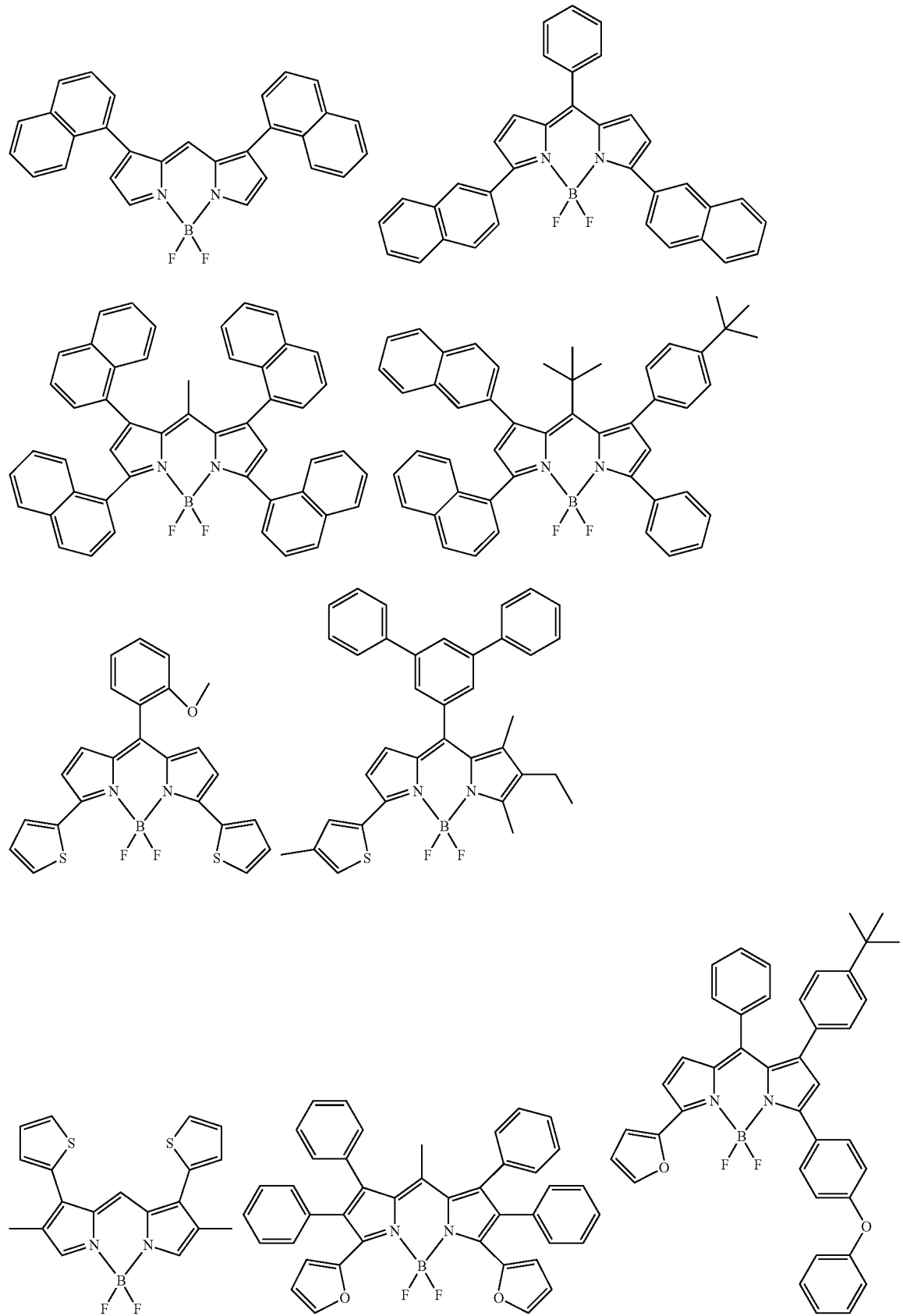

-continued
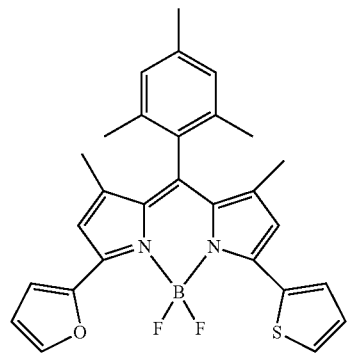
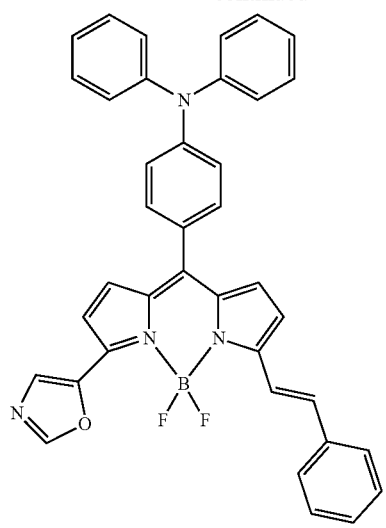
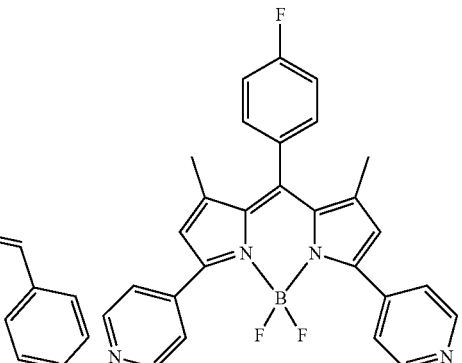
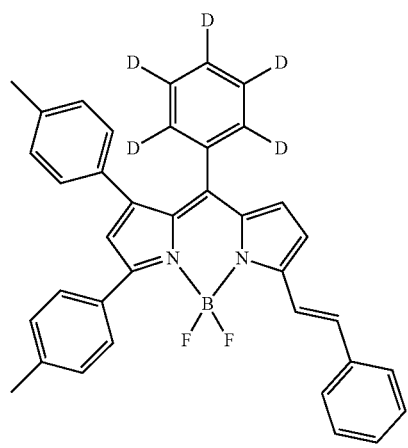
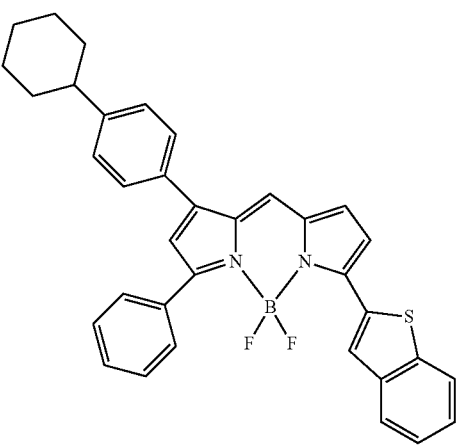
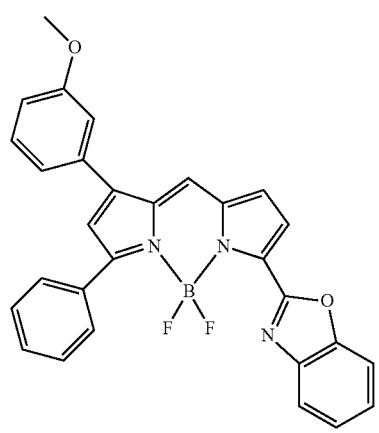

[Chem. 27]
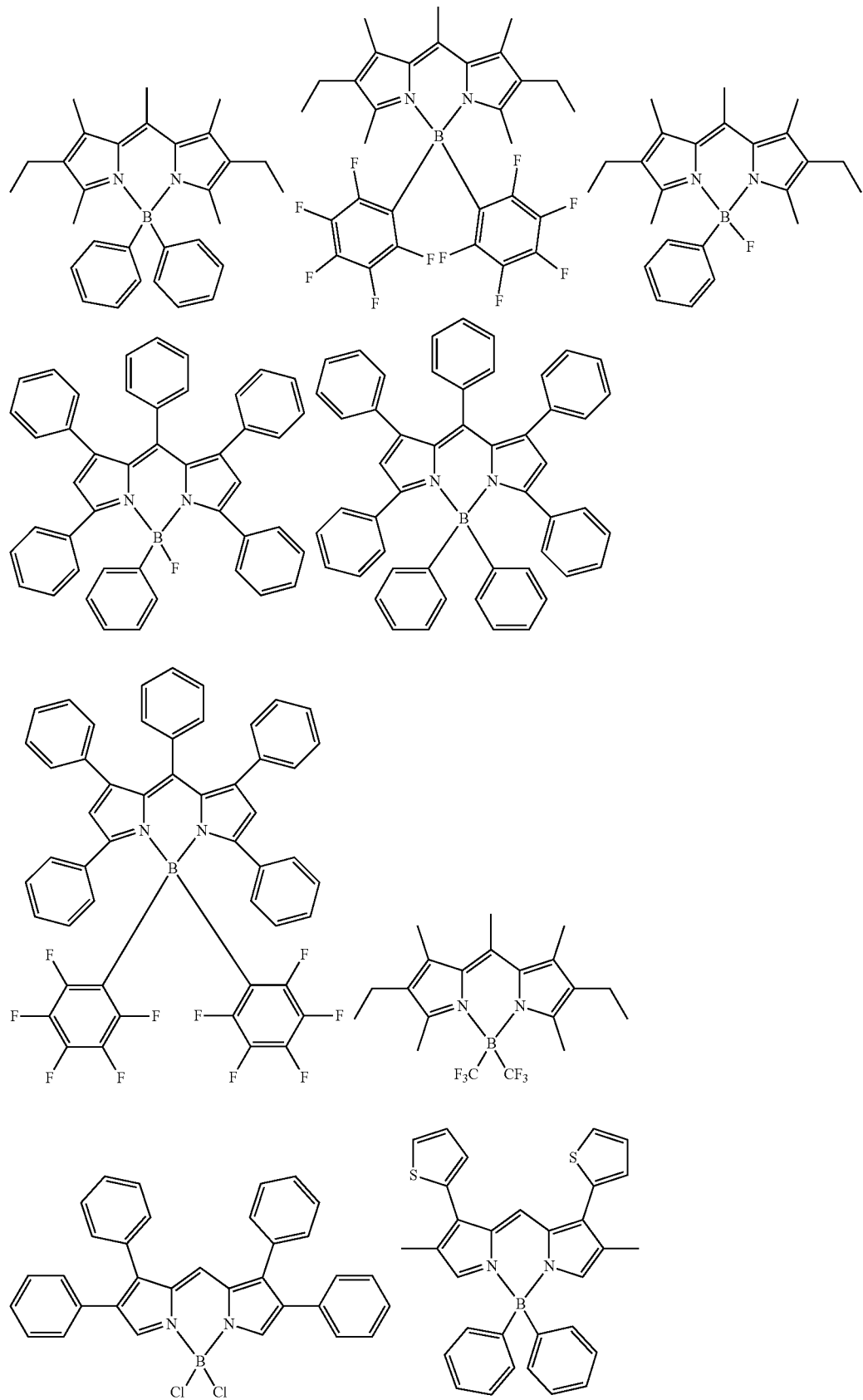

-continued
103
104
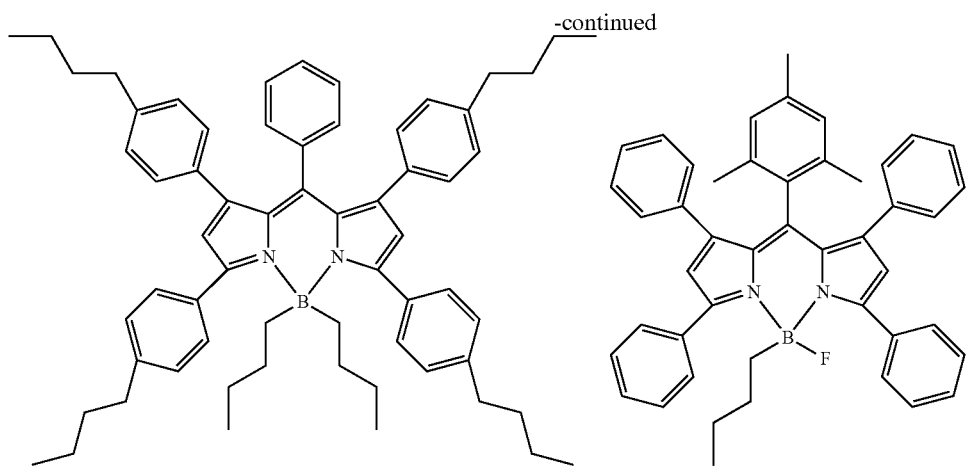
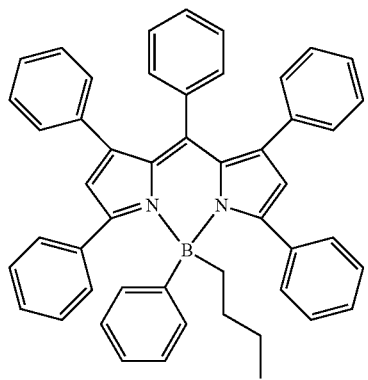
[Chem. 28]
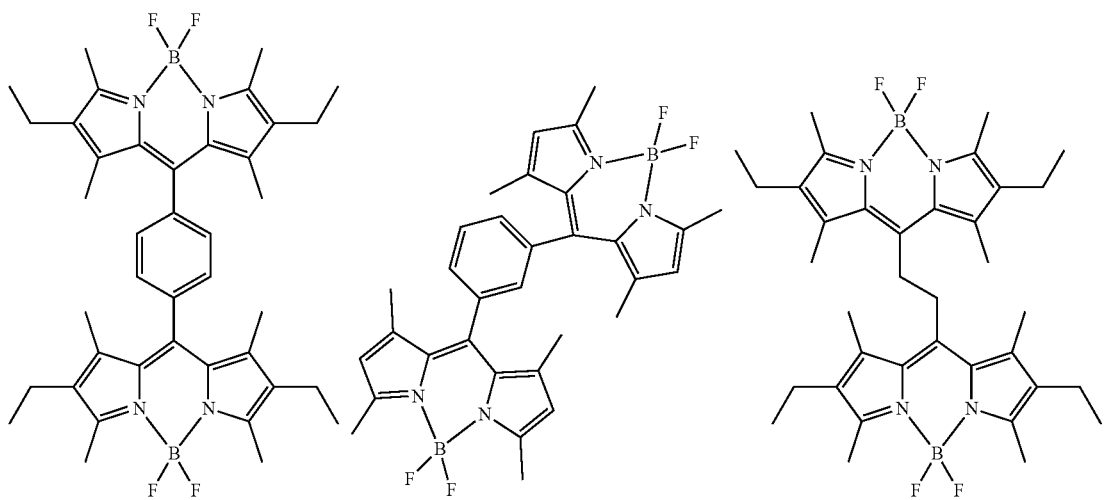

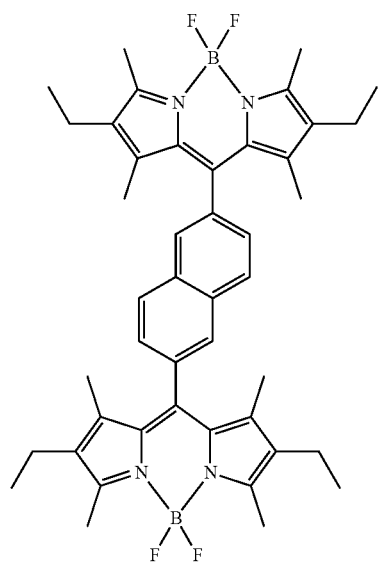
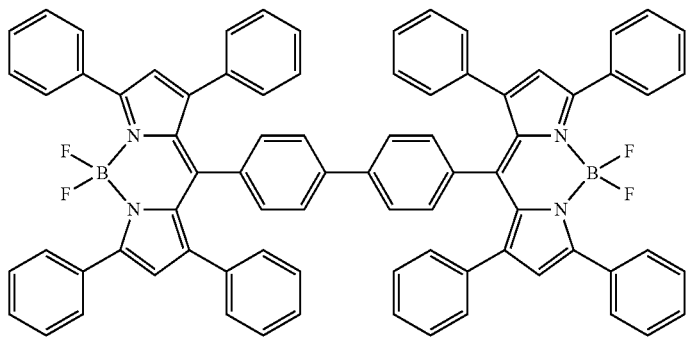
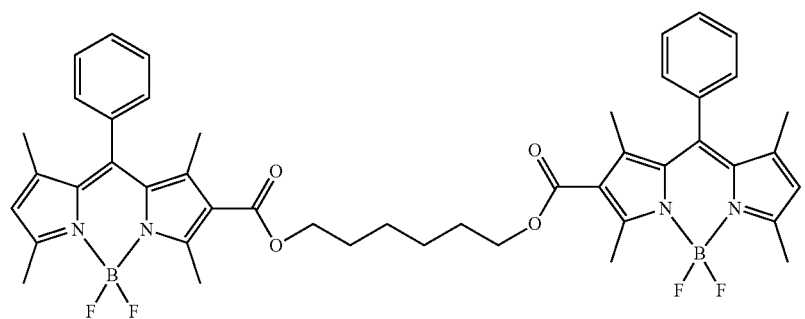
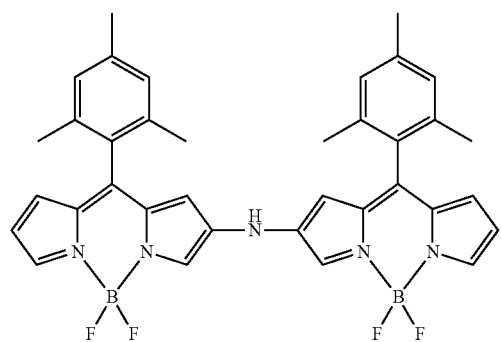
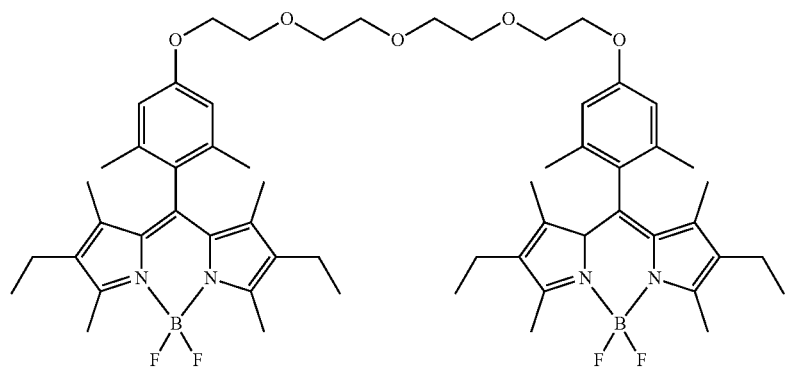

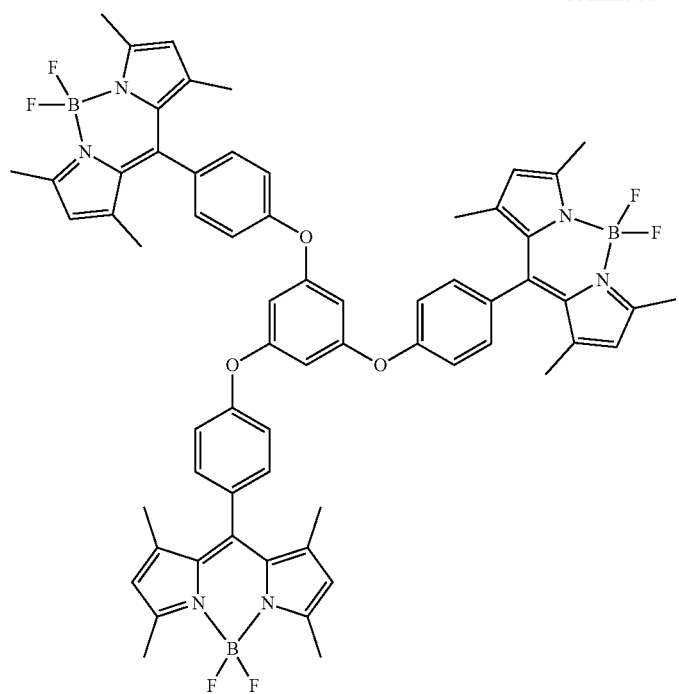
[Chem. 29]
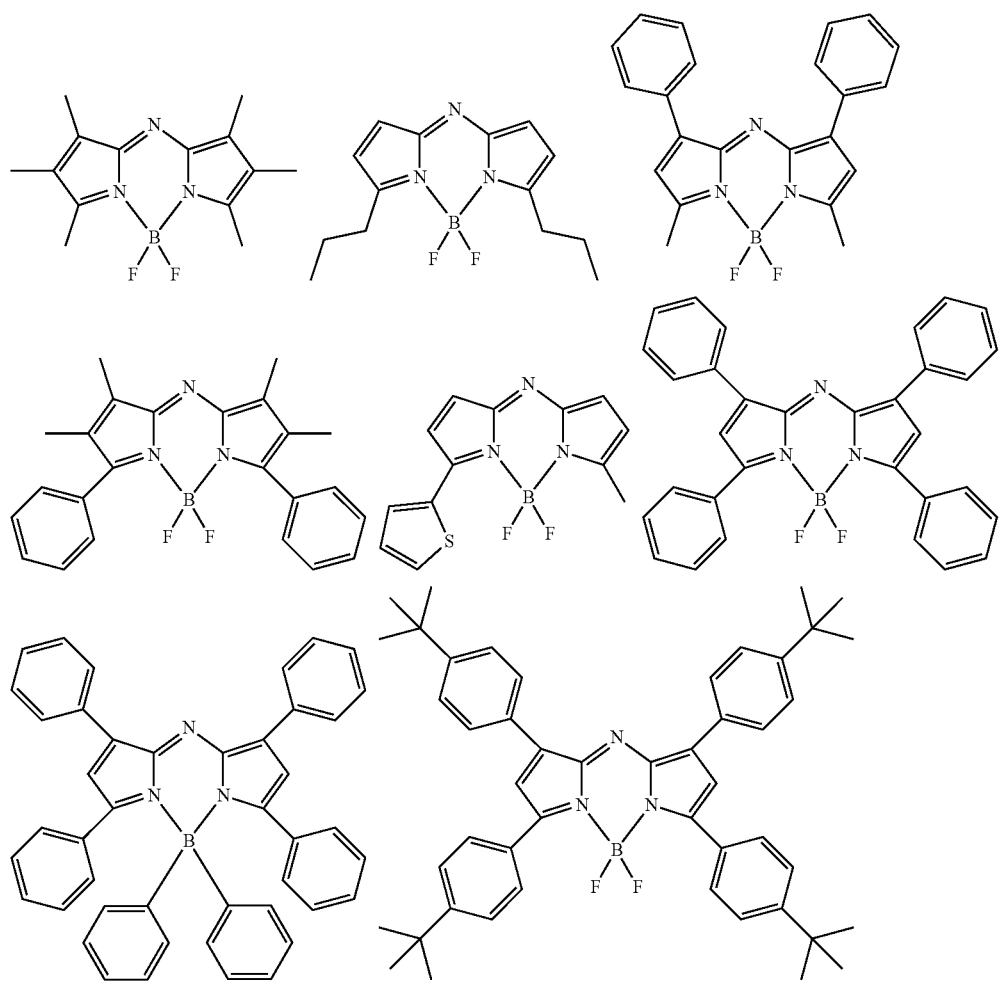

-continued
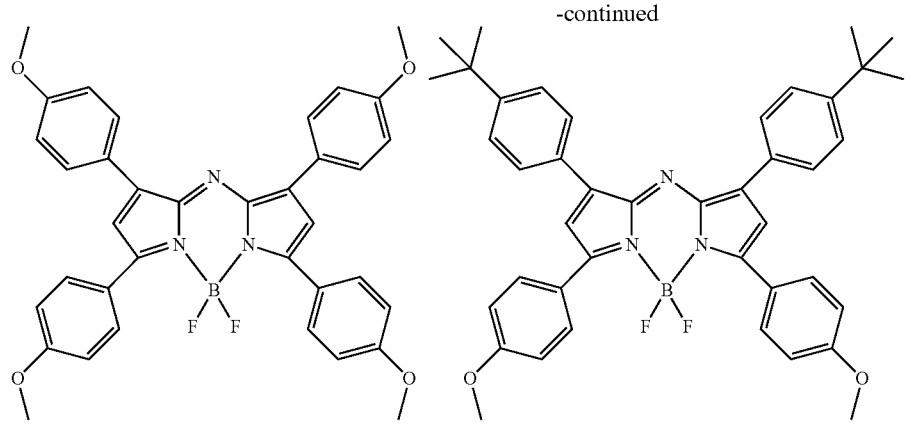
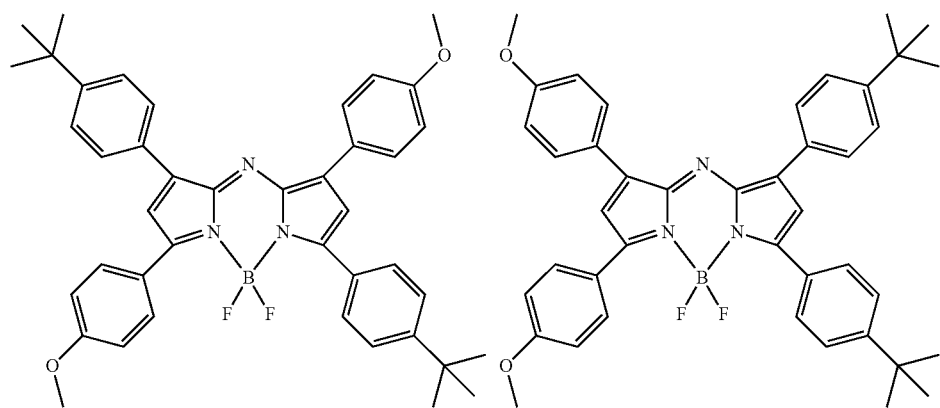
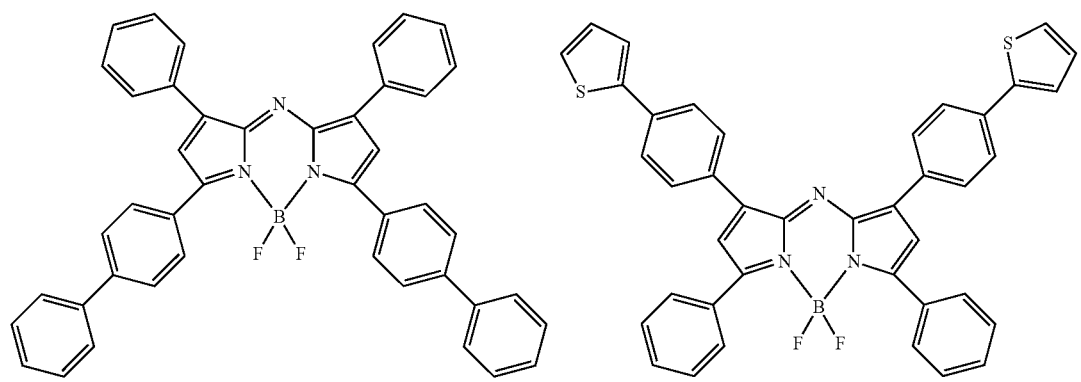
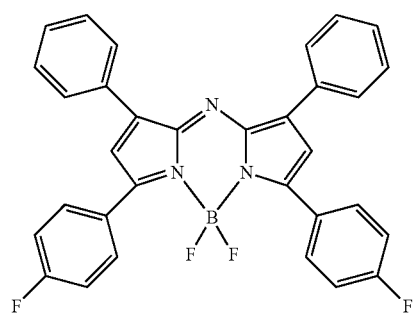

[Chem. 30]

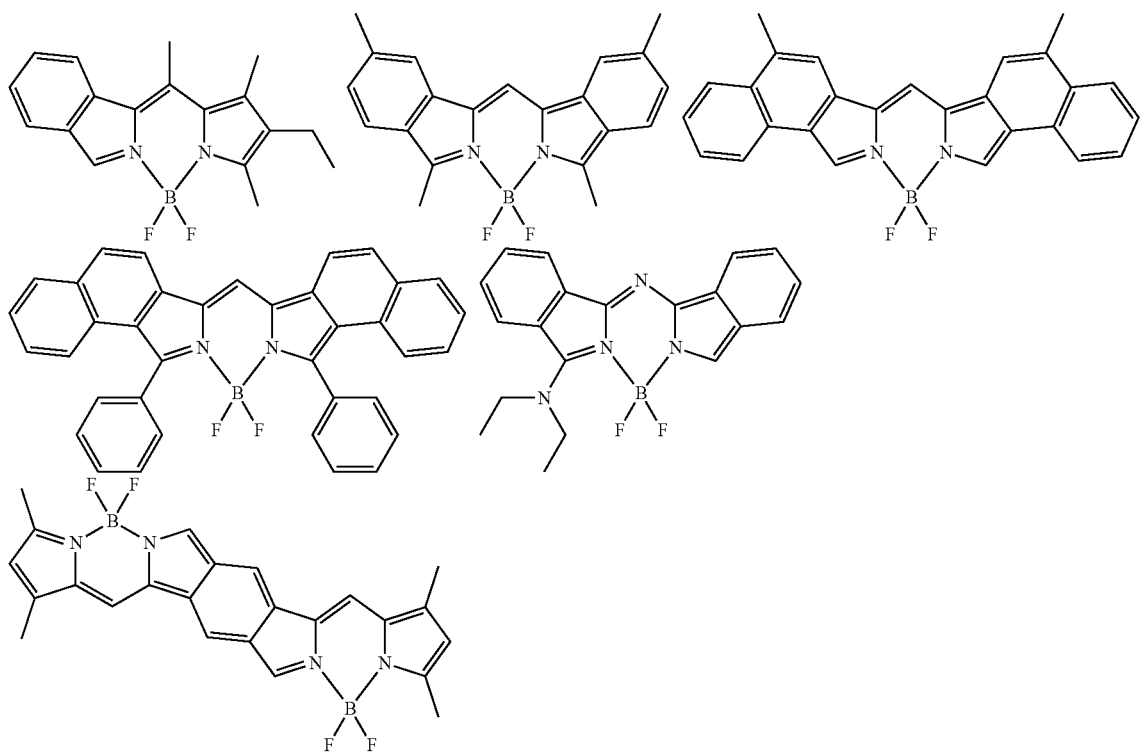

The compound represented by General Formula (5) can be produced by a method described in Japanese Translation of PCT Application No. H08-509471 and Japanese Patent Application Laid-open No. 2000-208262, for example. That is, a pyrromethene compound and a metal salt are allowed to react with each other in the presence of a base to obtain a target pyrromethene-based metal complex.

For the synthesis of a pyrromethene-boron fluoride complex, methods described in J. Org. Chem., vol. 64, No. 21, pp. 7813-7819 (1999), Angew. Chem., Int. Ed. Engl., vol. 36, pp. 1333-1335 (1997), and the like are referred to, whereby such a compound can be produced. Examples of the methods include, but are not limited to, a method that heats a compound represented by the following General Formula (8) and a compound represented by the following General Formula (9) in 1,2-dichloroethane in the presence of phosphoryl chloride and reacts them with a compound represented by the following General Formula (10) in 1,2-dichloroethane in the presence of triethylamine. Here, $R^1$ to $R^9$ are similar to those described above. J represents halogen.

[Chem. 31]

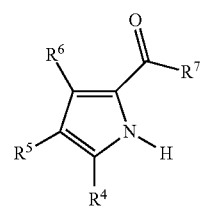

(8)

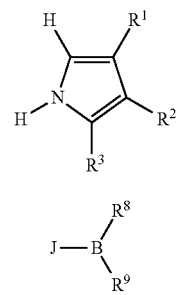

(9)

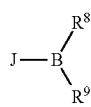

(10)

In addition, in introducing an aryl group or a heteroaryl group, there is a method that forms a carbon-carbon bond using a coupling reaction between a halogenated derivative and boronic acid or an esterified boronic acid derivative; the present invention is not limited to this method. Similarly, in introducing an amino group or a carbazolyl group, there is a method that forms a carbon-nitrogen bond using a coupling reaction between a halogenated derivative and an amine or a carbazole derivative in the presence of a metallic catalyst such as palladium, for example; the present invention is not limited to this method.

A color conversion composition according to the present invention can contain other compounds as appropriate as needed, in addition to the compound represented by General Formula (5). To further increase energy transfer efficiency to the compound represented by General Formula (5) from the excitation light, assist dopants such as rubrene may be contained, for example. When any light emission color other than the light emission color of the compound represented by General Formula (5) is desired to be added, the above-mentioned organic light-emitting material can be added. Other than the organic light-emitting material, known light-emitting materials such as inorganic fluorescent bodies, fluorescent pigments, fluorescent dyes, and quantum dots can be added in combination.

The following shows examples of the organic light-emitting material other than the compound represented by General Formula (5); the present invention is not limited particularly to these examples.

[Chem. 32]

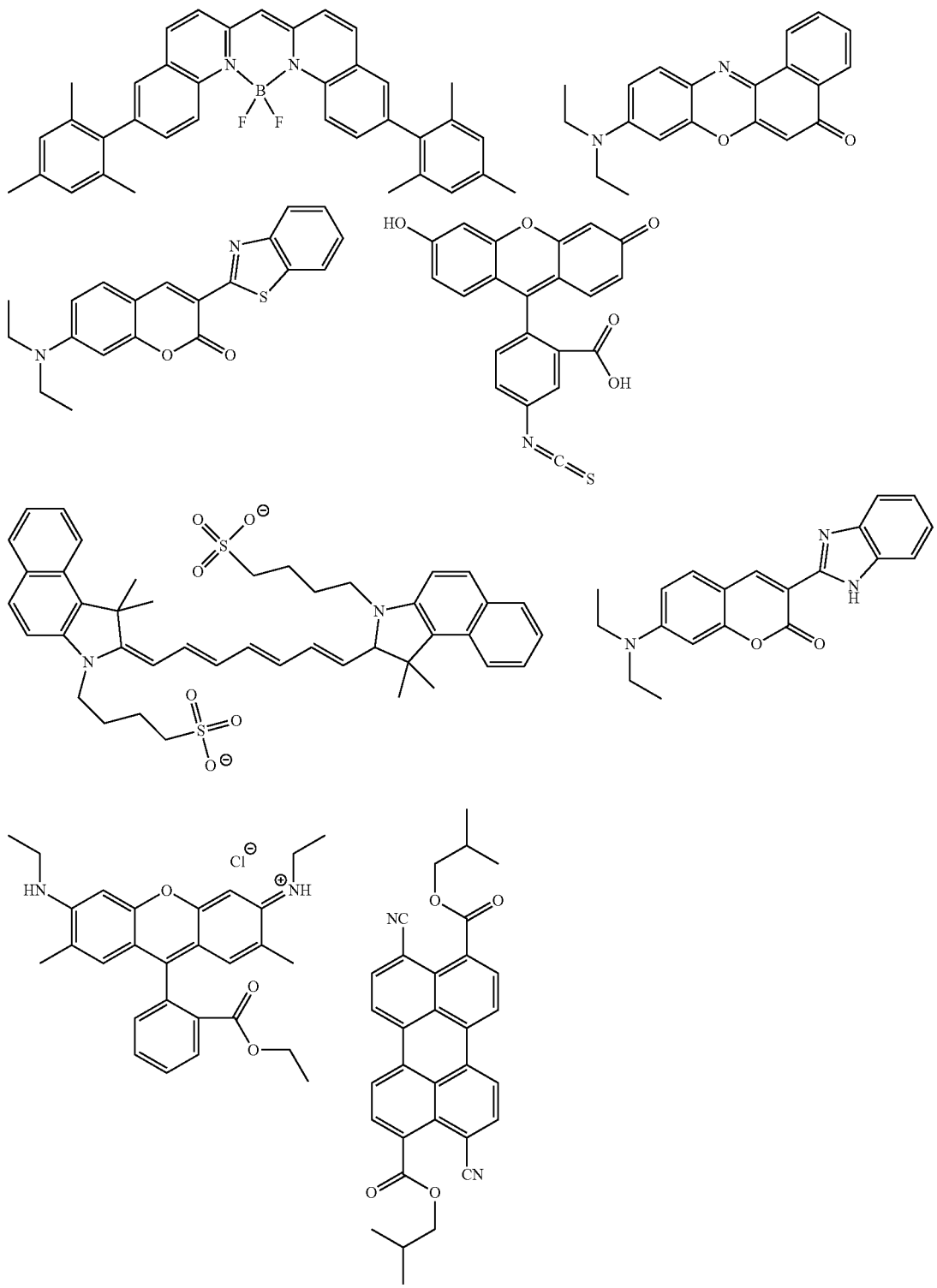

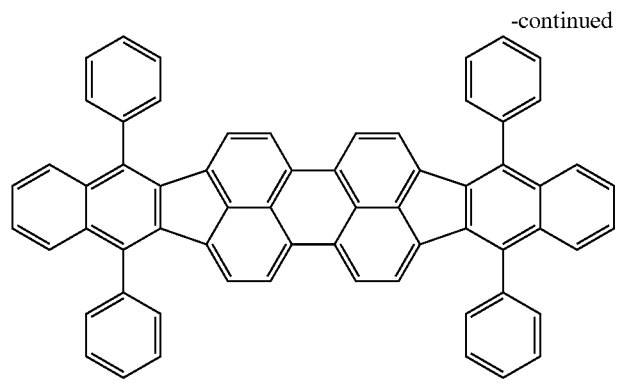
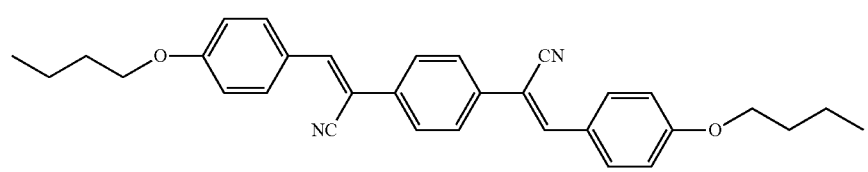
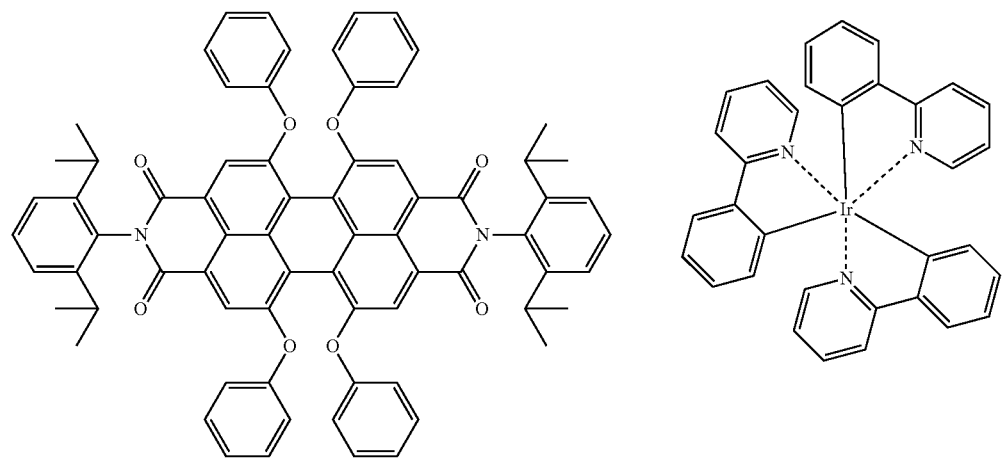
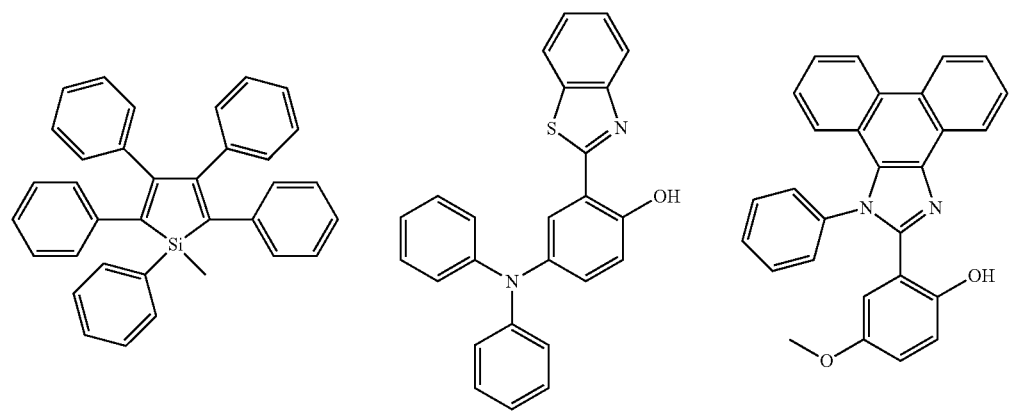

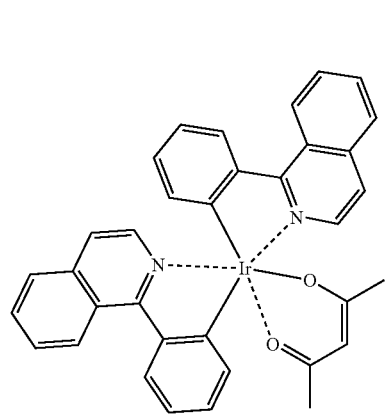
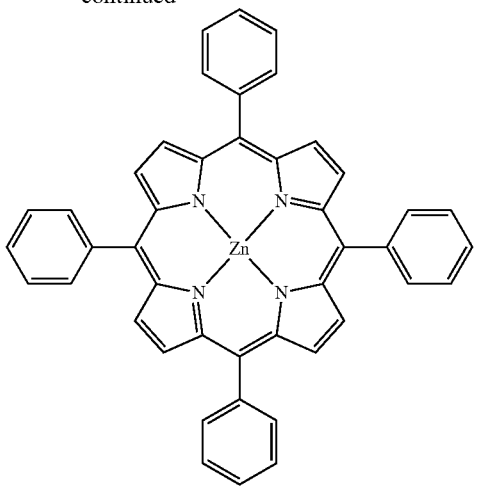
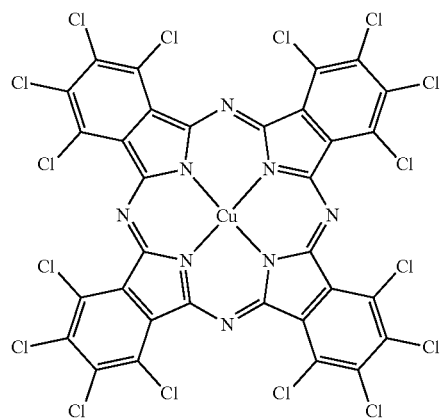

A color conversion composition according to the present invention preferably contains a light-emitting material that exhibits light emission having a peak wavelength observed in a region of 500 nm or more and 580 nm or less by using excitation light in a wavelength range of 430 nm or more and 500 nm or less (hereinafter referred to as a "light-emitting material (a)"). In the following, the light emission having a peak wavelength observed in a region of 500 nm or more and 580 nm or less is referred to as "green light emission". In general, the excitation light having larger energy is more likely to cause the decomposition of a material, but the excitation light in a wavelength range of 430 nm or more and 500 nm or less is relatively small in excitation energy. For this reason, the decomposition of the light-emitting material in the color conversion composition is not caused, and green light emission with favorable color purity can be obtained.

A color conversion composition according to the present invention preferably contains the light-emitting material (a) and a light-emitting material (b): a light-emitting material that exhibits light emission having a peak wavelength observed in a region of 580 nm or more and 750 nm or less by using excitation light in a wavelength range of 430 nm or more and 580 nm or less (hereinafter referred to as a "light-emitting material (b)"). In the following, the light emission having a peak wavelength observed in a region of 580 nm or more and 750 nm or less is referred to as "red light emission".

Part of the excitation light in a wavelength range of 430 nm or more and 500 nm or less passes partially through a color conversion sheet according to the present invention. Consequently, when a blue LED with a sharp emission peak is used together, sharp emission spectra are exhibited in the respective colors of blue, green, and red, and white light with good color purity can be obtained. Consequently, in displays in particular, a color gamut that has more vivid colors and is larger can be efficiently made. In lighting use, light emission characteristics in the green region and the red region in particular are improved compared with a white LED in which a blue LED and a yellow fluorescent body are combined with each other, which is currently in the mainstream, thus achieving a preferred white light source with an improved color-rendering property.

Preferred examples of the light-emitting material (a) include, but are not limited particularly to: coumarin derivatives such as coumarin 6, coumarin 7, and coumarin 153; cyanine derivatives such as indocyanine green; fluoresceine derivatives such as fluoresceine, fluoresceine isothiocyanate, and carboxyfluoresceine diacetate; phthalocyanine derivatives such as phthalocyanine green, perylene derivatives such as diisobutyl-4,10-dicyanoperylene-3,9-dicarboxylate; pyrromethene derivatives; stilbene derivatives; oxazine derivatives; naphthalimide derivatives; pyrazine derivatives; benzimidazole derivatives; benzoxazole derivatives; benzothiazole derivatives; imidazopyridine derivatives; azole derivatives; compounds having a condensed aryl ring such as anthracene and derivatives thereof; aromatic amine derivatives; and organic metal complex compounds.

Preferred examples of the light-emitting material (b) include, but are not limited particularly to: cyanine derivatives such as 4-dicyanomethylene-2-methyl-6-(p-dimethylaminostyryl)-4H-pyran; rhodamine derivatives such as rhodamine B, rhodamine 6G, rhodamine 101, and sulforhodamine 101; pyridine derivatives such as 1-ethyl-2-(4-(p-dimethylaminophenyl)-1,3-butadienyl)-pyridinium-perchlorate; perylene derivatives such as N,N'-bis(2,6-diisopropylphenyl)-1,6,7,12-tetraphenoxyperylene-3,4:9,10-bis(dicarboximide); porphyrin derivatives; pyrromethene derivatives; oxazine derivatives; pyrazine derivatives; compounds having a condensed aryl ring such as naphthacene and dibenzodiindenoperylene and derivatives thereof; and organic metal complex compounds.

The amount of the component (A) contained in the color conversion composition according to the present invention depends on the molar extinction coefficient of the compound, the fluorescence quantum yield of the compound, the absorption intensity of the compound at an excitation wavelength, and the thickness and transmittance of a sheet to be prepared, and is usually $1.0 \times 10^{-4}$ parts by weight to 30 parts by weight, more preferably $1.0 \times 10^{-3}$ parts by weight to 10 parts by weight, particularly preferably $1.0 \times 10^{-2}$ parts by weight to 5 parts by weight, relative to 100 parts by weight of the component (B).

In cases where the color conversion composition contains both the light-emitting material (a) and the light-emitting material (b), part of the green emission is converted to red emission, and thus, the amount $w_a$ of the light-emitting material (a) and the amount $w_b$ of the light-emitting material (b) preferably have the relationship $w_a \geq w_b$, and the content ratio between the materials is $w_a : w_b = 1000:1$ to $1:1$, more preferably $500:1$ to $2:1$, particularly preferably $200:1$ to $3:1$. Here, $w_a$ and $w_b$ are based on the weight percent relative to the weight of the component (B).

<Component (B): Resin Whose Molecular Structure has a Fluorene Skeleton>

The resin as the component (B) in the present invention is a matrix resin whose molecular structure contains a fluorene skeleton.

The light-emitting material contained in a color conversion composition according to the present invention is excited by light, the light-emitting material in an excited state is highly reactive, and thus, the light-emitting materials in an excited state are deteriorated in a facilitated manner when coming closer to each other. Thus, in order to improve the durability of the light-emitting material contained in a color conversion composition according to the present invention, the light-emitting material is preferably well dispersed without being aggregated in the resin.

Allowing the component (B) in the present invention to contain a fluorene skeleton facilitates the dispersion stabilization of a light-emitting material as the component (A) and can improve the durability. In this regard, this effect is further increased by allowing the component (A) to contain a compound represented by General Formula (5).

A method of producing a resin that contains a fluorene skeleton and serves as the component (B) contained in the color conversion composition according to the present invention is not limited to any method, and such a resin can be obtained by radical polymerization or polycondensation.

The resin as the component (B) in the present invention is, without particular limitation, any of those which contain a fluorene skeleton, and, in view of transparency and heat resistance, preferably contains one or more resins selected from a polyester resin, a (meth)acrylic resin, a polycarbonate resin, and an epoxy resin, more preferably a polyester resin.

A monomer included in the resin as the component (B) in the present invention can be selected in accordance with the type of the resin, and examples include polyols (for example, diols) containing a fluorene skeleton, polyamines (for example, diamines) containing a fluorene skeleton, polycarboxylic acids (for example, dicarboxylic acids) containing a fluorene skeleton, and the like.

(1) Polyester Resin

A polyester resin that has a fluorene skeleton and is a form of the component (B) in the present invention is, without particular limitation, any of the polyester resins at least part of which has a structure containing a fluorene skeleton, and for example, it is necessary only to use a monomer in which at least one of a diol component and a dicarboxylic acid component has a fluorene skeleton. In addition, part of a diol component or a dicarboxylic acid component may contain a monomer having no fluorene skeleton.

Specific examples of a structure of a polyester resin containing a fluorene skeleton include General Formulae (1) to (3).

[Chem. 33]

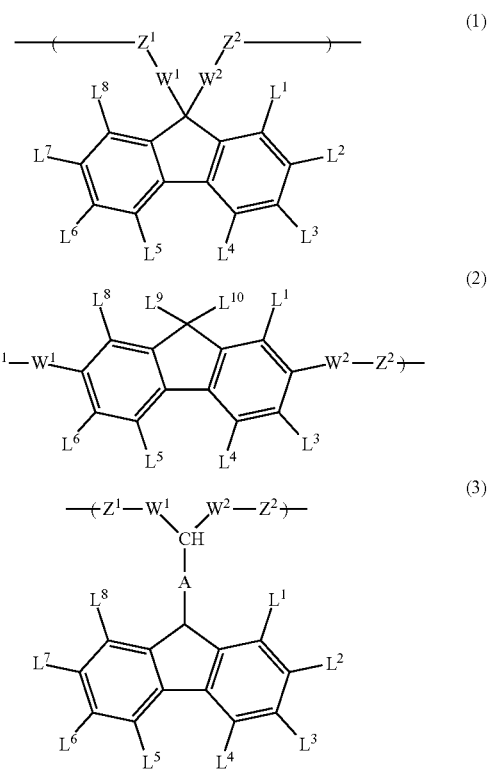

$Z^1$ and $Z^2$ are each oxygen or a carbonyl group.

$L^1$ to $L^{10}$ are independently a group selected from a hydrogen atom, an alkyl group, a cycloalkyl group, a heterocyclic group, an alkenyl group, a cycloalkenyl group, a cycloalkoxy group, an alkynyl group, a hydroxy group, a thiol group, an alkoxy group, an alkylthio group, an aryl ether group, an aryl thioether group, an aryl group, an aryloxy group, an aralkyloxy group, an acyl group, an alkoxycarbonyl group, an aryloxycarbonyl group, a heteroaryl group, halogen, a cyano group, an aldehyde group, a carboxyl group, an oxycarbonyl group, a carbamoyl group, an amino group, a dialkylamino group, a nitro group, a silyl group, a siloxanyl group, a boryl group, a phosphine oxide group, and a condensed ring and an aliphatic ring formed between adjacent substituents.

$W^1$ and $W^2$ are independently a group selected from a single bond, an alkylene group, a cycloalkylene group, an alkenylene group, a cycloalkenylene group, an alkynylene group, an arylene group, and a heteroarylene group.

In view of the heat resistance of the resin and the dispersion stability with the light-emitting material, $L^9$ and $L^{10}$ are preferably substituted or unsubstituted aryl groups, and $W^1$ and $W^2$ are preferably substituted or unsubstituted arylene groups.

A is a single bond or an alkylene group.

Examples of dicarboxylic acid components that can be used include aliphatic dicarboxylic acids, alicyclic dicarboxylic acids, aromatic dicarboxylic acids, and ester-forming derivatives.

The dicarboxylic acid component can be selected in accordance with the performance requirements of the resin, and may be used singly or in combination of two or more kinds thereof. Examples of ester-forming derivatives include esters, acid halides, acid anhydrides, and the like.

Examples of aliphatic dicarboxylic acids include oxalic acids, malonic acids, succinic acids, adipic acids, azelaic acids, sebacic acids, decanedicarboxylic acids, and the like.

Examples of alicyclic dicarboxylic acid components include cycloalkanedicarboxylic acids, di- or tri-cycloalkanedicarboxylic acids, and the like, and specific examples thereof include 1,4-cyclohexanedicarboxylic acid, 2,6-decalindicarboxylic acid, 1,4-decalindicarboxylic acid, 1,5-decalindicarboxylic acid, and the like.

Examples of aromatic dicarboxylic acid components include benzenedicarboxylic acids (for example, C1-4 alkyl-benzenedicarboxylic acids such as terephthalic acid, isophthalic acid, phthalic acid, methylterephthalic acid, and methylisophthalic acid), naphthalenedicarboxylic acids (for example, 1,5-naphthalenedicarboxylic acid and 2,6-naphthalenedicarboxylic acid), arylarenedicarboxylic acids (for example, 4,4'-biphenyldicarboxylic acid), diarylalkanedicarboxylic acids (for example, 4,4'-diphenylmethanedicarboxylic acid), diarylketonedicarboxylic acids (for example, 4,4'-diphenylketonedicarboxylic acid), dicarboxylic acids having a fluorene skeleton {for example, 9,9-di(carboxyalkyl)fluorene [for example, 9,9-di(carboxy C1-4 alkyl)fluorene such as 9,9-di(carboxymethyl)fluorene or 9,9-di(2-carboxyethyl)fluorene], 9,9-bis(carboxyaryl)fluorene [for example, 9,9-bis(4-carboxyphenyl)fluorene], dicarboxyfluorene (for example, 2,7-dicarboxyfluorene), 9,9-dialkyl-dicarboxyfluorene (for example, 2,7-dicarboxy-9,9-dimethylfluorene)}, and the like.

Besides these, 9,9-dialkylfluorene-2,7-dicarboxylic acid can also be used. The alkyl group at the 9-position of 9,9-dialkylfluorene-2,7-dicarboxylic acid is a C1-10 alkyl group, preferably a C1-10 linear alkyl group such as a methyl group, an ethyl group, a propyl group, a butyl group, a pentyl group, a hexyl group, a heptyl group, or an octyl group. In particular, the alkyl group at the 9-position is preferably a methyl group in view of improving the dispersibility of the light-emitting material.

The dicarboxylic acid component contained in a resin composition according to the present invention is preferably the above-mentioned dicarboxylic acid that has a fluorene skeleton and is represented by one of General Formulae (1) to (3) in view of the heat resistance. Among others, General Formulae (2) and (3) are preferable in view of polymerizability. Here, in cases where the dicarboxylic acid component contains an aromatic dicarboxylic acid component as a main component, the ratio of the aromatic dicarboxylic acid component to the whole dicarboxylic acid component may be preferably 50 mol % or more, more preferably 70 mol % or more, still more preferably 80 mol % or more, still more preferably 90 mol % or more.

Examples of diol components include aliphatic diols, alicyclic diols, aromatic diols, and the like. Specific examples of aliphatic diols include: C2-10 alkanediols such as ethylene glycol, 1,2-propanediol, 1,3-propanediol, neopentyl glycol, 1,2-butanediol, 1,3-butanediol, 1,4-butanediol, 1,4-pentanediol, 1,5-pentanediol, 1,3-pentanediol, 1,6-hexanediol, nonanediol, dimer diol, 2-methyl-1,3-propanediol, 3-methyl-1,5-pentanediol, and 2-butyl-2-ethyl-1,3-propanediol; polyols such as polyethylene glycol, polypropylene glycol, and polytetramethylene glycol; and the like.

Examples of alicyclic diols include C5-8 cycloalkanediols such as cyclohexanediol, di(hydroxy C1-4 alkyl) C5-8 cycloalkane) such as cyclohexanedimethanol, and tricyclodecanedimethanol.

Examples of aromatic diols include: dihydroxyarenes such as hydroquinone and resorcinol; di(hydroxy C1-4 alkyl) C6-10 arenes such as 1,4-benzenedimethanol and 1,3-benzenedimethanol; bisphenols such as bisphenol A; diols that contain a fluorene skeleton and are represented by General Formula (1); and the like. These may be used singly or in combination of two or more kinds thereof.

The structure of a diol component containing a fluorene skeleton can be represented, for example, by one of General Formulae (1) to (3). Among others, preferable examples of groups as $L^1$ to $L^{10}$ include alkyl groups (for example, C1-6 alkyl groups), cycloalkyl groups (for example, C5-8 cycloalkyl groups), aryl groups (for example, C6-10 aryl groups), aralkyl groups (for example, C6-8 aryl-C1-2 alkyl groups), alkoxy groups (for example, C1-4 alkoxy groups), and the like. Examples of more preferable groups include alkyl groups (for example, C1-4 alkyls (methyl in particular)), aryl groups (for example, C6-10 aryl groups (phenyl group in particular)), and the like.

Examples of diols having a fluorene skeleton include; 9,9-bis(hydroxy(poly)alkoxy phenyl)fluorenes; compounds having a 9,9-bis(hydroxy(poly)alkoxyphenyl)fluorene skeleton; 9,9-bis(hydroxy(poly)alkoxynaphthyl)fluorenes; compounds having a 9,9-bis(hydroxy(poly)alkoxynaphthyl) fluorene skeleton; and the like.

Examples of 9,9-bis(hydroxy(poly)alkoxyphenyl)fluorenes include: 9,9-bis(hydroxyalkoxyphenyl)fluorenes such as 9,9-bis(hydroxyalkoxyphenyl)fluorene, 9,9-bis(alkyl-hydroxyalkoxyphenyl)fluorene, and 9,9-bis(aryl-hydroxyalkoxyphenyl)fluorene; and the like.

In addition, examples of 9,9-bis(hydroxy(poly) alkoxynaphthyl)fluorenes include compounds which correspond to the above-mentioned 9,9-bis(hydroxy(poly) alkoxyphenyl)fluorenes and in which a phenyl group is substituted by a naphthyl group, for example, 9,9-bis(hydroxypolyalkoxynaphthyl)fluorenes such as 9,9-bis(hydroxyalkoxynaphthyl)fluorene.

Besides these, fluorene-9,9-dialcohols can also be used. The alcohol at the 9-position of fluorene-9,9-dialcohol is a C1-3 alkyl alcohol (that is, a hydroxyalkyl group), and is suitably a hydroxymethyl group, a 2-hydroxyethyl group, a 3-hydroxypropyl group, or the like. In particular, a hydroxymethyl group is preferable in view of improving the dispersibility of the light-emitting material.

Examples of diol components having a fluorene skeleton include General Formulae (1) to (3), and in particular, such a diol suitably has a fluorene skeleton represented by General Formula (1), in view of polymerizability and the compatibility with the light-emitting material.

The diol having a fluorene skeleton may be used singly or in combination of two or more kinds thereof.

The above-mentioned diol component may be formed only by the above-mentioned diol having a fluorene skeleton, or may contain a diol having a fluorene skeleton and another diol component (a non-fluorene diol component) such as an aliphatic diol component.

The non-fluorene diol component may be used singly or in combination of two or more kinds thereof.

Among these, an aliphatic diol, particularly an aliphatic diol component having a low molecular weight, such as an alkane diol (for example, a C2-4 alkanediol such as ethylene glycol), is preferable in view of the heat resistance.

In the diol component, the ratio of a diol having a fluorene skeleton is preferably 30 mol % or more respective to the whole diol component. Allowing the ratio to be 30 mol % or more improves the effect of dispersion stability for the light-emitting material and can improve the durability of the light-emitting material. In order to further improve this effect, the ratio of a diol having a fluorene skeleton in the diol component is more preferably 50 mol % or more, still more preferably 80 mol % or more, particularly preferably 90 mol % or more, respective to the whole diol component.

In the above-mentioned polyester resin, $L^9$ and $L^{10}$ are preferably substituted or unsubstituted aryl groups, and $W^1$ and $W^2$ are preferably substituted or unsubstituted arylene groups, in view of the heat resistance of the resin and the dispersion stability with the light-emitting material.

A polyester resin that has a fluorene skeleton and is contained in a resin composition in the present invention can be produced by a known reaction method, and can be produced, for example, by allowing the above-mentioned dicarboxylic acid component to react (be polymerized or condensed) with the above-mentioned diol component. A polymerization method (production method) can suitably be selected in accordance with, for example, the type of a dicarboxylic acid component to be used, and examples of such methods include a commonly used method, for example, a melt polymerization method (method in which a dicarboxylic acid component and a diol component are polymerized under melt-mixing), a solution polymerization method, an interfacial polymerization method, and the like. A preferable method is a melt polymerization method.

Examples of commercially available products include, but are not limited to, "OKP" (registered trademark) 4 and "OKP" (registered trademark)-A1, which are manufactured by Osaka Gas Chemicals Co., Ltd.

(2) (Meth)Acrylic Resin

The resin composition according to the present invention may contain a (meth)acrylic resin. The (meth)acrylic resin is, without particular limitation, a (meth)acrylic resin part of which has a structure containing a fluorene skeleton, and examples of such (meth)acrylic resins containing a fluorene skeleton include a resin represented by General Formula (4).

[Chem. 34]

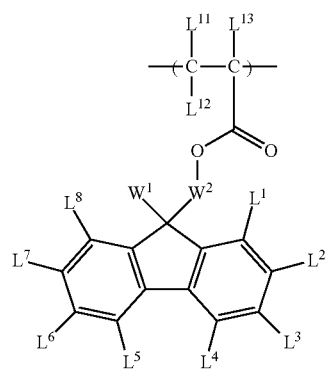

(4)

$L^1$ to $L^8$ are independently selected from a hydrogen atom, an alkyl group, a cycloalkyl group, a heterocyclic group, an alkenyl group, a cycloalkenyl group, a cycloalkoxy group, an alkynyl group, a hydroxy group, a thiol group, an alkoxy group, an alkylthio group, an aryl ether group, an aryl thioether group, an aryl group, an aryloxy group, an aralkyloxy group, an acyl group, an alkoxycarbonyl group, an aryloxycarbonyl group, a heteroaryl group, halogen, a cyano group, an aldehyde group, a carboxyl group, an oxycarbonyl group, a carbamoyl group, an amino group, a dialkylamino group, a nitro group, a silyl group, a siloxanyl group, a boryl group, a phosphine oxide group, and a condensed ring and an aliphatic ring formed between adjacent substituents.

$L^{11}$ to $L^{13}$ are independently selected from a hydrogen atom, an alkyl group, a cycloalkyl group, a cycloalkoxy group, and an aryl group.

$W^1$ and $W^2$ are independently a group selected from a single bond, an alkylene group, a cycloalkylene group, an alkenylene group, a cycloalkenylene group, an alkynylene group, an arylene group, and a heteroarylene group.

In view of the heat resistance of the resin and the dispersion stability with the light-emitting material, $W^1$ and $W^2$ are preferably substituted or unsubstituted arylene groups.

In addition, the above-mentioned (meth)acrylic resin may further contain a non-fluorene monomer.

Examples of the above-mentioned non-fluorene monomers include monofunctional (meth)acrylate alkyl(meth)acrylate, branched alkyl(meth)acrylate, alicyclic (meth)acrylate, aromatic (meth)acrylate, aryloxyalkyl(meth)acrylate, aryloxy(poly)alkoxyalkyl(meth)acrylate, alkylaryloxy(poly)alkoxyalkyl(meth)acrylate, arylthio(meth)acrylate, aralkylthio(meth)acrylate, arylthioalkyl(meth)acrylate, and the like.

A (meth)acrylic resin that has a fluorene skeleton and is contained in a resin composition in the present invention can be produced by a known method, and can be obtained, for example, by polymerizing the above-mentioned fluorene-skeleton-containing monomer using a free-radical initiator. Examples of commercially available products include, but are not limited to, "OGSOL" (registered trademark) EA-0200 and "OGSOL" (registered trademark) EA-F5710, which are manufactured by Osaka Gas Chemicals Co., Ltd.

(3) Polycarbonate Resin

The resin composition according to the present invention may further contain a polycarbonate resin. The polycarbonate resin is, without particular limitation, a polycarbonate resin part of which has a structure containing a fluorene skeleton, and examples of such polycarbonate resins include resins represented by General Formulae (1) and (2). $Z^1$, $Z^2$, $L^1$ to $L^{10}$, $W^1$, and $W^2$ have the same meaning as above-mentioned.

In view of the heat resistance of the resin and the dispersion stability with the light-emitting material, $L^9$ and $L^{10}$ are preferably substituted or unsubstituted aryl groups, and $W^1$ and $W^2$ are preferably substituted or unsubstituted arylene groups.

The polycarbonate resin can be produced by a known method, and can be obtained, for example, by allowing a phosgen or a carbonate to react with a diol component.

In a method in which a phosgen is used, a diol component is usually allowed to react with a phosgen in the presence of an alkali compound such as a hydroxide (sodium hydroxide, potassium hydroxide, or the like) and a solvent such as methylene chloride or chlorobenzene. In this case, for example, a catalyst such as a tertiary amine or a quaternary ammonium salt can also be used to expedite the reaction.

In a method in which a carbonate is used, a diol component is allowed to react with a carbonate under heating in an inert gas atmosphere, and the produced alcohol or phenol is removed by evaporation. In this case, a catalyst that is usually used for transesterification can also be used to expedite the reaction.

Examples of phosgens include phosgen, diphosgen, triphosgen, and the like. Examples of carbonates include: dialkyl carbonates such as dimethyl carbonate and diethyl carbonate; and diaryl carbonates such as diphenyl carbonate and dinaphthyl carbonate. Among these, phosgen and diphenyl carbonate are preferably used. Phosgens and carbonates may be used singly or in combination of two or more kinds thereof.

Such a usable diol component having a fluorene skeleton is the same as above-mentioned in the section on the polyester resin. The diol having a fluorene skeleton may be used singly or in combination of two or more kinds thereof.

The above-mentioned diol component may be formed only by the above-mentioned diol having a fluorene skeleton, or may contain a diol having a fluorene skeleton and another diol component (a non-fluorene diol component) such as an aliphatic diol component. Such a usable non-fluorene diol component is the same as above-mentioned in the section on the polyester resin.

An example of a commercially available polycarbonate having a fluorene skeleton is "Iupizeta" (registered trademark) EP Series manufactured by Mitsubishi Gas Chemical Company, Inc., and specific examples thereof include, but are not limited to, "Iupizeta" (registered trademark) EP-5000.

(4) Epoxy Resin

The resin composition according to the present invention may contain an epoxy resin. The epoxy resin is, without particular limitation, an epoxy resin part of which has a structure containing a fluorene skeleton, and examples of such epoxy resins include a resin having a structure represented by General Formula (1) or (3). The above-mentioned epoxy resin is not limited to any particular production method, and can be obtained, for example, by polymerizing an epoxy compound using a curing agent. An epoxy compound can also be obtained by allowing a dicarboxylic acid to react with, for example, an epihalohydrin (for example, an epichlorohydrin) having a halogen atom.

Examples of typical epoxy compounds which have a fluorene skeleton and in which $Z^1$ and $Z^2$ are carbonyl groups include: 9,9-bis(glycidyloxycarbonylalkyl)fluorenes such as 9,9-bis(glycidyloxycarbonylmethyl)fluorene, 9,9-bis(2-glycidyloxycarbonylethyl)fluorene, 9,9-bis(1-glycidyloxycarbonylethyl)fluorene, 9,9-bis(1-glycidyloxycarbonylpropyl)fluorene, 9,9-bis(2-glycidyloxycarbonylpropyl)fluorene, 9,9-bis(2-glycidyloxycarbonyl-1-methylethyl)fluorene, 9,9-bis(2-glycidyloxycarbonyl-1-methylpropyl)fluorene, 9,9-bis(2-glycidyloxycarbonylbutyl)fluorene, 9,9-bis(2-glycidyloxycarbonyl-1-methylbutyl)fluorene, and 9,9-bis(5-glycidyloxycarbonylpentyl)fluorene; 9,9-bis(glycidyloxycarbonylcycloalkyl) fluorenes such as 9,9-bis(glycidyloxycarbonylcyclohexyl)fluorene; 9,9-bis(diglycidyloxycarbonylalkyl)fluorenes; and the like.

Examples of typical epoxy compounds which have a fluorene skeleton and in which $Z^1$ and $Z^2$ are each oxygen include 9,9-bis(glycidyloxyaryl)fluorene, 9,9-bis(alkyl-glycidyloxyphenyl)fluorene[9,9-bis(4-glycidyloxy-3-methylphenyl)fluorene, 9-bis(4-glycidyloxy-3,5-dimethylphenyl)fluorene, 9,9-bis(arylglycidyloxyphenyl)fluorene, 9,9-bis(glycidyloxynaphthyl)fluorene, 9,9-bis(polyglycidyloxyaryl)fluorene, 9,9-bis(glycidyloxyalkoxyphenyl)fluorene, 9,9-bis(alkyl-glycidyloxyalkoxyphenyl)fluorene, 9,9-bis(arylglycidyloxyalkoxyphenyl)fluorene, 9,9-bis(glycidyloxyalkoxynaphthyl)fluorene, 9,9-bis[di- or tri-(glycidyloxyalkoxy)phenyl]fluorene, and the like.

Among these epoxy compounds having a fluorene skeleton, particularly preferable ones are; 9,9-bis(glycidyloxyaryl)fluorenes {for example, 9,9-bis(glycidyloxyphenyl)fluorene, 9,9-bis(alkylglycidyloxyphenyl)fluorene (for example, 9,9-bis(mono- or di-C1-4 alkylglycidyloxyphenyl)fluorene), 9,9-bis(arylglycidyloxyphenyl)fluorene (for example, 9,9-bis(mono- or di-C6-10 arylglycidyloxyphenyl)fluorene), 9,9-bis(glycidyloxynaphthyl)fluorene, and the like}, C2-4 alkyleneoxide adducts of 9,9-bis(glycidyloxyaryl)fluorenes [examples of such adducts including 9,9-bis(glycidyloxy C2-4 alkoxyphenyl)fluorene and the like]; and the like.

These epoxy compounds having a fluorene skeleton may be used singly or in combination of two or more kinds thereof.

In the epoxy resin, $W^1$ and $W^2$ are preferably substituted or unsubstituted arylene groups, in view of the heat resistance of the resin and the dispersion stability with the light-emitting material.

Examples of curing agents that can be used include amine curing agents, acid anhydride curing agents, phenol curing agents, and the like.

Examples of amine curing agents include: linear aliphatic polyamines such as ethylenediamine, hexamethylenediamine, diethylenetriamine, and triethylenetetramine; monocyclic aliphatic polyamines such as menthene diamine, isophoronediamine, bis(4-amino-3-methylcyclohexyl)methane, and 3,9-bis(3-aminopropyl)-2,4,8,10-tetraoxaspiro(5.5)undecane; bridge ring polyamines such as norbornanediamine; aromatic aliphatic polyamines such as xylylenediamine; aromatic amines such as meta-phenylene diamine and diaminodiphenylmethane; and the like.

Examples of acid anhydride curing agents include: aliphatic acid anhydrides such as dodecenyl succinic anhydride and polyadipic acid anhydride; alicyclic acid anhydrides such as tetrahydrophthalic anhydride, methyltetrahydrophthalic anhydride, hexahydrophthalic anhydride, methylhexahydrophthalic anhydride, methylhimic anhydride, and methylcyclohexenedicarboxylic acid anhydride; aromatic acid anhydrides such as phthalic anhydride, trimellitic anhydride, pyromellitic anhydride, and benzophenontetracarboxylic acid anhydride; and the like.

Examples of phenol curing agents include: phenol resins such as novolac resins such as phenol novolac resin and cresol novolac resin; and phenols having a fluorene skeleton, such as: 9,9-bis(hydroxyphenyl)fluorenes (for example, 9,9-bis(4-hydroxyphenyl)fluorenes and the like); 9,9-bis(hydroxyphenyl)fluorenes such as 9,9-bis(alkyl-hydroxyphenyl)fluorenes (for example, 9,9-bis(mono- or di-C1-4 alkyl-hydroxyphenyl)fluorenes such as 9,9-bis(4-hydroxy-3-methylphenyl) fluorene and 9,9-bis(4-hydroxy-3,5-dimethylphenyl)fluorene) and 9,9-bis(aryl-hydroxyphenyl)fluorene (for example, 9,9-bis(mono- or di-C6-10 aryl-hydroxyphenyl)fluorene such as 9,9-bis(4-hydroxy-3-phenylphenyl)fluorene); and 9,9-bis(hydroxynaphthyl)fluorenes such as 9,9-bis(6-hydroxy-2-naphthyl)fluorene. These curing agents may be used singly or in combination of two or more kinds thereof.

Examples of commercially available products include, but are not limited to, "OGSOL" (registered trademark) PG-100 manufactured by Osaka Gas Chemicals Co., Ltd.

The resin as the component (B) has a weight-average molecular weight (Mw) of 5,000 or more, preferably 15,000 or more, more preferably 20,000 or more, and 500,000 or less, preferably 100,000 or less, more preferably 50,000 or less. The weight-average molecular weight in this range makes it possible to obtain a color conversion composition having good compatibility with the light-emitting material and higher durability.

The weight-average molecular weights in the present invention are the values measured by gel permeation chromatography (GPC). Specifically, the values are determined by filtrating a sample through a membrane filter having a pore size of 0.45 μm followed by using a GPC (HLC-82A manufactured by Tosoh Corporation) (developing solvent: toluene; developing speed: 1.0 ml/min.; column temperature: 25° C.; column: TSKgel G2000HXL manufactured by Tosoh Corporation) and calculating the measurements in terms of polystyrene.

The amount of the molecular structure having a fluorene skeleton and contained in a resin composition according to the present invention is not limited to any particular value, and is preferably 50 mol % or more, more preferably 60 mol % or more, particularly preferably 75 mol % or more, in view of being capable of improving the compatibility with the light-emitting material and improving the durability. In addition, the amount is preferably 99 mol % or less, more preferably 95 mol % or less, in view of being capable of obtaining a suitable film hardness and preventing problems such as cracks during film formation.

The resin as the component (B) preferably has a glass transition temperature (Tg) of 50° C. or more, more preferably 80° C. or more, still more preferably 100° C. or more, particularly preferably 120° C. or more, in view of being capable of improving the compatibility with the light-emitting material and improving the durability. In addition, the Tg is preferably 200° C. or less, more preferably 180° C. or less, still more preferably 170° C. or less, particularly preferably 160° C. or less, in view of being capable of obtaining a suitable film hardness and preventing problems such as cracks during film formation.

The Tg within this range makes it possible that a color conversion sheet formed from the composition obtains higher durability. Specific examples of such resins having a Tg of 50° C. or more and 200° C. or less include "Iupizeta" (registered trademark) EP-5000 manufactured by Mitsubishi Gas Chemical Company, Inc. and "OKP" (registered trademark) 4 and "OKP" (registered trademark)-A1 manufactured by Osaka Gas Chemicals Co., Ltd., and among these, "OKP" (registered trademark) 4 is preferable.

A glass transition point can be measured using a commercially available measurement device (for example, a differential scanning calorimeter (DSC7000X) manufactured by Hitachi High-Tech Science Corporation; heating rate: 10° C./min.).

A method of synthesizing these resins is not limited to any particular one, a known method can suitably be used, and a commercially available product can also be used.

<Thermoplastic Resin>

A color conversion composition according to the present invention preferably further contains a thermoplastic resin (C) different from the resin as the component (B). Specific examples of thermoplastic resins (C) that can be used include known ones such as: photocurable resist materials having a reactive vinyl group, such as acryl-based, methacryl-based, vinyl polycinnamate-based, polyimide-based, and cyclized rubber-based ones; epoxy resins, silicone resins (including organopolysiloxane cured products (cross-linked products) such as silicone rubbers and silicone gels), urea resins, fluorine resins, polycarbonate resins, acrylic resins, methacryl resins, polyimide resins, polyethylene terephthalate resins, polypropylene resins, polystyrene resins, urethane resins, melamine resins, polyvinyl resins, polyamide resins, phenol resins, polyvinyl alcohol resins, cellulose resins, aliphatic ester resins, aromatic ester resins, aliphatic polyolefin resins, aromatic polyolefin resins, and polystyrene resins; polymers of vinyl aromatic-based monomers such as styrene and α-methylstyrene, and hydrides of the aromatic ring portion of the polymer. These copolymerized resins may be used singly or in mixture of two or more kinds thereof. In view of transparency, heat resistance, and the like, preferable resins among these are: acrylic resins, methacrylic resins, and polystyrene resins; and polymers of vinyl aromatic monomers such as styrene and α-methyl styrene, and hydrides of the aromatic ring portion of the polymer.

The amount of the thermoplastic resin (C) is preferably 1 part by weight or more and 2000 parts by weight or less, more preferably 5 parts by weight or more and 500 parts by weight or less, particularly preferably 10 parts by weight or more and 50 parts by weight or less, relative to 100 parts by weights of the amount of the component (B). The amount of the thermoplastic resin (C) within this range makes it possible to control the peak wavelength and full width at half maximum of the light-emitting material and improve the color reproducibility.

<Other Additives>

Besides the component (A), the component (B), and the thermoplastic resin (C), the following: fillers, antioxidants, processing thermal stabilizers, lightfast stabilizers such as ultraviolet absorbers, dispersants and leveling agents for stabilizing coatings, plasticizers, cross-linking agents such as epoxy compounds, curing agents such as amines, acid anhydrides, and imidazoles, pigments, adhesive assistants such as silane coupling agents as a modifier for sheet surface, or the like can be added to a color conversion composition according to the present invention.

Examples of the fillers include, but are not limited particularly to: fine particles such as fumed silica, glass powder, and quartz powder; and titanium oxide, zirconia oxide, barium titanate, zinc oxide, and silicone fine particles. These fillers may be used singly or in combination.

Examples of the antioxidants include, but are not limited to, phenol-based antioxidants such as 2,6-di-tert-butyl-p-cresol and 2,6-di-tert-butyl-4-ethylphenol. These antioxidants may be used singly or in combination.

Examples of the processing-and-thermal stabilizers include, but are not limited to, phosphorous-based stabilizers such as tributyl phosphite, tricyclohexyl phosphite, triethyl phosphine, and diphenylbutyl phosphine. These stabilizers may be used singly or in combination.

Examples of the lightfast stabilizers include, but are not limited to, benzotriazoles such as 2-(5-methyl-2-hydroxyphenyl)benzotriazole and 2-[2-hydroxy-3,5-bis(α,α-dimethylbenzyl)phenyl]-2H-benzotriazole. These lightfast stabilizers may be contained singly or in combination.

The amount of these additives contained in the color conversion composition according to the present invention depends on the molar extinction coefficient of the compound, the fluorescence quantum yield of the compound, the absorption intensity of the compound at an excitation wavelength, and the thickness and transmittance of a sheet to be prepared, and is usually $1.0 \times 10^{-3}$ parts by weight or more and 30 parts by weight or less, more preferably $1.0 \times 10^{-2}$ parts by weight or more and 15 parts by weight or less, particularly preferably $1.0 \times 10^{-1}$ parts by weight or more and 10 parts by weight or less, relative to 100 parts by weight of the component (B).

<Solvent>

The color conversion composition according to the present invention may contain a solvent. The solvent is not limited to a particular solvent so long as it can adjust the viscosity of a resin in a fluid state and does not have an excessive influence on the light emission and durability of a light-emitting substance. Examples thereof include water, 2-propanol, ethanol, toluene, methylethyl ketone, methylisobutyl ketone, cyclopentanone, cyclohexanone, hexane, acetone, methyl acetate, ethyl acetate, butyl acetate, propyl acetate, isopropyl acetate, terpineol, texanol, methyl cellosolve, ethyl cellosolve, butyl carbitol, butyl carbitol acetate, 1-methoxy-2-propanol, propylene glycol monomethyl ether acetate, tetrahydrofuran, tetrahydropyran, 1,4-dioxane, and the like, and these solvents can be used in mixture of two or more kinds thereof. Tetrahydrofuran among these solvents in particular is suitably contained in view of not having any influence on the degradation of the compound represented by General Formula (5) and giving a less amount of a residual solvent after being dried.

<Method of Producing Color Conversion Composition>

The following describes an example of a method of producing the color conversion composition according to the present invention. Prescribed amounts of the above-mentioned light-emitting material, resins, solvents, and the like are mixed with each other. The components are mixed with each other so as to give a prescribed composition and are then uniformly mixed and dispersed by a stirring and kneading machine such as a homogenizer, a rotary-and-revolutionary stirring machine, a triple roll mill, a ball mill, a planetary ball mill, or a beads mill to obtain a color conversion composition. After being mixed and dispersed or during being mixed and dispersed, defoaming in a vacuum or under a reduced pressure is also preferably performed. In addition, a specific component may be mixed in advance, or treatment such as aging may be performed. A desired solid content can be obtained by removing the solvent by an evaporator.

<Method of Producing Color Conversion Sheet>

Figure 2:
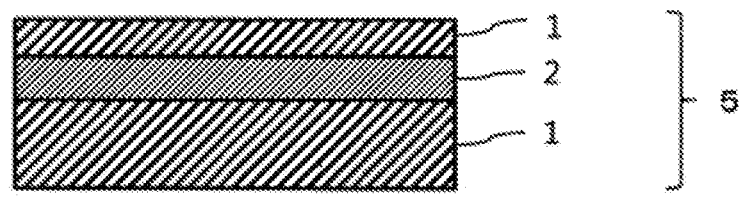
FIG. 2 is a schematic sectional view depicting an example of a color conversion sheet according to the present invention.
Figure 3:
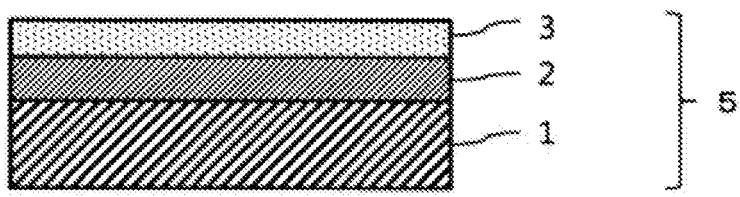
FIG. 3 is a schematic sectional view depicting an example of a color conversion sheet according to the present invention.
Figure 4:
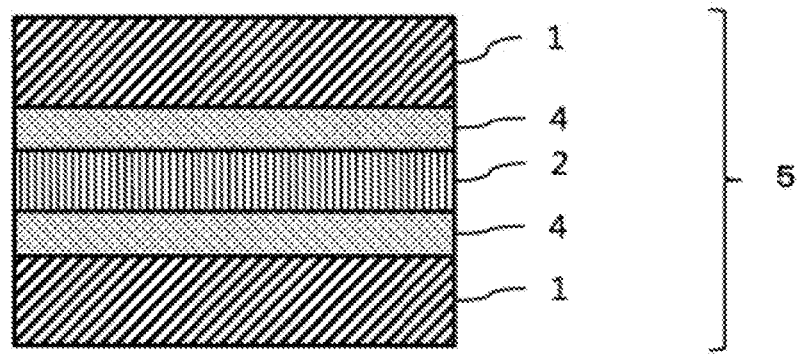
FIG. 4 is a schematic sectional view depicting an example of a color conversion sheet according to the present invention.

In the present invention, the color conversion sheet is not limited to any constituents, and is any of those which contain a layer obtained by drying or curing the color conversion composition. Examples of a typical structure of the color conversion sheet include: a laminate formed of a base layer 1 and a color conversion layer 2 obtained by curing the color conversion composition, as shown in FIG. 1; and a laminate formed of a color conversion layer 2 sandwiched between a plurality of base layers 1, as shown in FIG. 2. A diffusion sheet 3 may further be provided as shown in FIG. 3. The color conversion sheet may have a barrier layer 4 provided thereon to prevent the color conversion layer from being deteriorated by oxygen, moisture, and heat, as shown in FIG. 4.

The thickness of the color conversion sheet, which is not limited to a particular thickness, is preferably 1 to 5000 μm as the total thickness of all layers. The thickness of 1 μm or more makes it possible to ensure sufficient film strength and makes it more unlikely to cause a problem such as film breakage. The thickness of 5000 μm or less makes it possible to obtain a sheet having excellent handling properties. The thickness is more preferably 10 to 1000 μm, still more preferably 15 to 500 μm, particularly preferably 30 to 300 μm.

A film thickness related to the color conversion sheet in the present invention refers to a film thickness (an average film thickness) measured based on JIS K 7130 (1999) Plastics—Film and sheeting—Method A for measuring thickness by mechanical scanning in method for measuring thickness.

<Base Layer>

For the base layer, known metals, films, glasses, ceramics, papers, and the like can be used without any particular limitation. Specific examples thereof include metal plates and foils of aluminum (including aluminum alloys), zinc, copper, iron, and the like; films of plastics such as cellulose acetate, polyethylene terephthalate (PET), polyethylene, polyester, polyamide, polyimide, polyphenylene sulfide, polystyrene, polypropylene, polycarbonate, polyvinyl acetal, aramids, silicones, polyolefins, thermoplastic fluorine resins, and a copolymer of tetrafluoroethylene and ethylene (ETFE); films of plastics of α-polyolefin resins, polycaprolactone resins, acrylic resins, silicone resins, and copolymerized resins of theses resins and ethylene; papers laminated with the plastics and papers coated with the plastics; papers laminated or deposited with the metals; plastic films laminated or deposited with the metals; and the like. When the base material is a metal plate, the surface thereof may be subjected to chromium-based, nickel-based, or similar plating treatment or ceramic treatment.

Among these materials, in view of the easiness of preparing the color conversion sheet and the easiness of shaping the color conversion sheet, glasses and resin films are preferably used. To exclude the possibility of breakage or the like when a film-shaped base material is handled, films having high strength are preferred. In view of those required characteristics and economy, resin films are preferred; among them, in view of economy and handleability, preferred are plastic films selected from the group consisting of PET, polyphenylene sulfide, polycarbonate, and polypropylene. When the color conversion sheet is dried or when the color conversion sheet is shaped under pressure at a high temperature of 200° C. or more by an extruder, a polyimide film is preferred in view of heat resistance. In view of the easiness of peeling off the sheet, the surface of the base layer may be subjected to mold releasing treatment in advance.

The base layer is not limited to a particular thickness, and the lower limit thereof is preferably 5 μm or more, more preferably 25 μm or more, still more preferably 38 μm or more. The upper limit thereof is preferably 5000 μm or less, more preferably 3000 μm or less.

<Color Conversion Layer>

The following describes an example of a method of producing a color conversion layer contained in the color conversion sheet according to the present invention. The color conversion composition produced by the method described above is applied to a base material and dried. The application can be performed by a reverse roll coater, a blade coater, a slit die coater, a direct gravure coater, an offset gravure coater, a kiss coater, a natural roll coater, an air knife coater, a roll blade coater, a two-stream coater, a rod coater, a wire bar coater, an applicator, a dip coater, a curtain coater, a spin coater, a knife coater, or the like. To obtain the uniformity of the film thickness of the color conversion layer, the application is preferably performed with a slit die coater or a dip coater.

The drying of the color conversion layer can be performed using a general heating device such as a hot air drier or an infrared drier. For the heating of the color conversion sheet, a general heating device such as a hot air drier or an infrared drier is used. In this case, heating conditions include usually one minute to five hours at 40 to 250° C. and preferably two minutes to four hours at 60° C. to 200° C. Stepwise heating and curing such as step cure is also available.

After the color conversion layer is produced, the base material can be changed as needed. In this case, examples of a simple method include, but are not limited to, a method that performs the replacement using a hot plate and a method that uses a vacuum laminator or a dry film laminator.

The thickness of the color conversion layer, which is not limited to a particular thickness, is preferably 1 to 1000 more preferably 10 to 1000 The thickness of 1 µm or more makes it possible to ensure sufficient film strength and makes it more unlikely to cause a problem such as film breakage. The thickness of 5000 µm or less makes it possible to obtain a sheet having excellent handling properties. The thickness is more preferably 10 to 100 still more preferably 15 to 100 particularly preferably 30 to 100

<Barrier Layer>

The barrier layer is suitably used, for example, to improve the gas barrier properties for the color conversion layer, and examples of such barrier layers include metal oxide thin films and metal nitride thin films of inorganic oxides such as silicon oxide, aluminum oxide, titanium oxide, tantalum oxide, zinc oxide, tin oxide, indium oxide, yttrium oxide, and magnesium oxide, inorganic nitrides such as silicon nitride, aluminum nitride, titanium nitride, and silicon carbide nitride, mixtures thereof, and with other elements added thereto; and films formed of various kinds of resins such as polyvinylidene chloride, acrylic-based resins, silicone-based resins, melamine-based resins, urethane-based resins, fluorine-based resins, and polyvinyl alcohol-based resins such as a saponified product of vinyl acetate. Examples of films having a barrier function against moisture include films composed of any kind of resin such as polyethylene, polypropylene, nylon, polyvinylidene chloride, a copolymer of vinylidene chloride and vinyl chloride, a copolymer of vinylidene chloride and acrylonitrile, a fluorine resin, or a polyvinyl alcohol resin such as a saponified product of vinyl acetate.

The barrier layer may be provided on both sides of the color conversion layer or one side thereof.

In addition, the color conversion sheet may be further provided with a light diffusion layer or an auxiliary layer having an anti-reflection function, an anti-glare function, an anti-reflection-and-anti-glare function, a hard coating function (an abrasion-resistant function), an antistatic function, a soil-resistant function, an electromagnetic shielding function, an infrared cutting function, an ultraviolet cutting function, a polarizing function, or a toning function in accordance with required functions.

The color conversion sheet according to an embodiment of the present invention may be a double-layered color conversion sheet having the layer (Y) containing the light-emitting material (b) in addition to the layer (X) containing the light-emitting material (a). The light-emitting material (a) and the light-emitting material (b) are contained in different layers, whereby inter-material interaction is reduced, and light emission with higher color purity is exhibited than a case in which they are dispersed in the same layer. The inter-material interaction between the light-emitting material (a) and the light-emitting material (b) is reduced, whereby the light-emitting material (a) and the light-emitting material (b) each emit light independently in the respective layers, and thus adjustment of the emission peak wavelength and emission intensity of green and red is made easy.

That is, the color conversion sheet according to the embodiment of the present invention can design the optimum emission peak wavelength and emission intensity of the respective colors of blue, green, and red without deteriorating the characteristics of the light-emitting material such as the light-emitting material (a) and the light-emitting material (b) exhibiting light emission with high color purity. With this design, white light with good color purity can be obtained.

In the color conversion sheet according to the embodiment of the present invention, at least one organic light-emitting material only needs to be contained in each of the layer (X) or the layer (Y); two or more may be contained therein.

Examples of a combination of the light-emitting material (a) and the light-emitting material (b) as based on light emission characteristics include: a combination of the light-emitting material (a) that exhibits light emission caused by photoexcitation and having a peak wavelength observed in a region of 580 nm or more and 750 nm or less and the light-emitting material (b) that exhibits light emission caused by photoexcitation and having a peak wavelength observed in a region of 500 nm or more and 580 nm or less; a combination of the light-emitting material (a) that exhibits light emission caused by photoexcitation and having a peak wavelength observed in a region of 500 nm or more and 580 nm or less and the light-emitting material (b) that exhibits light emission caused by photoexcitation and having a peak wavelength observed in a region of 580 nm or more and 750 nm or less; and the like.

As a mixing example of a plurality of organic light-emitting materials, the layer (X) may contain a light-emitting material (a') in addition to and different from the light-emitting material (a), for example. The layer (Y) may contain a light-emitting material (b') in addition to and different from the light-emitting material (b).

A plurality of pieces of the layer (X) and the layer (Y) may be included in the color conversion sheet according to the embodiment of the present invention. In this case, the compositions and forms of the respective layers of the plurality of layer (X) may be the same as or different from each other. Similarly, the compositions and forms of the respective layers of the layer (Y) may be the same as or different from each other.

The resin contained in the color conversion layer (Y) may be the component (B) resin or may be a thermoplastic resin (C) different from the resin as the component (B). In addition, the light-emitting material (b) may be an organic light-emitting material, an inorganic fluorescent body, or quantum dots.

Examples of inorganic fluorescent bodies include fluorescent bodies such as YAG-based fluorescent bodies, TAG-based fluorescent bodies, $(Ba,Sr)_2SiO_4$:Eu-based fluorescent bodies, $Ca_3Sc_2Si_3O_{12}$:Ce-based fluorescent bodies, silicate-based fluorescent bodies, nitride-based fluorescent bodies, oxynitride-based fluorescent bodies, and further, $(Ba,Sr,Ca)Si_2O_2N_2$:Eu-based fluorescent bodies, $Ca_8MgSi_4O_{16}Cl_2$:Eu-based fluorescent bodies, $SrAl_2O_4$:Eu,$Sr_4Al_{14}O_{25}$:Eu,α-SiAlON fluorescent bodies, β-SiAlON fluorescent bodies, and γ-AlON fluorescent bodies.

Quantum dots are semiconductor particles obtained by forming a semiconductor into a nanometric size and exhibit special optical characteristics, that is, exhibit broad optical absorption and at the same time, emit fluorescence having a narrow spectral bandwidth. Examples of quantum dots include quantum dots (InP/ZnS) having InP as the core and ZnS as the shell. Additional examples include InP/ZnSe, InP/ZnSe/ZnS, InP/ZnSSe, (InP/ZnSSe) solid solution/ZnS, CuInS2/ZnS, (ZnS/AgInS2) solid solution/ZnS, and CdSe/ZnS.

Figure 5:
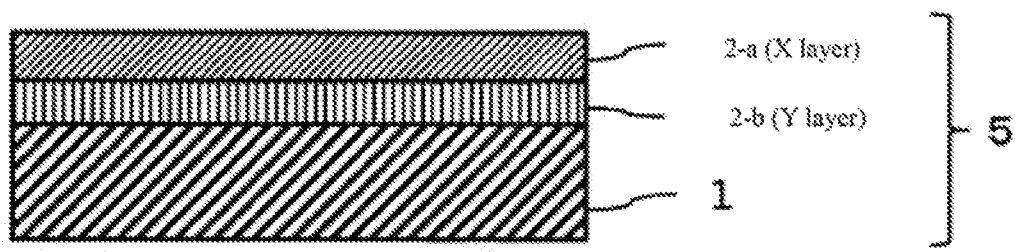
FIG. 5 is a schematic sectional view depicting an example of a color conversion sheet according to the present invention.
Figure 6:
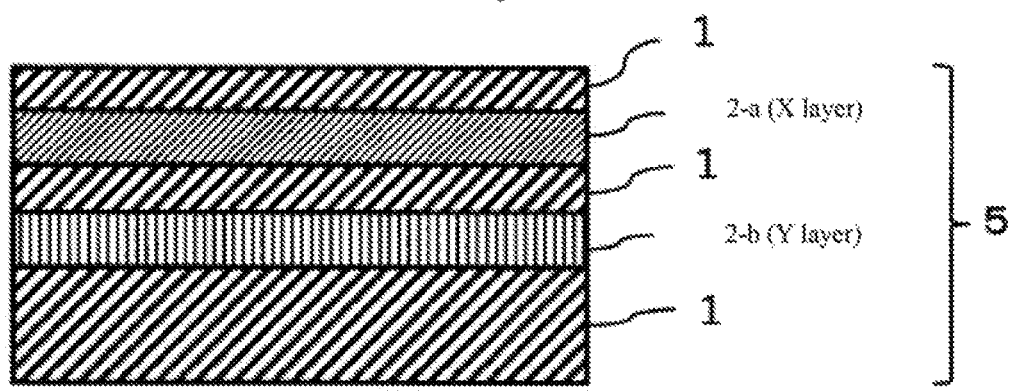
FIG. 6 is a schematic sectional view depicting an example of a color conversion sheet according to the present invention.

Examples of a typical structure of the color conversion sheet include: a laminate having a base layer 1, the layer (X) 2-a, and the layer (Y) 2-b, as shown in FIG. 5; and a laminate having the layer (X) 2-a and the layer (Y) 2-b sandwiched between a plurality of base layers 1, as shown in FIG. 6.

Examples of the color conversion sheet also include a structure having the layer(s) (X) and the layer(s) (Y) consecutively, such as layer (X)/layer (X)/layer (Y), layer (X)/layer (Y)/layer (Y), and layer (X)/layer (X)/layer (Y)/layer (Y).

These are by way of example, and the specific structures of the color conversion sheet according to the present invention are not limited to these.

<Excitation Light>

As to the type of the excitation light, any excitation light can be used so long as it exhibits light emission in a wavelength region that can be absorbed by a light-emitting substance in which a compound represented by General Formula (5) or a similar compound is mixed. For example, any excitation light such as a hot cathode tube, cold cathode tube, fluorescent light source such as inorganic EL, organic electroluminescent element light source, LED light source, or incandescent light source is usable in principle, and LED in particular is a preferred excitation light. For display and lighting applications, a blue LED having excitation light in the range of 430 to 500 nm is a more preferred excitation light in view of making it possible to improve the color purity of a blue light. Excitation light having a wavelength range on the longer wavelength side of the above-mentioned range lacks blue light and thus cannot form white light; excitation light having a wavelength range on the shorter wavelength side of the above-mentioned range makes it more likely that a light-emitting substance such as a compound represented by General Formula (5) or an organic compound such as a resin is optically deteriorated; and thus, none of these kinds of excitation light is preferable.

The excitation light may have one emission peak or have two or more emission peaks; to increase color purity, preferred is one having one emission peak. A plurality of excitation light sources having different emission peaks can be arbitrarily combined with each other.

<Light Source Unit>

Figure 7:
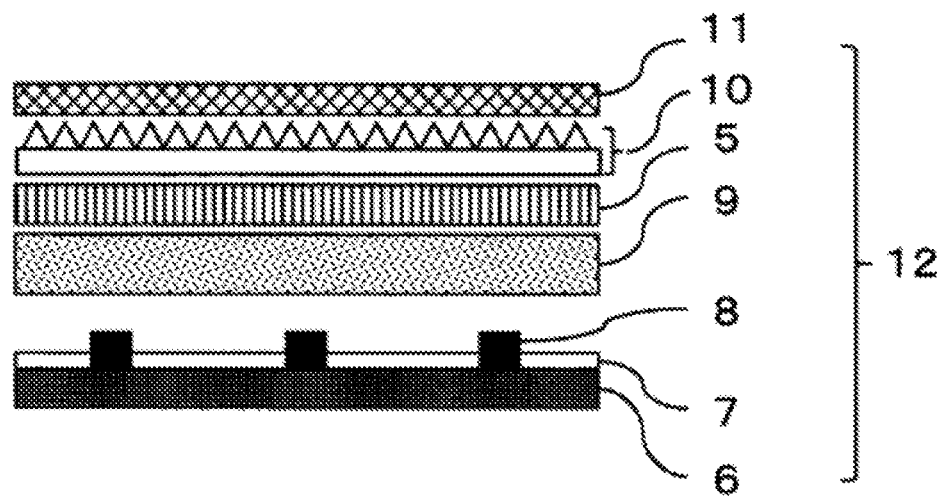
FIG. 7 is a schematic cross-sectional view depicting an example of a light source unit according to the present invention.
Figure 8:
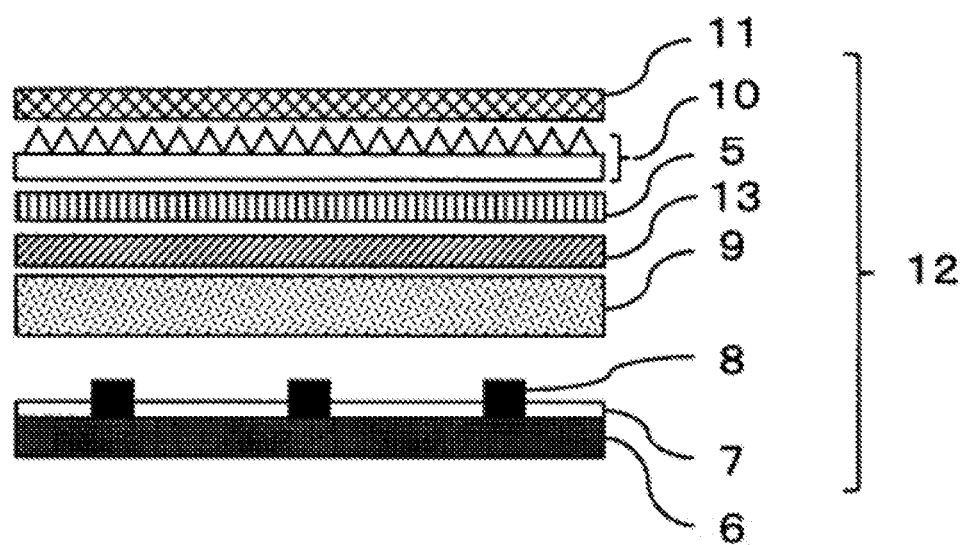
FIG. 8 is a schematic cross-sectional view depicting an example of a light source unit according to the present invention.

The light source unit in the present invention includes at least a light source and a color conversion composition or a color conversion sheet. Examples of typical structures include a structure in which a base plate 6, a reflective layer 7, and a light source 8 are laminated, a color conversion sheet 5 according to the present invention is disposed between a diffusion plate 9 and a prism sheet 10, and a polarized reflective film 11 is further disposed on the prism sheet 10, as shown in FIG. 7. The light source in FIG. 7 is what is called a direct type, and the light source is not limited to any particular arrangement. Another color conversion sheet 13 different from a color conversion sheet according to the present invention may be laminated, as shown in FIG. 8. Such another color conversion sheet contains, without particular limitation, a composition such as the above-mentioned color conversion layer (Y). In addition, the sequence of the color conversion sheet 5 according to the present invention and such another color conversion sheet 13 is not limited to any particular one.

When the light source unit includes the color conversion composition, the method for arranging the light source and the color conversion composition is not limited to a particular method; the color conversion composition may be directly applied to the light source, or the color conversion composition may be applied to film, glass, or the like separate from the light source. When the light source unit includes the color conversion sheet, the method for arranging the light source and the color conversion sheet is not limited to a particular method; the light source and the color conversion sheet may adhere closely to each other, or the remote phosphor method, in which the light source and the color conversion sheet are separate from each other, may be used. In addition, the light source unit may further include a color filter for the purpose of increasing color purity.

As described above, the excitation light in the range of 430 to 500 nm has relatively small excitation energy and can thus prevent the decomposition of the light-emitting substance such as the compound represented by General Formula (5), and accordingly, the light source is preferably an LED having the maximum light emission in the range of 430 to 500 nm.

The light source unit of the present invention can be used for displays, lighting, the interior design, signs, signboards, and the like and is particularly suitably used for displays and lighting in particular.

EXAMPLES

Below, the present invention will be described with reference to Examples, but the present invention is not to be limited to these Examples.

<Glass Transition Point Measurement>

A differential scanning calorimeter (DSC7000X) manufactured by Hitachi High-Tech Science Corporation was used to observe the endothermic behavior of a resin under heating from 30° C. at 10° C./min. in a nitrogen atmosphere, and the midpoint temperature of the endothermic behavior caused by glass transition was regarded as a glass transition temperature (Tg).

<Measurement of Color Conversion Characteristics>

A current of 100 mA was applied to a light-emitting device in which each of the color conversion sheets and a blue LED (Model No. SMBB450H-1100; manufactured by Ushio Epitex Inc.; emission peak wavelength: 450 nm) were mounted, the blue LED was thus lit up, and an emission spectrum and the emission intensity and chromaticity at the peak wavelength were measured using a spectral radiance meter (CS-1000 manufactured by Konica Minolta, Inc.). In this regard, a distance between each of the color conversion sheets and the blue LED element was 3 cm.

<Optical Durability Test>

A current of 100 mA was applied to a light-emitting device in which each of the color conversion sheets and a blue LED (Model No. SMBB450H-1100; manufactured by Ushio Epitex Inc.; emission peak wavelength: 450 nm) were mounted, the blue LED was thus lit up, and the peak intensity at the emission wavelength at which color was converted was measured using a spectral radiance meter (CS-1000 manufactured by Konica Minolta, Inc.). In this regard, a distance between each of the color conversion sheets and the blue LED element was 3 cm. Then, light from the blue LED element was continuously radiated in an environment at 50° C., the time taken by the emission intensity of the fluorescent body to decrease by 10% from the initial value was observed to evaluate the durability of a color conversion sheet. As the time taken by the emission intensity of the fluorescent body to decrease by 10% from the initial value, 100 hours or more is not problematic for practical usage, 200 hours or more is good, and 500 hours or more is extremely good.

<Color Reproducible Range Measurement>

A liquid crystal monitor (SW2700PT) manufactured by BenQ Corporation was dismantled, and in place of the built-in color conversion sheet, a color conversion sheet produced in each of the below-mentioned Examples and Comparative Examples was inserted in the monitor, which was then reassembled back. When this was done, the structure of the backlight unit was "reflective film/light-guiding plate/diffusion sheet/color conversion sheet/prism sheet/polarized reflective film". The single colors of blue, green, and red were displayed on the resulting monitor, and the color coordinates (x,y) of each color in the color space were measured using a spectral radiance meter (CS-1000 manufactured by Konica Minolta, Inc.). From the resulting three points as sets of color coordinates, the area of the color gamut was calculated, and the area ratio to the color gamut area in the DCI-P3 standard was calculated. The area ratio of 100% or more is good, and 110% or more is extremely preferable.

<Light-Emitting Material>

In the following Examples and Comparative Examples, Compounds G-1, G-2, G-4, R-1, and R-2 are compounds shown below.

[Chem. 35]

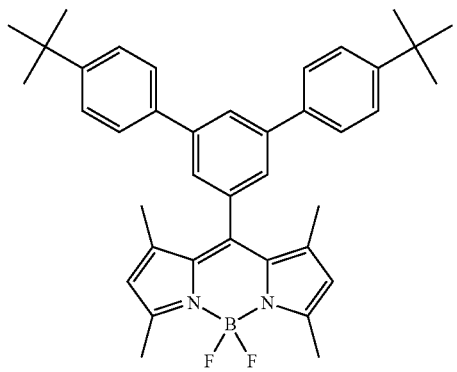
G-1

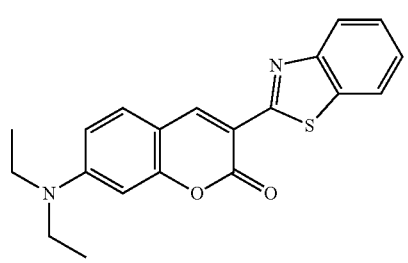
G-2

[Chem. 36]

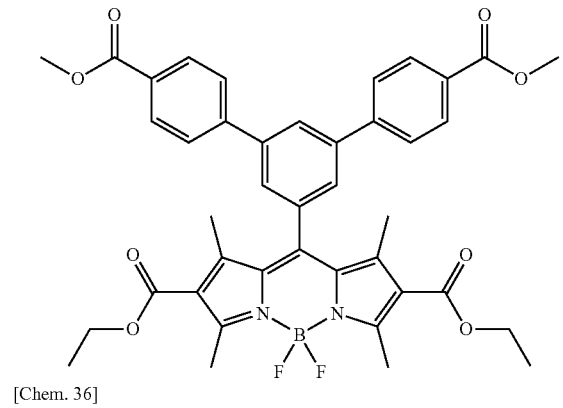
G-4

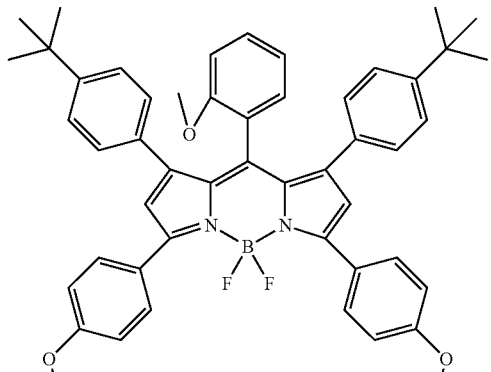
R-1

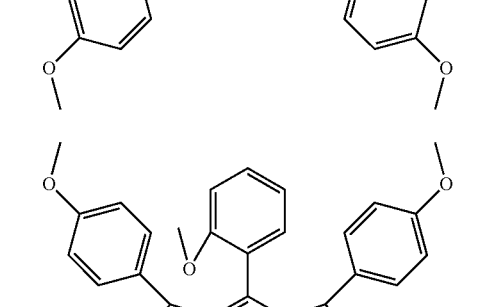
R-2

Compounds G-1 and G-4 were synthesized by a known method.

G-2: Coumarin 6 manufactured by Sigma-Aldrich Co. LLC was used.

G-3: Quantum dots (product number 753777) manufactured by Sigma-Aldrich Co. LLC were used.

Compounds R-1 and R-2 were synthesized by a known method.

R-3: "Lumogen" (registered trademark) F Red 300 manufactured by BASF SE was used.

R-4: Quantum dots (product number 753882) manufactured by Sigma-Aldrich Co. LLC were used.

<Resin>

Resin A: "OKP" (registered trademark) 4 manufactured by Osaka Gas Chemicals Co., Ltd. was used. The resin A had a structure of General Formula (1) and was a polyester resin having unsubstituted arylene groups as $W^1$ and $W^2$ and having a glass transition point of 121° C.

Resin B: "OKP" (registered trademark)-A1 manufactured by Osaka Gas Chemicals Co., Ltd. was used. The resin B had structures of General Formulae (1) and (3) and was a polyester resin having unsubstituted arylene groups as $W^1$ and $W^2$ and having a glass transition point of 139° C.

Resin C:

Into a glass reactor having a capacity of one liter, equipped with a stirrer, reflux condenser, heating device, pressure gauge, thermometer, pressure reducing device, and nitrogen supply device, and having an extrusion port for resin, 80 parts by weight of 1,4-cyclohexanedicarboxylic dimethyl, 140 parts by weight of 9,9-bis[4-(2-hydroxyethoxy)phenyl]fluorene, and 30 parts by weight of ethylene glycol were added, and the reactor was purged with nitrogen followed by allowing the raw materials to be dissolved at 160° C. As transesterification catalysts, 0.02 parts by weight of manganese acetate and 0.06 parts by weight of calcium acetate were added, and the resulting mixture was heated to 260° C. at a rate of 1° C./min. The reaction was continued at 260° C. for two hours, and then, 0.075 parts by weight of trimethyl phosphate and 0.10 parts by weight of germanium dioxide were added. Then, the internal pressure was set to 0.1 kPa, and the resulting mixture was heated to 265° C. at a rate of 1° C./min. In this state, the polycondensation reaction was continued for six hours. Nitrogen was used to put the inside of the reactor container under normal pressure, and the resin was extruded in strand form into cooling water and cut to afford pellets. The resulting polyester resin (resin C) had a structure of General Formula (1) and was a resin having unsubstituted arylene groups as $W^1$ and $W^2$, and the glass transition point was measured and found to be 125° C.

Resin D:

Into a glass reactor having a capacity of one liter, 100 parts by weight of 9,9-dimethylfluorene-2,7-dicarbonyl chloride, 71 parts by weight of fluorene-9,9-dimethanol, and 280 parts by weight of phenyl ether were added, and the resulting mixture was stirred at 210° C. for three hours while argon gas was sparged into the mixture. The reaction mixture was cooled to room temperature, 2000 parts by weight of chloroform was added to dilute the mixture, and the diluted mixture was added to methanol to obtain a white solid. The white solid was filtrated, washed with acetone, and then dried under reduced pressure at 50° C. to obtain a polyester resin (resin D).

The resulting resin D had structures of General Formulae (1) and (2) and was a resin having no substituted or unsubstituted arylene groups as $W^1$ and $W^2$, and the glass transition point was measured and found to be 150° C.

Resin E:

A polyester resin (resin E) was obtained by the same operation as in the synthesis of the resin C except that the added raw materials were 80 parts by weight of 1,4-cyclohexanedicarboxylic dimethyl, 100 parts by weight of 9,9-bis[4-(2-hydroxyethoxy)phenyl]fluorene, and 37 parts by weight of ethylene glycol. The resulting resin E had a structure of General Formula (1) and was a resin having unsubstituted arylene groups as $W^1$ and $W^2$, and the glass transition point was measured and found to be 98° C.

Resin F:

A polyester resin (resin F) was obtained by the same operation as in the synthesis of the resin C except that the added raw materials were 80 parts by weight of 1,4-cyclohexanedicarboxylic dimethyl, 100 parts by weight of fluorene-9,9-dimethanol, and 7 parts by weight of ethylene glycol. The resulting resin F had a structure represented by General Formula (1) and was a resin having no substituted or unsubstituted arylene groups as $W^1$ and $W^2$, and the glass transition point was measured and found to be 160° C.

Resin G: A resin obtained by adding 2% by weight of 1-hydroxy-cyclohexyl-phenyl-ketone to "OGSOL" (registered trademark) EA-0200 manufactured by Osaka Gas Chemicals Co., Ltd. was used.

The resin G had a structure of General Formula (4) and was an acrylic resin having unsubstituted arylene groups as $W^1$ and $W^2$ and having a glass transition point of 211° C.

Resin H: "Iupizeta" (registered trademark) EP-5000 manufactured by Mitsubishi Gas Chemical Company, Inc. was used. The resin H had a structure represented by General Formula (1) and was a polycarbonate resin having unsubstituted arylene groups as $W^1$ and $W^2$ and having a glass transition point of 145° C.

Resin I: A resin obtained by mixing 150 parts by weight of phenol novolac resin solution manufactured by DIC Corporation and 1 part by weight of triphenylphosphine manufactured by Nacalai Tesque, Inc. with 100 parts by weight of "OGSOL" (registered trademark) PG-100 manufactured by Osaka Gas Chemicals Co., Ltd. was used. The resin I had a structure represented by General Formula (1) and was an epoxy resin having unsubstituted arylene groups as $W^1$ and $W^2$ and having a glass transition point of 181° C.

Resin J: A polyester resin "Vylon" (registered trademark) 270 manufactured by Toyobo Co., Ltd. was used.

Resin K: An acrylic resin solution "AlON" (registered trademark)S-1017 manufactured by Toagosei Co., Ltd. was used.

Resin L: A polycarbonate resin "PANLITE" (registered trademark) AD-5503 manufactured by Teijin Limited was used.

Resin M: An epoxy resin "jER" (registered trademark) YX7700 manufactured by Mitsubishi Chemical Corporation was used.

The resin A to the resin I are each a resin containing a fluorene skeleton, and the resins J to M are each a resin containing no fluorene skeleton.

Example 1

With 100 parts by weight of the resin A, 0.20 parts by weight of the compound G-1 as a light-emitting material and 300 parts by weight of toluene as a solvent were mixed, and then the resulting mixture was stirred and deaerated at 1000 rpm for 20 minutes using a planetary stirring/deaerating device "Mazerustar" (registered trademark) KK-400 (manufactured by Kurabo Industries Ltd.) to obtain a color conversion composition as a resin solution for producing a color conversion layer.

Similarly, 300 parts by weight of toluene as a solvent was mixed with 100 parts by weight of a polyester resin, using "Vylon" (registered trademark) 630 (a polyester resin manufactured by Toyobo Co., Ltd.) as the resin, and then the resulting mixture was stirred and deaerated at 300 rpm for 20 minutes using a planetary stirring/deaerating device "Mazerustar" (registered trademark) KK-400 (manufactured by Kurabo Industries Ltd.) to obtain a resin composition.

Next, the color conversion composition was applied to "Lumirror" (registered trademark) U48 (manufactured by Toray Industries, Inc.; thickness: 50 μm) using a slit die coater, and was heated and dried at 120° C. for 20 minutes to form a color conversion layer having an average film thickness of 20 μm.

Similarly, using a slit die coater, the resin composition was applied onto the PET base layer side of a light diffusion sheet, Chemical Matte 125PW (manufactured by Kimoto Co., Ltd.; thickness: 138 μm), and dried by heating at 120° C. for 20 minutes to form an adhesive layer having an average film thickness of 10 μm.

Next, the above-mentioned two units were laminated by heating, such that the color conversion layer and the adhesive layer were directly laminated, to produce a color conversion sheet having a structure: "base layer/color conversion layer/adhesive layer/base layer/light diffusion layer".

Using the produced color conversion sheet, the color conversion characteristics were measured by the above-mentioned method, and a green light emission having a peak wavelength of 535 nm was observed. In addition, an optical durability test was carried out by the above-mentioned method, and the time taken by the peak intensity at the light emission wavelength to decrease by 10% from the initial value was found to be 200 hours. The durability was found to be significantly improved compared with the below-mentioned Comparative Example 1.

Comparative Example 1

A color conversion sheet was produced by the same operation as in Example 1 except that the resin used was the resin J.

Using the produced color conversion sheet, the color conversion characteristics were measured by the above-mentioned method, and a green light emission having a peak wavelength of 535 nm was observed. In addition, an optical durability test was carried out by the above-mentioned method, and the time taken by the peak intensity at the light emission wavelength to decrease by 10% from the initial value was found to be 50 hours.

Example 2

A color conversion sheet was produced by the same operation as in Example 1 except that the compound G-2 was used as a light-emitting material. Using the produced color conversion sheet, the color conversion characteristics were measured by the above-mentioned method, and a green light emission having a peak wavelength of 535 nm was observed. In addition, an optical durability test was carried out by the above-mentioned method, and the time taken by the peak intensity at the light emission wavelength to decrease by 10% from the initial value was found to be 100 hours. The durability was found to be improved compared with the below-mentioned Comparative Example 2, but the degree of improvement was found to be smaller than in the case where G-1 was used as a light-emitting material.

Comparative Example 2

A color conversion sheet was produced by the same operation as in Example 2 except that the resin used was the resin J.

Using the produced color conversion sheet, the color conversion characteristics were measured by the above-mentioned method, and a green light emission having a peak wavelength of 535 nm was observed. In addition, an optical durability test was carried out by the above-mentioned method, and the time taken by the peak intensity at the light emission wavelength to decrease by 10% from the initial value was found to be 30 hours.

Comparative Example 3

A color conversion sheet was produced by the same operation as in Example 1 except that G-3 was used as a light-emitting material. Using the produced color conversion sheet, the color conversion characteristics were measured by the above-mentioned method, and a green light emission having a peak wavelength of 535 nm was observed. In addition, an optical durability test was carried out by the above-mentioned method, and the time taken by the peak intensity at the light emission wavelength to decrease by 10% from the initial value was found to be 50 hours.

Comparative Example 4

A color conversion sheet was produced by the same operation as in Comparative Example 1 except that G-3 was used as a light-emitting material. Using the produced color conversion sheet, the color conversion characteristics were measured by the above-mentioned method, and a green light emission having a peak wavelength of 535 nm was observed. In addition, an optical durability test was carried out by the above-mentioned method, and the time taken by the peak intensity at the light emission wavelength to decrease by 10% from the initial value was found to be 50 hours. The results of Comparative Examples 3 and 4 have revealed that, in cases where the quantum dots were used as a fluorescent body, even use of a resin having a fluorene skeleton did not improve the durability.

TABLE 2

|  | Example 1 | Example 2 | Example 19 | Comparative Example 1 | Comparative Example 2 | Comparative Example 3 | Comparative Example 4 |
|---|---|---|---|---|---|---|---|
| Resin | Resin A | Resin A | Resin A | Resin J | Resin J | Resin A | Resin J |
| Light-emitting Material | G-1 | G-2 | G-4 | G-1 | G-2 | G-3 | G-3 |
| Time Taken by Intensity to Decrease by 10% | 200 | 100 | 350 | 50 | 30 | 50 | 50 |

Example 3

A color conversion sheet was produced by the same operation as in Example 1 except that R-1 was used as a light-emitting material. Using the produced color conversion sheet, the color conversion characteristics were measured by the above-mentioned method, and a red light emission having a peak wavelength of 650 nm was observed. In addition, an optical durability test was carried out by the above-mentioned method, and the time taken by the peak intensity at the light emission wavelength to decrease by 10% from the initial value was found to be 600 hours. The durability was found to be significantly improved compared with the below-mentioned Comparative Example 5.

Comparative Example 5

A color conversion sheet was produced by the same operation as in Example 3 except that the resin used was the resin J. Using the produced color conversion sheet, the color conversion characteristics were measured by the above-mentioned method, and a red light emission having a peak wavelength of 650 nm was observed. In addition, an optical durability test was carried out by the above-mentioned method, and the time taken by the peak intensity at the light emission wavelength to decrease by 10% from the initial value was found to be 100 hours.

Example 4

A color conversion sheet was produced by the same operation as in Example 3 except that R-2 was used as a light-emitting material. Using the produced color conversion sheet, the color conversion characteristics were measured by the above-mentioned method, and a red light emission having a peak wavelength of 620 nm was observed. In addition, an optical durability test was carried out by the above-mentioned method, and the time taken by the peak intensity at the light emission wavelength to decrease by 10% from the initial value was found to be 600 hours. The durability was found to be significantly improved compared with the below-mentioned Comparative Example 6.

Comparative Example 6

A color conversion sheet was produced by the same operation as in Example 4 except that the resin used was the resin J. Using the produced color conversion sheet, the color conversion characteristics were measured by the above-mentioned method, and a red light emission having a peak wavelength of 620 nm was observed. In addition, an optical durability test was carried out by the above-mentioned method, and the time taken by the peak intensity at the light emission wavelength to decrease by 10% from the initial value was found to be 100 hours.

Example 5

A color conversion sheet was produced by the same operation as in Example 3 except that R-3 was used as a light-emitting material. Using the produced color conversion sheet, the color conversion characteristics were measured by the above-mentioned method, and a red light emission having a peak wavelength of 615 nm was observed. In addition, an optical durability test was carried out by the above-mentioned method, and the time taken by the peak intensity at the light emission wavelength to decrease by 10% from the initial value was found to be 200 hours. The durability was found to be good compared with the below-mentioned Comparative Example 7.

Comparative Example 7

A color conversion sheet was produced by the same operation as in Example 5 except that the resin used was the resin J. Using the produced color conversion sheet, the color conversion characteristics were measured by the above-mentioned method, and a red light emission peak having a wavelength of 615 nm was observed. In addition, an optical durability test was carried out by the above-mentioned method, and the time taken by the peak intensity at the light emission wavelength to decrease by 10% from the initial value was found to be 70 hours.

Example 6

A color conversion sheet was produced by the same operation as in Example 3 except that the resin used was the resin B. Using the produced color conversion sheet, the color conversion characteristics were measured by the above-mentioned method, and a red light emission having a peak wavelength of 650 nm was observed. In addition, an optical durability test was carried out by the above-mentioned method, and the time taken by the peak intensity at the light emission wavelength to decrease by 10% from the initial value was found to be 600 hours, thus revealing that the durability was significantly improved in the same manner as in Example 3.

Example 7

A color conversion sheet was produced by the same operation as in Example 3 except that the resin used was the resin C. Using the produced color conversion sheet, the color conversion characteristics were measured by the above-mentioned method, and a red light emission having a peak wavelength of 650 nm was observed. In addition, an optical durability test was carried out by the above-mentioned method, and the time taken by the peak intensity at the light emission wavelength to decrease by 10% from the initial value was found to be 600 hours, thus revealing that the durability was significantly improved in the same manner as in Example 3.

Example 8

A color conversion sheet was produced by the same operation as in Example 3 except that the resin used was the resin D. Using the produced color conversion sheet, the color conversion characteristics were measured by the above-mentioned method, and a red light emission having a peak wavelength of 650 nm was observed. In addition, an optical durability test was carried out by the above-mentioned method, and the time taken by the peak intensity at the light emission wavelength to decrease by 10% from the initial value was found to be 300 hours, thus revealing that the durability was significantly improved in the same manner as in Example 3.

Example 9

A color conversion sheet was produced by the same operation as in Example 3 except that the resin used was the resin E. Using the produced color conversion sheet, the color conversion characteristics were measured by the above-mentioned method, and a red light emission having a peak wavelength of 650 nm was observed. In addition, an optical durability test was carried out by the above-mentioned method, and the time taken by the peak intensity at the light emission wavelength to decrease by 10% from the initial value was found to be 400 hours, showing an improvement in durability.

Example 10

A color conversion sheet was produced by the same operation as in Example 3 except that the resin used was the resin F. Using the produced color conversion sheet, the color conversion characteristics were measured by the above-mentioned method, and a red light emission having a peak wavelength of 650 nm was observed. In addition, an optical durability test was carried out by the above-mentioned method, and the time taken by the peak intensity at the light emission wavelength to decrease by 10% from the initial value was found to be 300 hours, showing an improvement in durability.

Comparative Example 8

A color conversion sheet was produced by the same operation as in Example 3 except that R-4 was used as a light-emitting material. Using the produced color conversion sheet, the color conversion characteristics were measured by the above-mentioned method, and a red light emission having a peak wavelength of 630 nm was observed. In addition, an optical durability test was carried out by the above-mentioned method, and the time taken by the peak intensity at the light emission wavelength to decrease by 10% from the initial value was found to be 150 hours.

Comparative Example 9

A color conversion sheet was produced by the same operation as in Comparative Example 8 except that the resin used was the resin J. Using the produced color conversion sheet, the color conversion characteristics were measured by the above-mentioned method, and a red light emission having a peak wavelength of 630 nm was observed. In addition, an optical durability test was carried out by the above-mentioned method, and the time taken by the peak intensity at the light emission wavelength to decrease by 10% from the initial value was found to be 150 hours. The results of Comparative Examples 8 and 9 have revealed that, in cases where the quantum dots were used as a fluorescent body, even use of a resin having a fluorene skeleton did not improve the durability.

Example 11

A color conversion sheet was produced by the same operation as in Example 3 except that the resin used was the resin G. Using the produced color conversion sheet, the color conversion characteristics were measured by the above-mentioned method, and a red light emission having a peak wavelength of 640 nm was observed. In addition, an optical durability test was carried out by the above-mentioned method, and the time taken by the peak intensity at the light emission wavelength to decrease by 10% from the initial value was found to be 400 hours, thus revealing that the durability was significantly improved compared with the below-mentioned Comparative Example 10.

Comparative Example 10

A color conversion sheet was produced by the same operation as in Example 3 except that the resin used was the resin K. Using the produced color conversion sheet, the color conversion characteristics were measured by the above-mentioned method, and a red light emission peak having a wavelength of 640 nm was observed. In addition, an optical durability test was carried out by the above-mentioned method, and the time taken by the peak intensity at the light emission wavelength to decrease by 10% from the initial value was found to be 100 hours.

Example 12

A color conversion sheet was produced by the same operation as in Example 3 except that the resin used was the resin H. Using the produced color conversion sheet, the color conversion characteristics were measured by the above-mentioned method, and a red light emission having a peak wavelength of 650 nm was observed. In addition, an optical durability test was carried out by the above-mentioned method, and the time taken by the peak intensity at the light emission wavelength to decrease by 10% from the initial value was found to be 450 hours, thus revealing that the durability was significantly improved compared with the below-mentioned Comparative Example 11.

Comparative Example 11

A color conversion sheet was produced by the same operation as in Example 3 except that the resin used was the resin L. Using the produced color conversion sheet, the color conversion characteristics were measured by the above-mentioned method, and a red light emission having a peak wavelength of 640 nm was observed. In addition, an optical durability test was carried out by the above-mentioned method, and the time taken by the peak intensity at the light emission wavelength to decrease by 10% from the initial value was found to be 100 hours.

Example 13

A color conversion sheet was produced by the same operation as in Example 3 except that the resin used was the resin I. Using the produced color conversion sheet, the color conversion characteristics were measured by the above-mentioned method, and a red light emission having a peak wavelength of 650 nm was observed. In addition, an optical durability test was carried out by the above-mentioned method, and the time taken by the peak intensity at the light emission wavelength to decrease by 10% from the initial value was found to be 350 hours, thus revealing that the durability was improved compared with the below-mentioned Comparative Example 12.

Comparative Example 12

A color conversion sheet was produced by the same operation as in Example 3 except that the resin used was the resin M. Using the produced color conversion sheet, the color conversion characteristics were measured by the above-mentioned method, and a red light emission having a peak wavelength of 640 nm was observed. In addition, an optical durability test was carried out by the above-mentioned method, and the time taken by the peak intensity at the light emission wavelength to decrease by 10% from the initial value was found to be 100 hours.

TABLE 3

| | Example 3 | Example 4 | Example 5 | Example 6 | Example 7 | Example 8 | Example 9 | Example 10 | Example 11 | Example 12 | Example 13 |
|---|---|---|---|---|---|---|---|---|---|---|---|
| Resin | Resin A | Resin A | Resin A | Resin B | Resin C | Resin D | Resin E | Resin F | Resin G | Resin H | Resin I |
| Light-emitting Material | R-1 | R-2 | R-3 | R-1 | R-1 | R-1 | R-1 | R-1 | R-1 | R-1 | R-1 |
| Time Taken by Intensity to Decrease by 10% (hours) | 600 | 600 | 200 | 600 | 600 | 300 | 400 | 300 | 400 | 450 | 350 |

TABLE 4

| | Comparative Example 5 | Comparative Example 6 | Comparative Example 7 | Comparative Example 8 | Comparative Example 9 | Comparative Example 10 | Comparative Example 11 | Comparative Example 12 |
|---|---|---|---|---|---|---|---|---|
| Resin | Resin J | Resin J | Resin J | Resin A | Resin J | Resin K | Resin L | Resin M |
| Light-emitting Material | R-1 | R-2 | R-3 | R-4 | R-4 | R-1 | R-1 | R-1 |
| Time Taken by Intensity to Decrease by 10% (hours) | 100 | 100 | 70 | 150 | 150 | 100 | 100 | 100 |

Example 14

The color conversion sheet produced in each of Example 1 and Example 3 was inserted in place of the color conversion sheet built in a liquid crystal monitor (SW2700PT) manufactured by BenQ Corporation, and then, the monitor was reassembled back. The single colors of blue, green, red were displayed on the resulting monitor, and the color coordinates (x,y) of each color in the color space were measured using a spectral radiance meter (CS-1000 manufactured by Konica Minolta, Inc.). From the resulting three points as sets of color coordinates, the area of the color gamut was calculated, and the area ratio to the color gamut area in the DCI-P3 standard was calculated and found to be 110%.

Example 15

The area ratio to the color gamut area in the DCI-P3 standard was found to be 105% by calculating by the same operation as in Example 14 except that the color conversion sheet produced in each of Comparative Example 3 and Example 3 was used.

Example 16

The area ratio to the color gamut area in the DCI-P3 standard was found to be 100% by calculating by the same operation as in Example 14 except that the color conversion sheet produced in each of Example 1 and Comparative Example 8 was used, and the green light-emitting material and the red light-emitting material were both not as good as in Example 14 in which a pyrrometheneboron complex was used.

Example 17

The area ratio to the color gamut area in the DCI-P3 standard was found to be 112% by calculating by the same operation as in Example 14 except that the color conversion sheet produced in each of Example 1 and Example 6 was used.

Example 18

The area ratio to the color gamut area in the DCI-P3 standard was found to be 112% by calculating by the same operation as in Example 14 except that the color conversion sheet produced in each of Example 1 and Example 8 was used.

Comparative Example 13

The area ratio to the color gamut area in the DCI-P3 standard was found to be 95% by calculating by the same operation as in Example 14 except that the color conversion sheet produced in each of Comparative Example 1 and Comparative Example 5 was used, and the green light-emitting material and the red light-emitting material were both not as good as in Example 14 in which a pyrrometheneboron complex was used.

TABLE 5

| | | | Example 14 | Example 15 | Example 16 | Example 17 | Example 18 | Comparative Example 13 |
|---|---|---|---|---|---|---|---|---|
| Green Color Conversion Sheet | Resin | | Resin A | Resin A | Resin A | Resin A | Resin A | Resin J |
| | Light-emitting Material | | G-1 | G-3 | G-1 | G-1 | G-1 | G-1 |
| Red color Conversion Sheet | Resin | | Resin A | Resin A | Resin A | Resin B | Resin D | Resin J |
| | Light-emitting Material | | R-1 | R-1 | R-4 | R-1 | R-1 | R-1 |
| Area Ratio (%) | | | 110 | 105 | 100 | 112 | 112 | 95 |

Example 19

A color conversion sheet was produced by the same operation as in Example 1 except that the compound G-4 was used as a light-emitting material. Using the produced color conversion sheet, the color conversion characteristics were measured by the above-mentioned method, and a green light emission having a peak wavelength of 535 nm was observed. In addition, an optical durability test was carried out by the above-mentioned method, and the time taken by the peak intensity at the light emission wavelength to decrease by 10% from the initial value was found to be 350 hours. The results have revealed that having an electron withdrawing group significantly improved the durability, compared with G-1. The results of Example 19 are listed in Table 2.

INDUSTRIAL APPLICABILITY

As above-mentioned, a color conversion composition, a color conversion sheet, a light source unit including the same, a display, and a lighting apparatus all according to the present invention are suitable to achieve both color reproducibility improvement and high durability.

REFERENCE SIGNS LIST

1 Base layer
2 Color conversion layer
2-a Color conversion layer X
2-b Color conversion layer Y
3 Diffusion sheet
4 Barrier layer
5 Color conversion sheet
6 Base plate
7 Reflective layer
8 Light source
9 Diffusion plate
10 Prism sheet
11 Polarized reflective film
12 Light source unit
13 Another color conversion sheet

The invention claimed is:

1. A color conversion composition that converts incident light into light having a longer wavelength than the incident light has, the color conversion composition comprising the following components (A) and (B):
   the component (A): an organic light-emitting material, and
   the component (B): a resin whose molecular structure has a fluorene skeleton,
   wherein said component (B) is a polyester resin having a structure represented by any one of General Formulae (1) to (3):

[Chem. 1]

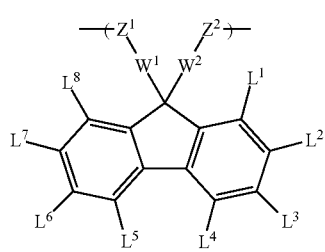

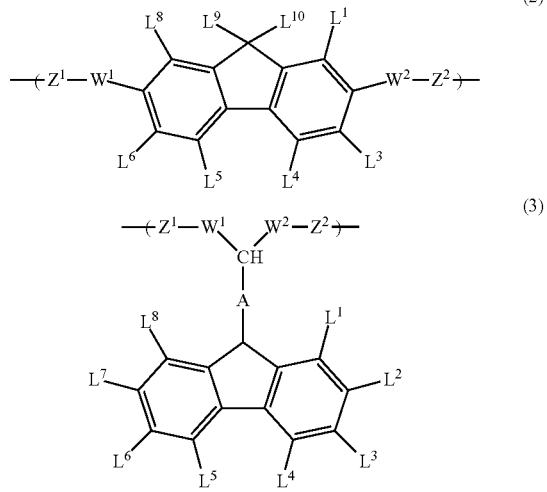

wherein:
$Z^1$ and $Z^2$ are each oxygen or a carbonyl group;
$L^1$ to $L^{10}$ are independently a group selected from a hydrogen atom, an alkyl group, a cycloalkyl group, a heterocyclic group, an alkenyl group, a cycloalkenyl group, a cycloalkoxy group, an alkynyl group, a hydroxy group, a thiol group, an alkoxy group, an alkylthio group, an aryl ether group, an aryl thioether group, an aryl group, an aryloxy group, an aralkyloxy group, an acyl group, an alkoxycarbonyl group, an aryloxycarbonyl group, a heteroaryl group, halogen, a cyano group, an aldehyde group, a carboxyl group, an oxycarbonyl group, a carbamoyl group, an amino group, a dialkylamino group, a nitro group, a silyl group, a siloxanyl group, a boryl group, a phosphine oxide group, and a condensed ring and an aliphatic ring formed between adjacent substituents;
$W^1$ and $W^2$ are independently a group selected from a single bond, an alkylene group, a cycloalkylene group, an alkenylene group, a cycloalkenylene group, an alkynylene group, an arylene group, and a heteroarylene group;
A is a single bond or an alkylene group; and
said component (B) is a polyester resin, and a diol component of the components of said polyester resin has a structure represented by General Formula (1).

2. A color conversion sheet comprising a layer of said color conversion composition according to claim 1 or a cured product layer of the composition.

3. A light source unit comprising a light source and said color conversion sheet according to claim 2.

4. The light source unit according to claim 3, wherein said light source is a light-emitting diode having the maximum emission in a range of 400 nm or more and 500 nm or less.

5. A display comprising said light source unit according to claim 3.

6. A lighting apparatus comprising said light source unit according to claim 3.

7. The color conversion sheet according to claim 2, comprising a laminate of at least the following color conversion layer (X) and color conversion layer (Y):
   said color conversion layer (X): a color conversion layer including said component (A) and said component (B), wherein said component (A) is a light-emitting material that exhibits light emission caused by photoexcitation and having a peak wavelength observed in a region of 580 nm or more and 750 nm or less; and said color conversion layer (Y): a color conversion layer containing a light-emitting material that exhibits light emission caused by photoexcitation and having a peak wavelength observed in a region of 500 nm or more and 580 nm or less.

8. The color conversion composition according to claim 1, wherein said component (A) contains a compound represented by General Formula (5):

[Chem. 2]

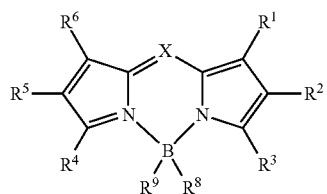

(5)

wherein:
X is C—$R^7$ or N;
$R^1$ to $R^9$ are independently selected from hydrogen, an alkyl group, a cycloalkyl group, a heterocyclic group, an alkenyl group, a cycloalkenyl group, an alkynyl group, a hydroxy group, a thiol group, an alkoxy group, an alkylthio group, an aryl ether group, an aryl thioether group, an aryl group, a heteroaryl group, halogen, a cyano group, an aldehyde group, a carbonyl group, a carboxyl group, an oxycarbonyl group, a carbamoyl group, an amino group, a nitro group, a silyl group, a siloxanyl group, a boryl group, a phosphine oxide group, and a condensed ring and an aliphatic ring formed between adjacent substituents.

9. The color conversion composition according to claim 8, wherein in General Formula (5), X is C—$R^7$, and $R^7$ is a group represented by General Formula (6):

[Chem. 3]

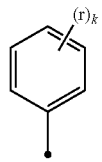

(6)

wherein:
r is selected from the group consisting of hydrogen, an alkyl group, a cycloalkyl group, a heterocyclic group, an alkenyl group, a cycloalkenyl group, an alkynyl group, a hydroxy group, a thiol group, an alkoxy group, an alkylthio group, an aryl ether group, an aryl thioether group, an aryl group, a heteroaryl group, halogen, a cyano group, an aldehyde group, a carbonyl group, a carboxyl group, an oxycarbonyl group, a carbamoyl group, an amino group, a nitro group, a silyl group, a siloxanyl group, a boryl group, and a phosphine oxide group;
k is an integer of 1 to 3; and
when k is 2 or more, r is optionally the same as or different from each other.

10. The color conversion composition according to claim 8, wherein in General Formula (5), $R^1$, $R^3$, $R^4$, and $R^6$ are independently substituted or unsubstituted phenyl groups.

11. The color conversion composition according to claim 8, wherein in General Formula (5), at least one of $R^2$ and $R^5$ is independently an electron withdrawing group.

12. The color conversion composition according to claim 8, wherein the compound represented by General Formula (5) is a light-emitting material that exhibits light emission caused by photoexcitation and having a peak wavelength observed in a region of 580 nm or more and 750 nm or less.

13. The color conversion composition according to claim 1, wherein $W^1$ and $W^2$ are substituted or unsubstituted arylene groups.

14. The color conversion composition according to claim 1, wherein $L^9$ and $L^{10}$ are substituted or unsubstituted aryl groups.

15. The color conversion composition according to claim 1, wherein the resin as said component (B) has a glass transition point of 50° C. or more and 200° C. or less.

16. A color conversion composition that converts incident light into light having a longer wavelength than the incident light has, the color conversion composition comprising the following components (A) and (B):
the component (A): an organic light-emitting material, and
the component (B): a resin whose molecular structure has a fluorene skeleton,
wherein said component (B) is a polyester resin having a structure represented by any one of General Formulae (1) to (3):

[Chem. 1]

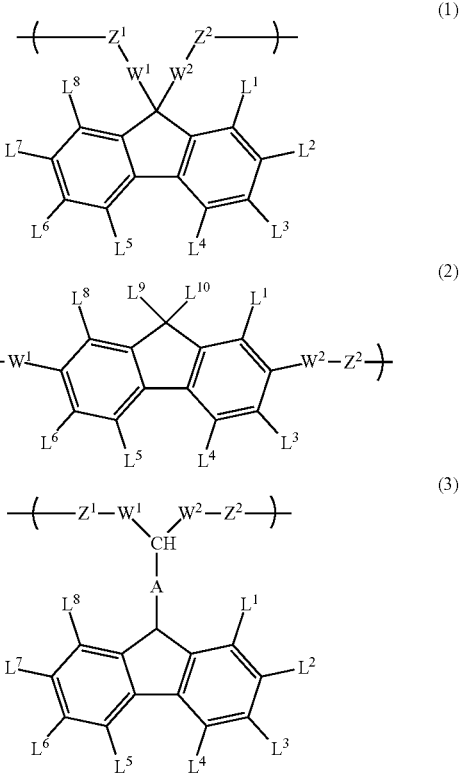

wherein:
- $Z^1$ and $Z^2$ are each oxygen or a carbonyl group;
- $L^1$ to $L^{10}$ are independently a group selected from a hydrogen atom, an alkyl group, a cycloalkyl group, a heterocyclic group, an alkenyl group, a cycloalkenyl group, a cycloalkoxy group, an alkynyl group, a hydroxy group, a thiol group, an alkoxy group, an alkylthio group, an aryl ether group, an aryl thioether group, an aryl group, an aryloxy group, an aralkyloxy group, an acyl group, an alkoxycarbonyl group, an aryloxycarbonyl group, a heteroaryl group, halogen, a cyano group, an aldehyde group, a carboxyl group, an oxycarbonyl group, a carbamoyl group, an amino group, a dialkylamino group, a nitro group, a silyl group, a siloxanyl group, a boryl group, a phosphine oxide group, and a condensed ring and an aliphatic ring formed between adjacent substituents;
- $W^1$ and $W^2$ are independently a group selected from a single bond, an alkylene group, a cycloalkylene group, an alkenylene group, a cycloalkenylene group, an alkynylene group, an arylene group, and a heteroarylene group;
- A is a single bond or an alkylene group; and
- said component (B) is a polyester resin, and a dicarboxylic acid component of the components of said polyester resin has a structure represented by any one of General Formulae (1) to (3).

\* \* \* \* \*